(12) United States Patent
Furuta et al.

(10) Patent No.: US 10,706,803 B2
(45) Date of Patent: Jul. 7, 2020

(54) SHIFT REGISTER CIRCUIT

(71) Applicant: SHARP KABUSHIKI KAISHA, Sakai, Osaka (JP)

(72) Inventors: Shige Furuta, Sakai (JP); Takahiro Yamaguchi, Sakai (JP); Junichi Yamada, Sakai (JP); Hidekazu Yamanaka, Sakai (JP); Yasushi Sasaki, Sakai (JP); Yuhichiroh Murakami, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 181 days.

(21) Appl. No.: 15/574,789

(22) PCT Filed: May 18, 2016

(86) PCT No.: PCT/JP2016/064717
§ 371 (c)(1),
(2) Date: Nov. 16, 2017

(87) PCT Pub. No.: WO2016/190186
PCT Pub. Date: Dec. 1, 2016

(65) Prior Publication Data
US 2018/0144702 A1    May 24, 2018

(30) Foreign Application Priority Data
May 25, 2015  (JP) ................. 2015-105312

(51) Int. Cl.
*G11C 19/00*    (2006.01)
*G09G 3/36*     (2006.01)
(Continued)

(52) U.S. Cl.
CPC ............ *G09G 3/3677* (2013.01); *G09G 3/20* (2013.01); *G09G 2300/0408* (2013.01);
(Continued)

(58) Field of Classification Search
None
See application file for complete search history.

(56) References Cited

U.S. PATENT DOCUMENTS

| 2001/0029070 A1 | 10/2001 | Yamazaki et al. |
| 2003/0076459 A1 | 4/2003 | Murade |

(Continued)

FOREIGN PATENT DOCUMENTS

| JP | H10-111520 A | 4/1998 |
| JP | 2000-269511 A | 9/2000 |

(Continued)

OTHER PUBLICATIONS

Co-pending letter which recites a co-pending application.

*Primary Examiner* — Tuan T Lam
(74) *Attorney, Agent, or Firm* — ScienBiziP, P.C.

(57) ABSTRACT

Provided is a shift register circuit capable of preventing occurrence of malfunction caused by a threshold shift of a thin-film transistor due to an influence of external light. A unit circuit constituting each stage of the shift register circuit includes a plurality of thin-film transistors. The plurality of thin-film transistors are categorized into a first group (T2, T4, T9) whose on-off state is controlled at relatively high on-duty and a second group (T1, T3, T5, T6, T7, T8) whose on-off state is controlled at relatively low on-duty. In such a configuration, a light shielding film (LS) is provided only for the thin-film transistor included in one of the first group and the second group.

4 Claims, 34 Drawing Sheets

(51) Int. Cl.
*G09G 3/20* (2006.01)
*G11C 19/28* (2006.01)
*H01L 27/12* (2006.01)

(52) U.S. Cl.
CPC .............. *G09G 2310/0267* (2013.01); *G09G 2310/0286* (2013.01); *G09G 2320/0214* (2013.01); *G09G 2320/04* (2013.01); *G11C 19/28* (2013.01); *H01L 27/1214* (2013.01)

(56) References Cited

U.S. PATENT DOCUMENTS

| 2006/0250592 A1 | 11/2006 | Noguchi et al. |
| 2009/0033819 A1 | 2/2009 | Nakagawa |
| 2010/0141642 A1 | 6/2010 | Furuta et al. |
| 2011/0006311 A1 | 1/2011 | Hadwen et al. |
| 2012/0092323 A1 | 4/2012 | Murakami et al. |
| 2012/0138922 A1 | 6/2012 | Yamazaki et al. |
| 2012/0146043 A1 | 6/2012 | Kitakado |
| 2014/0028659 A1 | 1/2014 | Yamazaki et al. |
| 2014/0218654 A1 | 8/2014 | Ochiai et al. |
| 2014/0313174 A1 | 10/2014 | Murakami et al. |
| 2016/0322116 A1* | 11/2016 | Jang .................... G09G 3/20 |
| 2017/0032733 A1* | 2/2017 | Jang .................... G09G 3/20 |
| 2018/0149911 A1* | 5/2018 | Yamaguchi ............... G09G 3/20 |
| 2018/0151125 A1* | 5/2018 | Lee .................... G09G 3/3233 |

FOREIGN PATENT DOCUMENTS

| JP | 2003-177427 A | 6/2003 |
| JP | 2004-4553 A | 1/2004 |
| JP | 2006-227586 A | 8/2006 |
| JP | 2009-053660 A | 3/2009 |
| JP | 2011-518423 A | 6/2011 |
| JP | 2012-134475 A | 7/2012 |
| JP | 5209117 B2 | 6/2013 |
| JP | 2014-41344 A | 3/2014 |
| JP | 5538890 B2 | 7/2014 |
| JP | 2014-149429 A | 8/2014 |
| WO | 2011/027650 A1 | 3/2011 |
| WO | 2013/089071 A1 | 6/2013 |

* cited by examiner

Fig.22

| S | R | Q |
|---|---|---|
| 0 | 0 | HOLD VALUE |
| 0 | 1 | 0 |
| 1 | 0 | 1 |
| 1 | 1 | UNDETERMINED |

SHIFT REGISTER CIRCUIT

TECHNICAL FIELD

The present invention relates to a shift register circuit, and in particular to a shift register circuit configured to drive scanning signal lines arranged on a display unit of a display device.

BACKGROUND ART

Conventionally, there is known an active matrix-type liquid crystal display device including a display unit that includes a plurality of source bus lines (video signal lines) and a plurality of gate bus lines (scanning signal lines). As for such a liquid crystal display device, conventionally, in many cases, a gate driver (scanning signal line drive circuit) for driving gate bus lines is mounted, as an IC (Integrated Circuit) chip, on the periphery of substrates forming a liquid crystal panel. However, in recent years, providing a gate driver directly on a TFT substrate (array substrate) which is one of two glass substrates constituting a liquid crystal panel has been gradually increasing. Such a gate driver is called a "monolithic gate driver", and the like.

In the display unit of the active matrix-type liquid crystal display device, there are provided a plurality of source bus lines, a plurality of gate bus lines, and a plurality of pixel formation portions disposed at respective intersections of the plurality of source bus lines and the plurality of gate bus lines. The plurality of pixel formation portions are arranged in a matrix to form a pixel array. Each of the pixel formation portions includes: a thin film transistor which is a switching element having a gate terminal connected to a gate bus line that passes through a corresponding intersection and a source terminal connected to a source bus line that passes through the intersection; a pixel capacitance for holding a pixel voltage value; and the like. The active matrix-type liquid crystal display device is also provided with the gate driver and a source driver (video signal line drive circuit) for driving the source bus lines.

Video signals representing pixel voltage values are transmitted by the source bus lines. However, a single source bus line cannot transmit video signals representing pixel voltage values for a plurality of rows at one time (simultaneously). Accordingly, writing (charging) of the video signals to the pixel capacitances in the pixel formation portions arranged in a matrix is performed sequentially row by row. Therefore, the gate driver is configured by a shift register circuit including a plurality of stages so that the plurality of gate bus lines are sequentially selected for a predetermined period. Further, by sequentially outputting active scanning signals from the respective stages of the shift register circuit, writing of video signals to the pixel capacitances is performed sequentially row by row as described above. As used herein, a circuit that constitutes each of the stages of the shift register circuit is referred to as a "unit circuit".

Meanwhile, regarding a thin-film transistor, a threshold shift (shifting of a threshold voltage) due to an influence of external light may occur when a bias is supplied to the gate for an extended length of time. As used herein, a term "bias" means a "constant voltage". If a bias that keeps the thin-film transistor in an on-state (hereinafter referred to as "positive bias") is supplied to a gate of the thin-film transistor for an extended length of time, a voltage-current characteristic of the thin-film transistor shifts to a positive direction (see FIG. 38). As a result, a threshold voltage of the thin-film transistor increases. If a bias that keeps the thin-film transistor in an off-state (hereinafter referred to as "negative bias") is supplied to the gate of the thin-film transistor for an extended length of time, a voltage-current characteristic of the thin-film transistor shifts to a negative direction (see FIG. 38). As a result, the threshold voltage of the thin-film transistor decreases.

A unit circuit that constitutes a shift register circuit in a monolithic gate driver generally includes a large number of thin-film transistors, which include a thin-film transistor in which a bias is supplied to its gate for an extended length of time. Therefore, a threshold voltage of a part of the thin-film transistors may shift due to an influence of external light. In such a case, a power source margin changes (a range of voltages for operating the thin-film transistors changes), and it is not possible to control the on-off state of at least a part of the thin-film transistors. As a result, malfunction of the shift register circuits occurs. Therefore, in order to prevent the threshold shift due to an influence of external light from occurring, a light shielding film is often provided for a thin-film transistor in a shift register circuit.

It should be noted that the following prior arts are known in relation to the present invention. Japanese Laid-Open Patent Publication No. 2004-4553 discloses the invention related to a liquid crystal display panel having a thin-film transistor provided with a light shielding layer (light shielding film). In this liquid crystal display panel, the light shielding layer is disposed between a substrate and the thin-film transistor with insulating layers therebetween, and an off-potential to be supplied to the gate of the thin-film transistor is constantly applied to the light shielding layer. This prevents occurrence of crosstalk caused by a leak current in the thin-film transistor. Further, Japanese Patent No. 5538890 and Japanese Patent No. 5209117 disclose a variety of specific examples of a configuration of the unit circuit and a driving method of the shift register circuit.

PRIOR ART DOCUMENTS

Patent Documents

[Patent Document 1] Japanese Laid-Open Patent Publication No. 2004-4553
[Patent Document 2] Japanese Patent No. 5538890
[Patent Document 3] Japanese Patent No. 5209117

SUMMARY OF THE INVENTION

Problems to be Solved by the Invention

However, as described in Japanese Laid-Open Patent Publication No. 2004-4553, when a thin-film transistor is provided with a light shielding film, an off-leak (a leak current generated when a voltage between gate and source is 0 V) may increase in the thin-film transistor. Therefore, depending on a thin-film transistor within a unit circuit, providing a light shielding film can be a cause of malfunction. Further, when a light shielding film is provided all over the shift register circuit in order to shield light to all thin-film transistors, an unwanted load between lines (capacitance) increases. As a result, for example, waveforms of signals for operating the shift register circuit are rounded, and there is a high possibility of malfunction. Further, while two substrates that constitute a liquid crystal panel are usually joined using an ultraviolet curable adhesive, there is a case in which sufficient UV irradiation (ultraviolet irradiation) may not be performed due to presence of the light shielding film when a light shielding film is provided all over the shift register circuit. In such a case, the two substrates may not be joined in a normal way.

Thus, an object of the present invention is to provide a shift register circuit capable of preventing occurrence of malfunction caused by a threshold shift of a thin-film transistor due to an influence of external light.

Means for Solving the Problems

A first aspect of the present invention is directed to a shift register circuit including a plurality of stages for driving a plurality of scanning signal lines arranged on a display unit of a display device, wherein a unit circuit constituting each stage of the plurality of stages includes a plurality of transistors that can be categorized into a first group and a second group, an on-off state of a transistor included in the first group is controlled at relatively high on-duty, and an on-off state of a transistor included in the second group is controlled at relatively low on-duty, and a light shielding film is provided only for the transistor included in one of the first group and the second group.

According to a second aspect of the present invention, in the first aspect of the present invention, regarding the plurality of transistors, a transistor whose on-off state is controlled at on-duty no smaller than 50 percent is categorized into the first group, and a transistor whose on-off state is controlled at on-duty smaller than 50 percent is categorized into the second group.

According to a third aspect of the present invention, in the first aspect of the present invention, the light shielding film is provided only for a part of transistors included in one of the first group and the second group.

According to a fourth aspect of the present invention, in the first aspect of the present invention, the transistor provided with the light shielding film is included in the first group and is an n-channel type transistor having a control terminal to which a positive bias is always applied.

According to a fifth aspect of the present invention, in the fourth aspect of the present invention, the unit circuit includes:

an output node connected to one of the plurality of scanning signal lines;

an output control transistor having a control terminal, a first conduction terminal, and a second conduction terminal, and included in the second group, a clock signal being supplied to the first conduction terminal, and the second conduction terminal being connected to the output node;

a first node connected to the control terminal of the output control transistor;

a first node turn-on portion having the transistor included in the second group and being configured to change a level of the first node to an on-level based on an output signal outputted from an output node of a different stage;

a voltage dividing transistor having a control terminal, a first conduction terminal, and a second conduction terminal, and included in the first group, an on-level supply voltage being supplied to the control terminal, the first conduction terminal being connected to the first node turn-on portion, and the second conduction terminal being connected to the first node;

an output node turn-off transistor having a control terminal, a first conduction terminal, and a second conduction terminal, and included in the first group, the first conduction terminal being connected to the output node, and an off-level supply voltage being supplied to the second conduction terminal;

a second node connected to the control terminal of the output node turn-off transistor; and a first node turn-off transistor having a control terminal, a first conduction terminal, and a second conduction terminal, and included in the first group, the control terminal being connected to the second node, the first conduction terminal being connected to the first node via the voltage dividing transistor, and an off-level supply voltage being supplied to the second conduction terminal, and the light shielding film is provided only for the voltage dividing transistor.

According to a sixth aspect of the present invention, in the first aspect of the present invention, the transistor provided with the light shielding film is included in the first group and is an n-channel type transistor having a control terminal to which a positive bias is applied for an extended length of time.

According to a seventh aspect of the present invention, in the sixth aspect of the present invention, the unit circuit includes:

an output node connected to one of the plurality of scanning signal lines;

an output control transistor having a control terminal, a first conduction terminal, and a second conduction terminal, and included in the second group, a clock signal being supplied to the first conduction terminal, the second conduction terminal being connected to the output node;

a first node connected to the control terminal of the output control transistor;

a first node turn-on portion having the transistor included in the second group and being configured to change a level of the first node to an on-level based on an output signal outputted from an output node of a different stage;

an output node turn-off transistor having a control terminal, a first conduction terminal, and a second conduction terminal, and included in the first group, the first conduction terminal being connected to the output node, and an off-level supply voltage being supplied to the second conduction terminal;

a second node connected to the control terminal of the output node turn-off transistor; and a first node turn-off transistor having a control terminal, a first conduction terminal, and a second conduction terminal, and included in the first group, the control terminal being connected to the second node, the first conduction terminal being connected to the first node, and an off-level supply voltage being supplied to the second conduction terminal, and the light shielding film is provided only for the output node turn-off transistor and the first node turn-off transistor.

According to an eighth aspect of the present invention, in the first aspect of the present invention, the transistor provided with the light shielding film is included in the second group and is a p-channel type transistor having a control terminal to which a negative bias is applied for an extended length of time.

According to a ninth aspect of the present invention, in the eighth aspect of the present invention, the unit circuit includes:
- an output node connected to one of the plurality of scanning signal lines;
- an RS flip-flop circuit configured to output a first output signal and a second output signal based on an output signal outputted from an output node of a preceding stage and an output signal outputted from an output node of a subsequent stage;
- a first output control transistor having a control terminal, a first conduction terminal, and a second conduction terminal, and included in the second group, the first output signal being supplied to the control terminal, a clock signal being supplied to the first conduction terminal, and the second conduction terminal being connected to the output node;
- a second output control transistor having a control terminal, a first conduction terminal, and a second conduction terminal, and included in the second group, the second output signal being supplied to the control terminal, the clock signal being supplied to the first conduction terminal, and the second conduction terminal being connected to the output node; and
- an output node turn-off transistor having a control terminal, a first conduction terminal, and a second conduction terminal, and included in the first group, the second output signal being supplied to the control terminal, the first conduction terminal being connected to the output node, and an off-level supply voltage being supplied to the second conduction terminal, and the light shielding film is provided only for the second output control transistor.

According to a tenth aspect of the present invention, in the first aspect of the present invention, the transistor provided with the light shielding film is included in the second group and is an n-channel type transistor having a control terminal to which a negative bias is applied for an extended length of time.

According to an eleventh aspect of the present invention, in the tenth aspect of the present invention, the unit circuit includes:
- an output node connected to one of the plurality of scanning signal lines;
- an output control transistor having a control terminal, a first conduction terminal, and a second conduction terminal, and included in the second group, a clock signal being supplied to the first conduction terminal, and the second conduction terminal being connected to the output node;
- a first node connected to the control terminal of the output control transistor;
- a first node turn-on portion having the transistor included in the second group and being configured to change a level of the first node to an on-level based on an output signal outputted from an output node of a different stage;
- an output node turn-off transistor having a control terminal, a first conduction terminal, and a second conduction terminal, and included in the first group, the first conduction terminal being connected to the output node, and an off-level supply voltage being supplied to the second conduction terminal;
- a second node connected to the control terminal of the output node turn-off transistor; and
- a first node turn-off transistor having a control terminal, a first conduction terminal, and a second conduction terminal, and included in the first group, the control terminal being connected to the second node, the first conduction terminal being connected to the first node, and an off-level supply voltage being supplied to the second conduction terminal, and the light shielding film is provided only for the output control transistor.

According to a twelfth aspect of the present invention, in the first aspect of the present invention, the unit circuit includes:
- an output node connected to one of the plurality of scanning signal lines;
- an output control transistor having a control terminal, a first conduction terminal, and a second conduction terminal, and included in the second group, a clock signal being supplied to the first conduction terminal, and the second conduction terminal being connected to the output node;
- a first node connected to the control terminal of the output control transistor;
- a first node turn-on portion having the transistor included in the second group and being configured to change a level of the first node to an on-level based on an output signal outputted from an output node of a different stage;
- a voltage dividing transistor having a control terminal, a first conduction terminal, and a second conduction terminal, and included in the first group, an on-level supply voltage being supplied to the control terminal, the first conduction terminal being connected to the first node turn-on portion, and the second conduction terminal being connected to the first node;
- an output node turn-off transistor having a control terminal, a first conduction terminal, and a second conduction terminal, and included in the first group, the first conduction terminal being connected to the output node, and an off-level supply voltage being supplied to the second conduction terminal;
- a second node connected to the control terminal of the output node turn-off transistor;
- a first node turn-off transistor having a control terminal, a first conduction terminal, and a second conduction terminal, and included in the first group, the control terminal being connected to the second node, the first conduction terminal being connected to the first node via the voltage dividing transistor, and an off-level supply voltage being supplied to the second conduction terminal; and
- an all-on control portion configured to change a level of the output node to an on-level based on a control signal supplied commonly to the unit circuits of all stages, and the light shielding film is provided only for the first node turn-off transistor and the voltage dividing transistor.

According to a thirteenth aspect of the present invention, in the first aspect of the present invention, the light shielding film is in a floating state.

According to a fourteenth aspect of the present invention, in the first aspect of the present invention, a fixed potential is supplied to the light shielding film.

A fifteenth aspect of the present invention is directed to a shift register circuit including a plurality of stages for driving a plurality of scanning signal lines arranged on a display unit of a display device, wherein a unit circuit constituting each stage of the plurality of stages includes a plurality of transistors including a first conductivity type transistor and a second conductivity type transistor, the light shielding film is provided only for a part of the plurality of transistors, and each of the transistors provided with the light shielding film is the first conductivity type transistor whose on-off state is controlled at relatively low on-duty or the second conductivity type transistor whose on-off state is controlled at relatively high on-duty.

According to a sixteenth aspect of the present invention, in the fifteenth aspect of the present invention, the first conductivity type transistor is an n-channel type transistor, the second conductivity type transistor is a p-channel type transistor, and each of the transistors provided with the light shielding film is an n-channel type transistor having a control terminal to which a negative bias is applied for an extended length of time or a p-channel type transistor having a control terminal to which a positive bias is applied for an extended length of time.

According to a seventeenth aspect of the present invention, in the fifteenth aspect of the present invention, the light shielding film is in a floating state.

According to an eighteenth aspect of the present invention, in the fifteenth aspect of the present invention, a fixed potential is supplied to the light shielding film.

Effects of the Invention

According to the first aspect of the present invention, apart of the plurality of transistors included in a unit circuit constituting each stage of the shift register circuit is provided with a light shielding film. Accordingly, malfunction caused by a threshold shift (shifting of a threshold voltage) of the transistor provided with the light shielding film may be prevented. Further, as the light shielding film is not provided all of the transistors included in the unit circuit, occurrence of malfunction caused by off-leak in the transistor can be prevented. Moreover, unlike a case in which the light shielding film is provided for an entire shift register circuit, malfunction caused by an unwanted load (capacitance) between lines may not occur. From the above, it is possible to realize the shift register circuit capable of preventing occurrence of malfunction caused by a threshold shift of the transistor due to an influence of external light.

According to the second aspect of the present invention, the same effects as the first aspect of the present invention are obtained.

According to the third aspect of the present invention, the transistor for which the light shielding film is provided is only a part of the transistors included in one of the first group and the second group. Therefore, malfunction due to off-leak caused by providing the light shielding film is effectively prevented.

According to the fourth aspect of the present invention, malfunction caused by a threshold shift of the n-channel type transistor having a control terminal to which a positive bias is always applied is prevented.

According to the fifth aspect of the present invention, a threshold shift due to an influence of external light may not occur in the voltage dividing transistor. Accordingly, occurrence of malfunction caused by a threshold shift of the voltage dividing transistor is prevented.

According to the sixth aspect of the present invention, occurrence of malfunction caused by a threshold shift of the n-channel type transistor having a control terminal to which a positive bias is applied for an extended length of time is prevented.

According to the seventh aspect of the present invention, a threshold shift due to an influence of external light may not occur in the output node turn-off transistor and the first node turn-off transistor. Accordingly, malfunction caused by a threshold shift of the output node turn-off transistor and the first node turn-off transistor is prevented.

According to the eighth aspect of the present invention, occurrence of malfunction caused by a threshold shift of the p-channel type transistor having a control terminal to which a negative bias is applied for an extended length of time is prevented.

According to the ninth aspect of the present invention, threshold shift due to an influence of external light may not occur in the second output control transistor. Accordingly, occurrence of malfunction caused by a threshold shift of the second output control transistor and occurrence of through current are prevented.

According to the tenth aspect of the present invention, malfunction caused by a threshold shift of the n-channel type transistor having a control terminal to which a negative bias is applied for an extended length of time is prevented.

According to the eleventh aspect of the present invention, a threshold shift due to an influence of external light may not occur in the output node turn-off transistor. Accordingly, occurrence of malfunction caused by a threshold shift of the output node turn-off transistor is prevented.

According to the twelfth aspect of the present invention, in the shift register circuit having an all-on function (a function for turning all of the scanning signal lines to a selected state all at once), since the output node turn-off transistor is not provided with the light shielding film, off-leak may not increase in the output node turn-off transistor. Therefore, the all-on function is realized without causing malfunction. Further, as the all-on function is provided, it is possible to suppress deterioration of the display quality (such as occurrence of flickers) caused by residual electric charges.

According to the thirteenth aspect of the present invention, it is not necessary to provide lines and VIA holes for fixing a potential of the light shielding film. Therefore, an increase in an area for circuits is suppressed.

According to the fourteenth aspect of the present invention, it is possible to prevent an increase of off-leak in the transistor provided with the light shielding film. Therefore, occurrence of malfunction caused by providing the light shielding film for the transistor is prevented.

According to the fifteenth aspect of the present invention, similarly to the first aspect of the present invention, it is possible to realize the shift register circuit capable of preventing occurrence of malfunction caused by a threshold shift of the transistor due to an influence of external light.

According to the sixteenth aspect of the present invention, occurrence of malfunction caused by a threshold shift of the n-channel type transistor having a control terminal to which a negative bias is applied for an extended length of time and occurrence of malfunction caused by a threshold shift of the p-channel type transistor having a control terminal to which a positive bias is applied for an extended length of time are prevented.

According to the seventeenth aspect of the present invention, similarly to the thirteenth aspect of the present invention, an increase in an area for circuits is suppressed.

According to the eighteenth aspect of the present invention, similarly to the fourteenth aspect of the present invention, occurrence of malfunction caused by providing the light shielding film for the transistor is prevented.

BRIEF DESCRIPTION OF THE DRAWINGS

FIG. 22 is a diagram showing a truth table of an RS flip-flop circuit according to the sixth embodiment.

MODES FOR CARRYING OUT THE INVENTION

Hereinafter, embodiments of the present invention will be described with reference to the accompanying drawings. In the following description, a gate terminal (gate electrode) of a thin-film transistor corresponds to a control terminal, a drain terminal (drain electrode) thereof corresponds to a first conduction terminal, and a source terminal (source electrode) thereof corresponds to a second conduction terminal. It should be noted that although a higher potential is usually called drain out of the drain and the source, in the following description, since it is defined that one is drain and the other is source, a source potential can become higher than a drain potential.

1. First Embodiment

1.1 Overall Configuration and Operation

Figure 2:
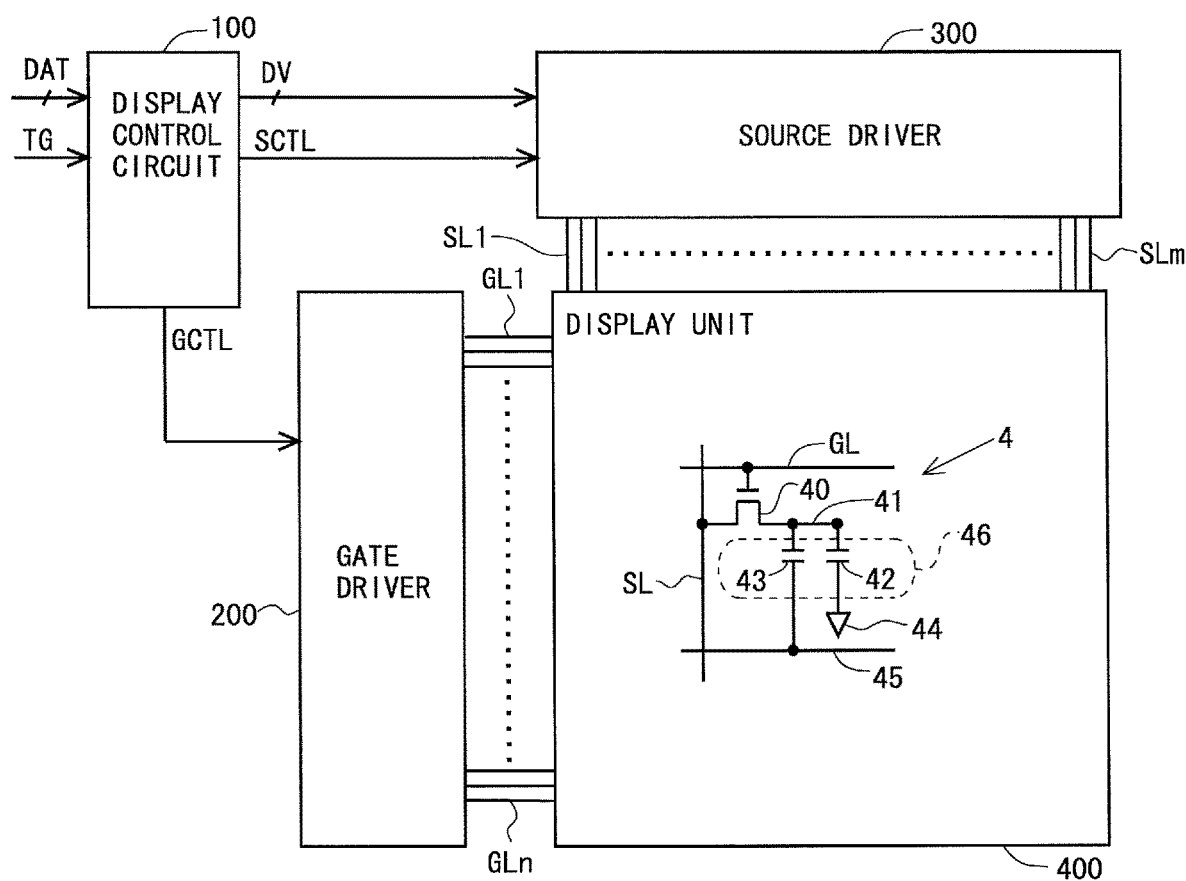
FIG. 2 is a block diagram showing an overall configuration of the liquid crystal display device according to the first embodiment.

FIG. 2 is a block diagram showing an overall configuration of an active matrix-type liquid crystal display device according to a first embodiment of the present invention. As shown in FIG. 2, this liquid crystal display device includes a display control circuit 100, a gate driver (scanning signal line drive circuit) 200, a source driver (video signal line drive circuit) 300, and a display unit 400. It should be noted that the gate driver 200 is formed on a display panel including the display unit 400, using amorphous silicon, polycrystalline silicon, microcrystalline silicon, oxide semiconductor (e.g., indium gallium zinc oxide), or the like. In other words, in this embodiment, the gate driver 200 and the display unit 400 are formed on the same substrate (a TFT substrate which is one of two substrates that constitute a liquid crystal panel).

The display unit 400 is provided with a plurality of (m) source bus lines (video signal lines) SL1 to SLm and a plurality of (n) gate bus lines (scanning signal lines) GL1 to GLn. A pixel formation portion 4 that constitutes a pixel is disposed at each of intersections between the source bus lines SL1 to SLm and the gate bus lines GL1 to GLn. Specifically, the display unit 400 includes a plurality of (n×m) pixel formation portions 4. It should be noted that regarding the gate bus lines, a reference symbol GL is used when it is not necessary to specify a line. Similarly, regarding the source bus lines, a reference symbol SL is used when it is not necessary to specify a column. The plurality of pixel formation portions 4 are arranged in a matrix to form a pixel matrix of n lines×m columns. Each of the pixel formation portions 4 includes a thin-film transistor (TFT) 40, which is a switching element, having a gate terminal connected to the gate bus line GL that passes through a corresponding intersection and a source terminal connected to the source bus line SL that passes through the same intersection; a pixel electrode 41 connected to a drain terminal of the thin-film transistor 40; a common electrode 44 and an auxiliary capacitance electrode 45 commonly provided for the plurality of pixel formation portions 4; a liquid crystal capacitance 42 configured by the pixel electrode 41 and the common electrode 44; and an auxiliary capacitance 43 configured by the pixel electrode 41 and the auxiliary capacitance electrode 45. The liquid crystal capacitance 42 and the auxiliary capacitance 43 constitute a pixel capacitance 46. It should be noted that components for only one pixel formation portion 4 are illustrated in the display unit 400 in FIG. 2. Further, the configuration of the pixel formation portion 4 is not limited to the configuration illustrated in FIG. 2, and it is possible to employ a configuration in which the auxiliary capacitance 43 and the auxiliary capacitance electrode 45 are not provided, for example.

The display control circuit 100 receives an image signal DAT and a timing signal group TG, such as a horizontal synchronization signal and a vertical synchronization signal, that are transmitted from outside, and outputs a digital video signal DV, a gate control signal GCTL for controlling an operation of the gate driver 200, and a source control signal SCTL for controlling an operation of the source driver 300. Typically, the gate control signal GCTL includes signals such as a gate start pulse signal and a gate clock signal. Also typically, the source control signal SCTL includes signals such as a source start pulse signal, a source clock signal, and a latch strobe signal.

The gate driver 200 repeats application of an active scanning signal to each of the gate bus lines GL with a single vertical scanning period as a cycle, based on the gate control signal GCTL outputted from the display control circuit 100. It should be noted that details of the gate driver 200 will be described later.

The source driver 300 receives the digital video signal DV and the source control signal SCTL outputted from the display control circuit 100, and applies a driving video signal to each of the source bus lines SL. At this time, at timing at which a pulse of a source clock signal is generated, the source driver 300 sequentially holds the digital video signal DV indicating a voltage to be applied to each of the source bus lines SL. Then, at timing at which a pulse of a latch strobe signal is generated, the digital video signal DV that is being held is converted into an analog voltage. The converted analog voltages are applied to all of the source bus lines SL all at once as driving video signals. It should be noted that a configuration in which the converted analog voltage is applied to the source bus lines SL in a time-divided manner using a sampling switch circuit is employed in some cases.

As described above, by applying scanning signals to the gate bus lines GL1 to GLn, and by applying driving video signals to the source bus lines SL1 to SLm, an image based on the image signal DAT that is externally supplied is displayed on the display unit 400.

Meanwhile, as the thin-film transistors 40 included in the display unit 400 and the thin-film transistors in the after-mentioned shift register circuit 210 within the gate driver 200, oxide TFTs (thin-film transistors using oxide semiconductor for channel layers) may be employed. In the following, an oxide semiconductor layer included in the oxide TFTs will be described.

The oxide semiconductor layer is, for example, an In—Ga—Zn—O-based semiconductor layer. The oxide semiconductor layer contains, for example, an In—Ga—Zn—O-based semiconductor. The In—Ga—Zn—O-based semiconductor is a ternary oxide of In (indium), Ga (gallium) and Zn (zinc). A ratio (composition ratio) of In, Ga and Zn is not particularly limited. For example, the composition ratio may be In:Ga:Zn=2:2:1, In:Ga:Zn=1:1:1, In:Ga:Zn=1:1:2, and the like.

Such a TFT including the In—Ga—Zn—O-based semiconductor layer has high mobility (mobility exceeding 20 times that of an amorphous silicon TFT) and a low leak current (leak current of less than one-hundredth ($1/100$) of that of the amorphous silicon TFT). Accordingly, this TFT is suitably used as a TFT in the display unit 400. Using the TFT including the In—Ga—Zn—O-based semiconductor layer may reduce electric power consumption of the display device to a great extent.

The In—Ga—Zn—O-based semiconductor may be amorphous, or crystalline including a crystalline portion. As the crystalline In—Ga—Zn—O-based semiconductor, crystalline In—Ga—Zn—O-based semiconductor, in which a c-axis is oriented substantially perpendicularly to a surface of the layer, is preferable. A crystalline structure of the In—Ga—Zn—O-based semiconductor as described above is disclosed, for example, in Japanese Laid-Open Patent Publication No. 2012-134475.

The oxide semiconductor layer may contain a different type of oxide semiconductor in place of the In—Ga—Zn—O-based semiconductor. For example, the oxide semiconductor layer may contain Zn—O-based semiconductor (ZnO), In—Zn—O-based semiconductor (IZO (registered trademark)), Zn—Ti—O-based semiconductor (ZTO), Cd—Ge—O-based semiconductor, Cd—Pb—O-based semiconductor, CdO (cadmium oxide), Mg—Zn—O-based semiconductor, In—Sn—Zn—O-based semiconductor (e.g., $In_2O_3$—$SnO_2$—ZnO), In—Ga—Sn—O-based semiconductor, or the like.

1.2 Configuration and Operation of Gate Driver

Figure 3:
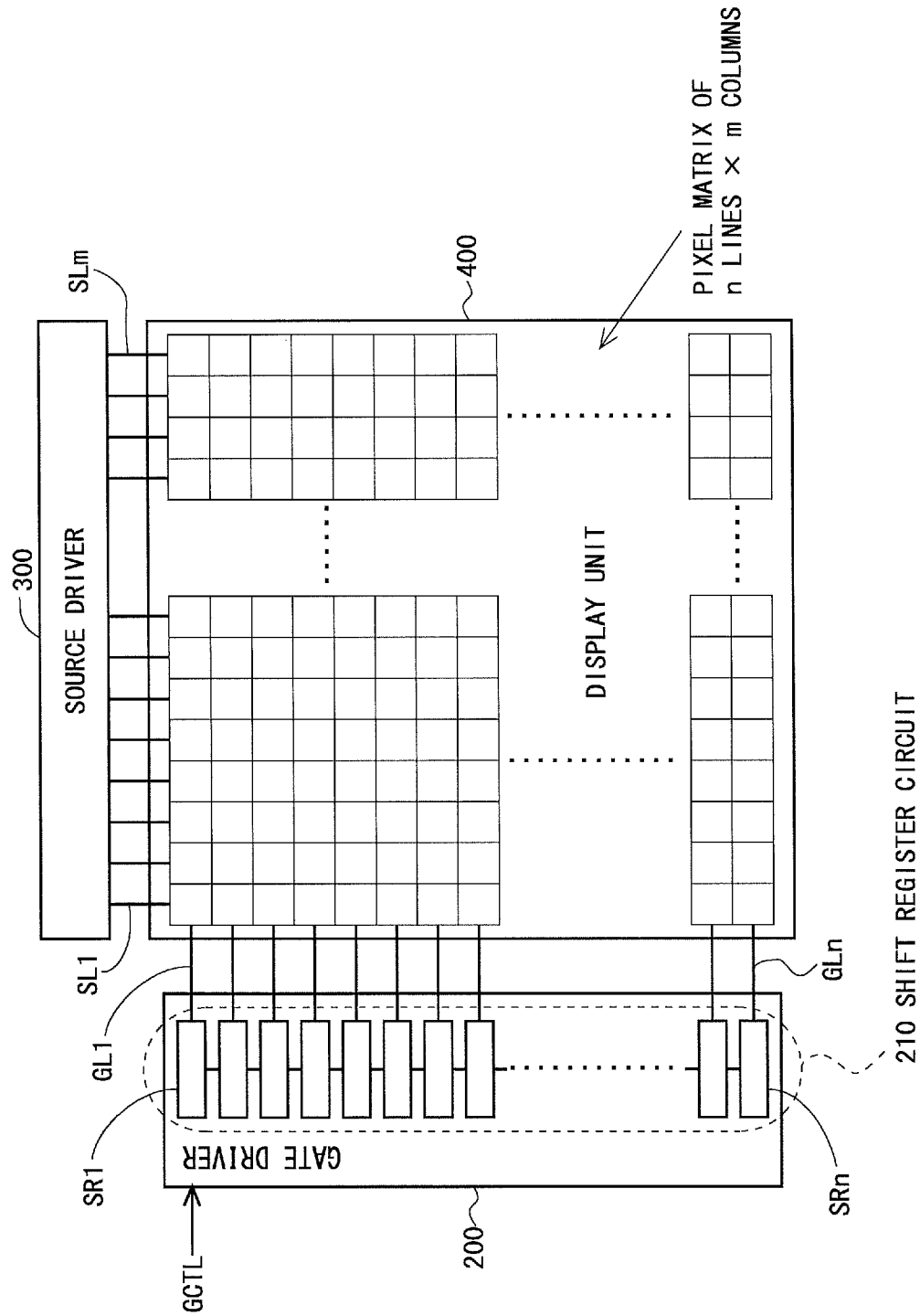
FIG. 3 is a block diagram for illustration of a configuration of a gate driver according to the first embodiment.
Figure 4:
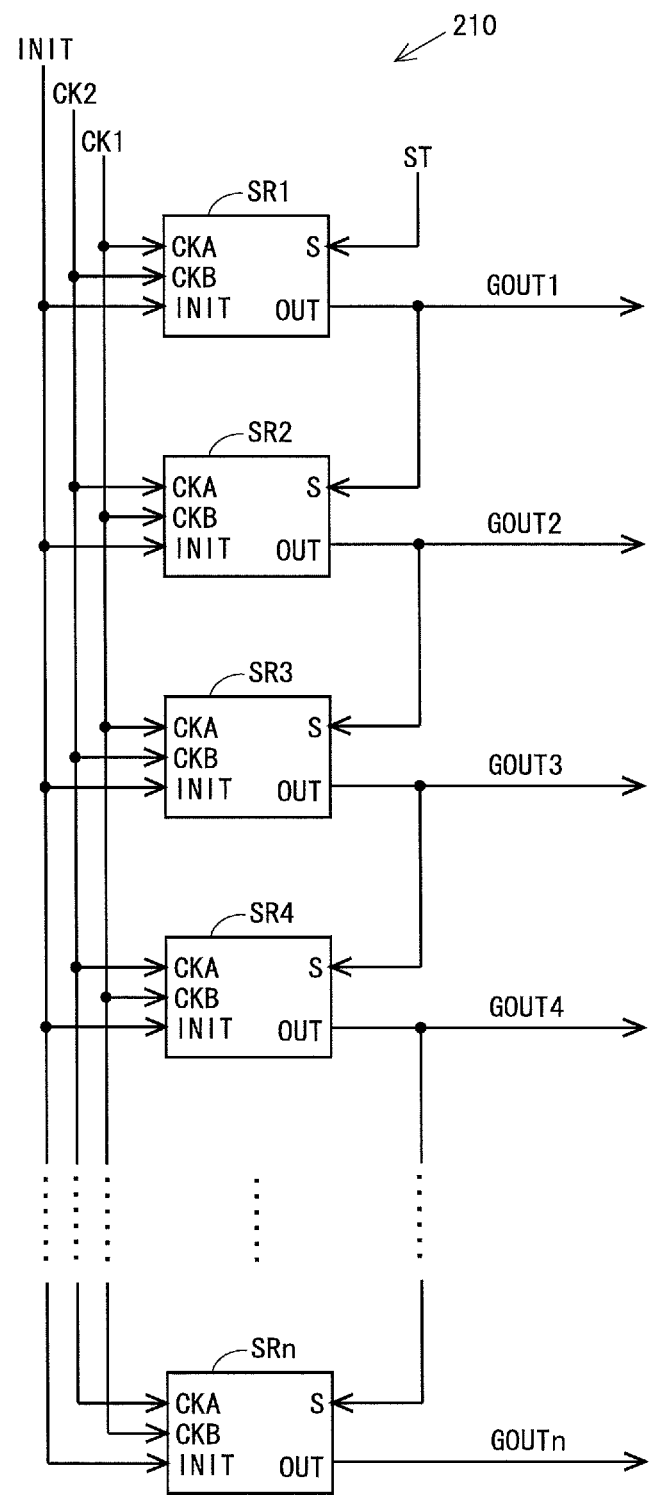
FIG. 4 is a block diagram showing a schematic configuration of the shift register circuit that constitutes the gate driver according to the first embodiment.

Next, with reference to FIG. 3 and FIG. 4, a general outline of a configuration and an operation of the gate driver 200 according to this embodiment is described. As shown in FIG. 3, the gate driver 200 is configured by the shift register circuit 210 constituted by a plurality of stages (n stages). The display unit 400 is provided with a pixel matrix of n lines×m columns. Each of the stages of the shift register circuit 210 is provided so as to correspond to each line of the pixel matrix one by one. Specifically, the shift register circuit 210 includes n unit circuits SR1 to SRn. The n unit circuits SR1 to SRn are connected in series to each other. It should be noted that each of the unit circuits is indicated by a reference symbol SR when distinction between the n unit circuits SR1 to SRn is not necessary.

FIG. 4 is a block diagram showing a schematic configuration of the shift register circuit 210 that constitutes the gate driver 200 according to this embodiment. As described above, the shift register circuit 210 is constituted by the n unit circuits SR1 to SRn. It should be noted that FIG. 4 shows the unit circuits SR1 to SR4 for a first stage to a fourth stage and the unit circuit SRn for an n-th stage. Each of the unit circuits SR includes an input terminal for receiving a first clock CKA, an input terminal for receiving a second clock CKB, an input terminal for receiving an initialization signal INIT, an input terminal for receiving a set signal S, and an output terminal for outputting an output signal OUT. While each of the unit circuits SR also includes an input terminal for a low-level supply voltage VSS and an input terminal for a high-level supply voltage VDD, these input terminals are not shown in FIG. 4. It should be noted that in the following description, a magnitude of the potential supplied based on the low-level supply voltage VSS is referred to as a "VSS potential" for convenience. To the shift register circuit 210, a gate start pulse signal ST, two-phase gate clock signals (a first gate clock signal CK1 and a second gate clock signal CK2), and the initialization signal INIT are supplied as the gate control signal GCTL.

Signals supplied to input terminals of each stage (each unit circuit SR) of the shift register circuit 210 areas follows (see FIG. 4). As for odd-numbered stages, the first gate clock signal CK1 is supplied as the first clock CKA, and the second gate clock signal CK2 is supplied as the second clock CKB. As for even-numbered stages, the second gate clock signal CK2 is supplied as the first clock CKA, and the first gate clock signal CK1 is supplied as the second clock CKB. It should be noted that a phase of the first gate clock signal CK1 and a phase of the second gate clock signal CK2 are displaced by 180 degrees. Further, to any stage, the output signal OUT outputted from a previous stage is supplied as the set signal S. However, to the first-stage unit circuit SR1, the gate start pulse signal ST is supplied as the set signal S. The initialization signal INIT is commonly supplied to all stages.

From an output terminal of each stage (each unit circuit SR) of the shift register circuit 210, the output signal OUT is outputted. The output signal OUT outputted from any stage (k-th stage, here) is supplied as a scanning signal GOUTk to a gate bus line GLk of a k-th line, as well as supplied as the set signal S to a (k+1)th-stage unit circuit SRk+1.

With the above described configuration, when a pulse of the gate start pulse signal ST as the set signal S is supplied to the first-stage unit circuit SR1 of the shift register circuit 210, a shift pulse included in the output signal OUT outputted from each of the unit circuits SR is sequentially transferred from the first-stage unit circuit SR1 to the n-th stage unit circuit SRn based on a clock operation of the two-phase gate clock signals. Then, depending on the transfer of the shift pulse, the output signal OUT outputted from each of the unit circuits SR is sequentially turned to the high-level. With this, scanning signals GOUT1 to GOUTn that are sequentially turned to the high-level (active) for a predetermined period are supplied to the gate bus lines GL1 to GLn within the display unit 400.

1.3 Configuration of Unit Circuit

Figure 1:
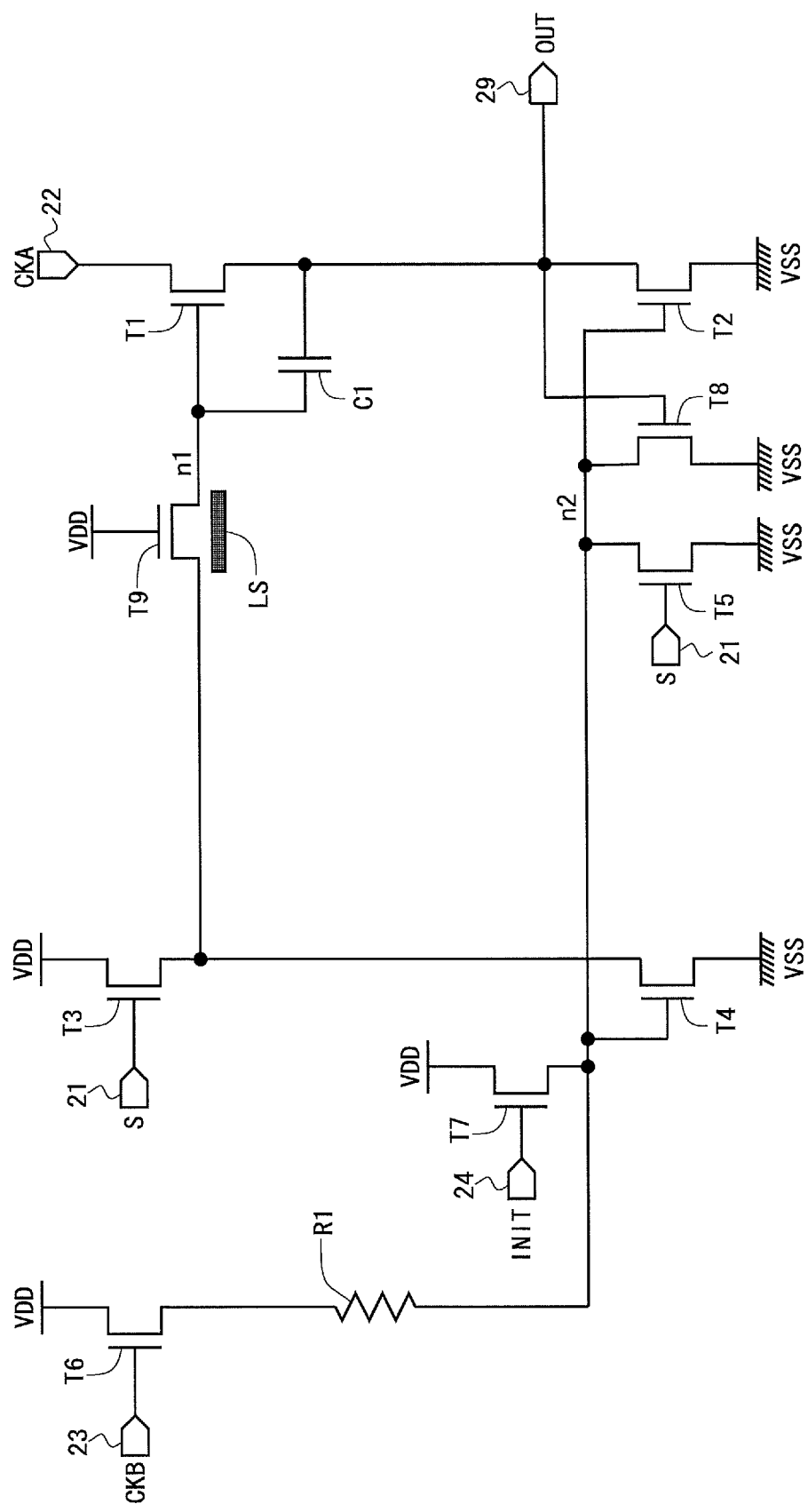
FIG. 1 is a circuit diagram showing a configuration of a unit circuit (configuration of a single stage of a shift register circuit) in an active matrix-type liquid crystal display device according to a first embodiment of the present invention.

FIG. 1 is a circuit diagram showing a configuration of the unit circuit SR (configuration of a single stage of the shift register circuit 210) according to this embodiment. As shown in FIG. 1, the unit circuit SR includes nine thin-film transistors T1 to T9, one capacitor C1, and one resistor R1. The unit circuit SR further includes four input terminals 21 to 24 and a single output terminal (output node) 29, in addition to the input terminal for the low-level supply voltage VSS and the input terminal for the high-level supply voltage VDD. Here, the input terminal for receiving the set signal S is indicated by a reference symbol 21, the input terminal for receiving the first clock CKA is indicated by a reference symbol 22, the input terminal for receiving the second clock CKB is indicated by a reference symbol 23, and the input terminal for receiving the initialization signal INIT is indicated by a reference symbol 24. It should be noted that, while the initialization signal INIT is supplied to both of a gate terminal of the thin-film transistor T3 and a gate terminal of the thin-film transistor T5, the input terminals 21 for the initialization signal INIT are shown separately in FIG. 1, for convenience.

In this embodiment, a light shielding film LS is provided only for the thin-film transistor T9, out of the nine thin-film transistors T1 to T9. The thin-film transistors T1 to T8 other than the thin-film transistor T9 are not provided with the light shielding film LS. In this manner, there are both a thin-film transistor provided with a light shielding film and a thin-film transistor without a light shielding film. It should be noted that the nine thin-film transistors T1 to T9 are of an n-channel type.

Next, a relationship of connection between components within the unit circuit SR will be described. A gate terminal of the thin-film transistor T1, a source terminal of the thin-film transistor T9, and one end of the capacitor C1 are connected to each other. It should be noted that a region (wiring) where these are connected to each other is referred to as a "first node", for convenience. The first node is indicated by a reference symbol n1. A gate terminal of the thin-film transistor T2, a gate terminal of the thin-film transistor T4, a drain terminal of the thin-film transistor T5, a source terminal of the thin-film transistor T7, a drain terminal of the thin-film transistor T8, and one end of the resistor R1 are connected to each other. It should be noted that a region (wiring) where these are connected to each other is referred to as a "second node", for convenience. The second node is indicated by a reference symbol n2.

Regarding the thin-film transistor T1, the gate terminal is connected to the first node n1, a drain terminal is connected to the input terminal 22, and a source terminal is connected to the output terminal 29. Regarding the thin-film transistor T2, the gate terminal is connected to the second node n2, a drain terminal is connected to the output terminal 29, and a source terminal is connected to an input terminal for the low-level supply voltage VSS. Regarding the thin-film transistor T3, a gate terminal is connected to the input terminal 21, a drain terminal is connected to the input terminal for the high-level supply voltage VDD, and a source terminal is connected to a drain terminal of the thin-film transistor T4 and a drain terminal of the thin-film transistor T9. Regarding the thin-film transistor T4, the gate terminal is connected to the second node n2, the drain terminal is connected to the source terminal of the thin-film transistor T3 and the drain terminal of the thin-film transistor T9, and a source terminal is connected to the input terminal for the low-level supply voltage VSS.

Regarding the thin-film transistor T5, a gate terminal is connected to the input terminal 21, the drain terminal is connected to the second node n2, and a source terminal is connected to the input terminal for the low-level supply voltage VSS. Regarding the thin-film transistor T6, a gate terminal is connected to the input terminal 23, a drain terminal is connected to the input terminal for the high-level supply voltage VDD, and a source terminal is connected to the other end of the resistor R1. Regarding the thin-film transistor T7, a gate terminal is connected to the input terminal 24, a drain terminal is connected to the input terminal for the high-level supply voltage VDD, and the source terminal is connected to the second node n2. Regarding the thin-film transistor T8, a gate terminal is connected to the output terminal 29, the drain terminal is connected to the second node n2, and a source terminal is connected to the input terminal for the low-level supply voltage VSS. Regarding the thin-film transistor T9, a gate terminal is connected to the input terminal for the high-level supply voltage VDD, the drain terminal is connected to the source terminal of the thin-film transistor T3 and the drain terminal of the thin-film transistor T4, and the source terminal is connected to the first node n1.

Regarding the capacitor C1, the one end is connected to the gate terminal of the thin-film transistor T1, and the other end is connected to the source terminal of the thin-film transistor T1. Regarding the resistor R1, the one end is connected to the second node n2, and the other end is connected to the source terminal of the thin-film transistor T6.

It should be noted that in this embodiment, the thin-film transistor T1 realizes an output control transistor, the thin-film transistor T2 realizes an output node turn-off transistor, the thin-film transistor T4 realizes a first node turn-off transistor, the thin-film transistor T9 realizes a voltage dividing transistor, the thin-film transistor T3, the input terminal 21, and the input terminal for the high-level supply voltage VDD realize a first node turn-on portion.

1.4 Operation of Shift Register Circuit

Figure 5:
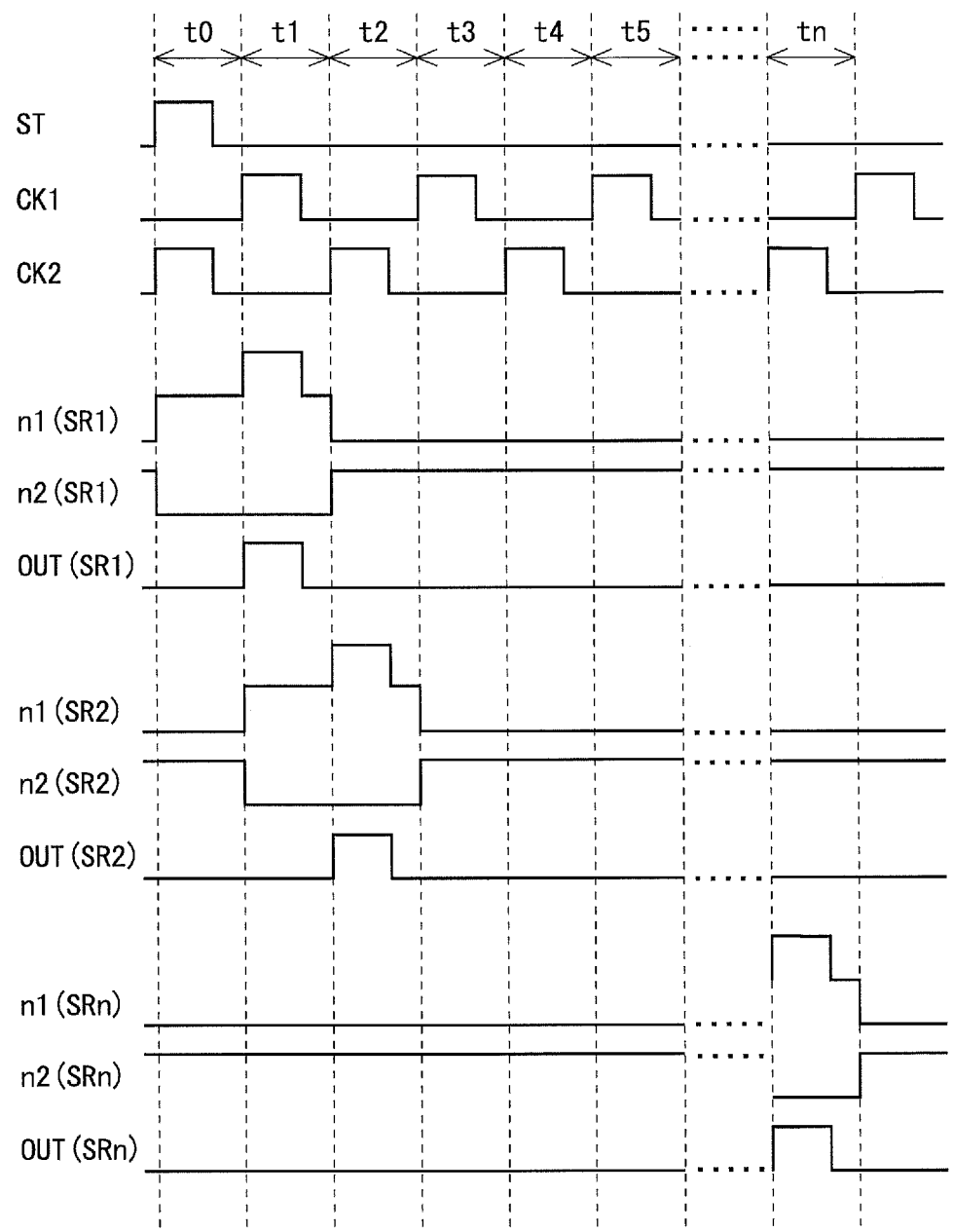
FIG. 5 is a signal waveform diagram for illustration of an operation of the shift register circuit according to the first embodiment.

Next, an operation of the shift register circuit 210 according to this embodiment will be described with reference to FIG. 1, FIG. 4, and FIG. 5. FIG. 5 is a signal waveform diagram for illustration of the operation of the shift register circuit 210 according to this embodiment. It should be noted that, in FIG. 5, a period in which a pulse of the gate start pulse signal ST is to be outputted is indicated by a reference symbol t0, a period in which the gate bus line GLk of the k-th line (k is an integer no smaller than 1 and no greater than n) is to be in a selected state is indicated by a reference symbol tk (the same applies to FIG. 6, FIG. 8, FIG. 9, FIG. 11, FIG. 14, FIG. 15, FIG. 23, FIG. 24, FIG. 27, and FIG. 28). Further, in FIG. 5, a reference symbol "n2 (SR2)" means that "the second node n2 of the second-stage unit circuit SR2", for example.

In a period before the period t0, in all of the unit circuits SR, a potential at the first node n1 is at a low-level, a potential at the second node n2 is at a high-level, and the output signal OUT is at a low-level.

First, an attention is paid to the first-stage unit circuit SR1. In the period t0, a pulse of the gate start pulse signal ST is outputted. As the gate start pulse signal ST is supplied as the set signal S to the first-stage unit circuit SR1, the thin-film transistor T3 and the thin-film transistor T5 become the on-state in the period t0. By the thin-film transistor T5 becoming the on-state, the potential at the second node n2 is turned to the low-level. With this, the thin-film transistor T2 and the thin-film transistor T4 become the off-state. Further, at this time, the thin-film transistor T9 is in the on-state, and the first node n1 is pre-charged due to the thin-film transistor T3 becoming the on-state. Due to the pre-charge, the potential at the first node n1 substantially becomes "VDD−Vth". It should be noted that Vth is a threshold voltage of the thin-film transistor T3. Further, as the thin-film transistor T4 is in the off-state as described above, the potential at the first node n1 does not decrease.

In a period t1, the set signal S (the gate start pulse signal ST) is at the low-level. Accordingly, the thin-film transistor T3 is in the off-state. Further, in the period t1, the second gate clock signal CK2 is at the low-level. As the second gate clock signal CK2 is supplied as the second clock CKB to the first-stage unit circuit SR1, the thin-film transistor T6 is in the off-state. Therefore, the second node n2 is maintained at the low-level, and the thin-film transistor T4 is in the off-state. As a result, the first node n1 becomes a floating state in the period t1.

Further, in the period t1, the first gate clock signal CK1 changes from the low-level to the high-level. As the first gate clock signal CK1 is supplied as the first clock CKA to the first-stage unit circuit SR1, a potential at the input terminal 22 increases in the period t1. As the first node n1 is in the floating state as described above, the first node n1 is bootstrapped by the increase of the potential at the input terminal 22 (the first node n1 is in a boosted state). More specifically, the potential at the first node n1 substantially becomes "VDD×2−Vth". With this, a high voltage is applied to the gate terminal of the thin-film transistor T1, and a potential of the output signal OUT (a potential of the output terminal 29) increases up to a high-level potential of the first gate clock signal CK1 without causing a so-called threshold voltage drop (where the source potential increases only up to a potential lower than the drain potential by the threshold voltage). In this manner, the gate bus line GL1 connected to the output terminal 29 of the first-stage unit circuit SR1 becomes the selected state.

Further, in the period t1, by turning the output signal OUT to the high-level as described above, the thin-film transistor T8 becomes the on-state. With this, the potential at the second node n2 is reliably led to the VSS potential. Therefore, in the period t1, the thin-film transistor T2 and the thin-film transistor T4 are reliably maintained in the off-state. Accordingly, the potential of the output signal OUT and the potential at the first node n1 do not decrease in the period t1.

Meanwhile, in a case in which the thin-film transistor T9 is not provided within the unit circuit SR, in the period t1, the source potential of the thin-film transistor T3 and the drain potential of the thin-film transistor T4 become extremely high potentials (substantially at "VDD×2−Vth") by bootstrap based on an increase of the potential at the input terminal 22. Accordingly, a voltage exceeding a withstanding voltage can be possibly applied to the thin-film transistor T3 and the thin-film transistor T4. In other words, there is a possibility that the thin-film transistor T3 and the thin-film transistor T4 can be destructed. In view of this point, as the thin-film transistor T9 is provided within the unit circuit SR in this embodiment, the source potential of the thin-film transistor T3 and the drain potential of the thin-film transistor T4 are maintained no higher than "VDD−Vth" even if the potential at the first node n1 increases up to "VDD×2−Vth" in the period t1. With this, it is possible to prevent destruction of the thin-film transistors T3 and T4.

In a period t2, the second gate clock signal CK2 changes from the low-level to the high-level. With this, the thin-film transistor T6 becomes the on-state. As a result, the potential at the second node n2 increases from the low-level to the high-level via the resistor R1, and therefore the thin-film transistor T2 and the thin-film transistor T4 become the on-state. With this, the potential of the output signal OUT and the potential at the first node n1 are led to the VSS potential.

In a period t3 and thereafter, in the first-stage unit circuit SR1, the thin-film transistor T6 becomes the on-state every time when the second gate clock signal CK2 changes from the low-level to the high-level. Therefore, in the period t3 and thereafter, the potential at the second node n2 is maintained at the high-level, and the potential of the output signal OUT and the potential at the first node n1 are led to the VSS potential, as needed.

Next, an attention is paid to the second-stage unit circuit SR2. To the second-stage unit circuit SR2, the output signal OUT outputted from the first-stage unit circuit SR1 is supplied as the set signal S. Therefore, a high-level set signal S is supplied to the second-stage unit circuit SR2 in the period t1. With this, similarly to the first-stage unit circuit SR1 in the period t0, the first node n1 is pre-charged in the period t1. Then, in the period t2, similarly to the first-stage unit circuit SR1 in the period t1, the first node n1 is boot-strapped, and the potential of the output signal OUT increases up to a high-level potential of the second gate clock signal CK2. Further, in the period t3, similarly to the first-stage unit circuit SR1 in the period t2, the potential of the output signal OUT and the potential at the first node n1 are led to the VSS potential. Moreover, in a period t4 and thereafter, similarly to the first-stage unit circuit SR1 in the period t3 and thereafter, the potential of the output signal OUT and the potential at the first node n1 are led to the VSS potential, as needed.

Regarding the unit circuits SR3 to SRn of third stage to n-th stage, the same operation is performed. It should be noted that the initialization signal INIT is turned to the high-level in a vertical blanking interval, for example. When the initialization signal INIT is turned to the high-level, the thin-film transistor T7 becomes the on-state. With this, the potential at the second node n2 is turned to the high-level, the thin-film transistor T2 and the thin-film transistor T4 become the on-state. As a result, the potential of the output signal OUT and the potential at the first node n1 are led to the VSS potential. As the initialization signal INIT is commonly supplied to all of the unit circuits SR1 to SRn, by turning the initialization signal INIT to the high-level, the potential of the output signal OUT and the potential at the first node n1 can be set to the VSS potential for all of the unit circuits SR1 to SRn.

As described above, output signals OUT1 to OUTn that are sequentially turned to the high-level by a predetermined period are outputted from the n unit circuits SR1 to SRn that constitute the shift register circuit 210, and the output signals OUT1 to OUTn are supplied as the scanning signals GOUT1 to GOUTn to the gate bus lines GL1 to GLn within the display unit 400.

Meanwhile, based on the operation described above in relation to the shift register circuit 210, the thin-film transistors T1 to T9 within the unit circuit SR can be categorized into two groups (a first group and a second group) based on on-duty. For example, thin-film transistors whose on-off states are controlled based on on-duty no smaller than 50 percent may be categorized as the first group, and thin-film transistors whose on-off states are controlled based on on-duty smaller than 50 percent may be categorized as the second group. In this case, the thin-film transistors T2, T4, and T9 are categorized as the first group, and the thin-film transistors T1, T3, and T5 to T8 are categorized as the second group. Further, in this embodiment, the light shielding film LS is provided only for the thin-film transistor T9 among the thin-film transistors included in the first group, as described above.

1.5 Operation that is Concerned when a Light Shielding Film is not Provided for Thin-Film Transistor T9

Figure 6:
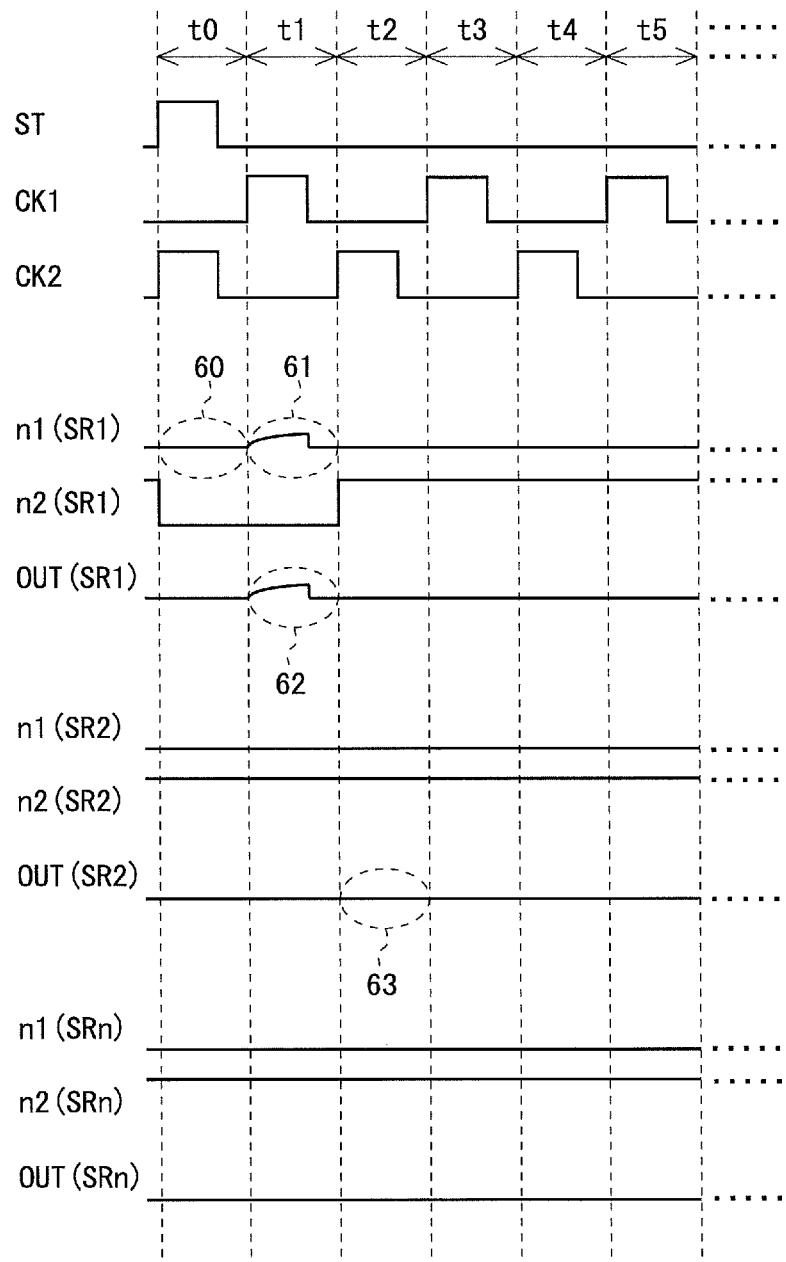
FIG. 6 is a signal waveform diagram for illustration of an operation that is concerned when a light shielding film is not provided for a thin-film transistor T9 within the unit circuit illustrated in FIG. 1.

Next, an operation that is concerned when the light shielding film LS is not provided for the thin-film transistor T9 will be described with reference to FIG. 1 and FIG. 6. As shown in FIG. 1, the high-level supply voltage VDD is supplied to the gate terminal of the thin-film transistor T9. Specifically, a positive bias is always supplied to the gate of the thin-film transistor T9. Accordingly, in the thin-film transistor T9, a threshold shift occurs due to an influence of external light. As a result, there is a case in which a value of the threshold voltage for the thin-film transistor T9 becomes higher than an original value. When the value of the threshold voltage of the thin-film transistor T9 increases, the thin-film transistor T9 cannot be easily turned to the on-state. In such a case, in the period t0, although the first node n1 in the first-stage unit circuit SR1 should be pre-charged, the potential at the first node n1 is maintained at the low-level (see a portion indicated by a reference symbol 60 in FIG. 6). Then, in the period t1, an increase of the potential at the first node n1 by bootstrap does not occur normally (see a portion indicated by a reference symbol 61 in FIG. 6), and a pulse of the output signal OUT is not normally outputted from the first-stage unit circuit SR (see a portion indicated by a reference symbol 62 in FIG. 6). Further, as the second-stage unit circuit SR2 is operated based on the output signal OUT outputted from the first-stage unit circuit SR1, a level of the pulse of the output signal OUT outputted from the second-stage unit circuit SR2 further decreases (see a portion indicated by a reference symbol 63 in FIG. 6). A waveform of the output signal OUT outputted from each of the unit circuits SR becomes abnormal in this manner, and thus malfunction is caused.

In view of this point, in this embodiment, the light shielding film LS is provided for the thin-film transistor T9 in which its gate terminal is always supplied with a positive bias. Accordingly, a threshold shift due to an influence of external light does not occur regarding the thin-film transistor T9. Therefore, the malfunction described above does not occur, and the gate bus lines GL1 to GLn within the display unit 400 are driven normally.

1.6 Effects

According to this embodiment, in the liquid crystal display device in which each stage (each unit circuit SR) of the shift register circuit 210 within the gate driver 200 is configured as shown in FIG. 1, the light shielding film LS is provided for the thin-film transistor T9 of each of the unit circuits SR. Accordingly, even though a bias (here, the high-level supply voltage VDD) is supplied to the gate of the thin-film transistor T9, a threshold shift due to an influence of external light does not occur regarding the thin-film transistor T9. Thus, it is possible to prevent occurrence of malfunction caused by a threshold shift of the thin-film transistor T9.

Further, according to this embodiment, the light shielding film LS is provided only for the thin-film transistor T9 which is one of the nine thin-film transistors T1 to T9 provided for each of the unit circuits SR. Specifically, as the thin-film transistors T1 to T8 are not provided with the light shielding film LS, malfunction caused by off-leak in the thin-film transistors T1 to T8 does not occur. In addition, unlike a case in which a light shielding film is provided for an entire shift register circuit, an unwanted load (capacitance) between lines does not increase. Therefore, malfunction that can occur in the case in which a light shielding film is provided for an entire shift register circuit does not occur.

As described above, according to this embodiment, it is possible to achieve the shift register circuit 210 capable of preventing occurrence of malfunction caused by a threshold shift of a thin-film transistor due to an influence of external light.

2. Second Embodiment

2.1 Configuration and the Like

A second embodiment of the present invention will be described. An overall configuration and a schematic configuration of the shift register circuit 210 are the same as those in the first embodiment, and shall not be described (see FIG. 2 to FIG. 4).

Figure 7:
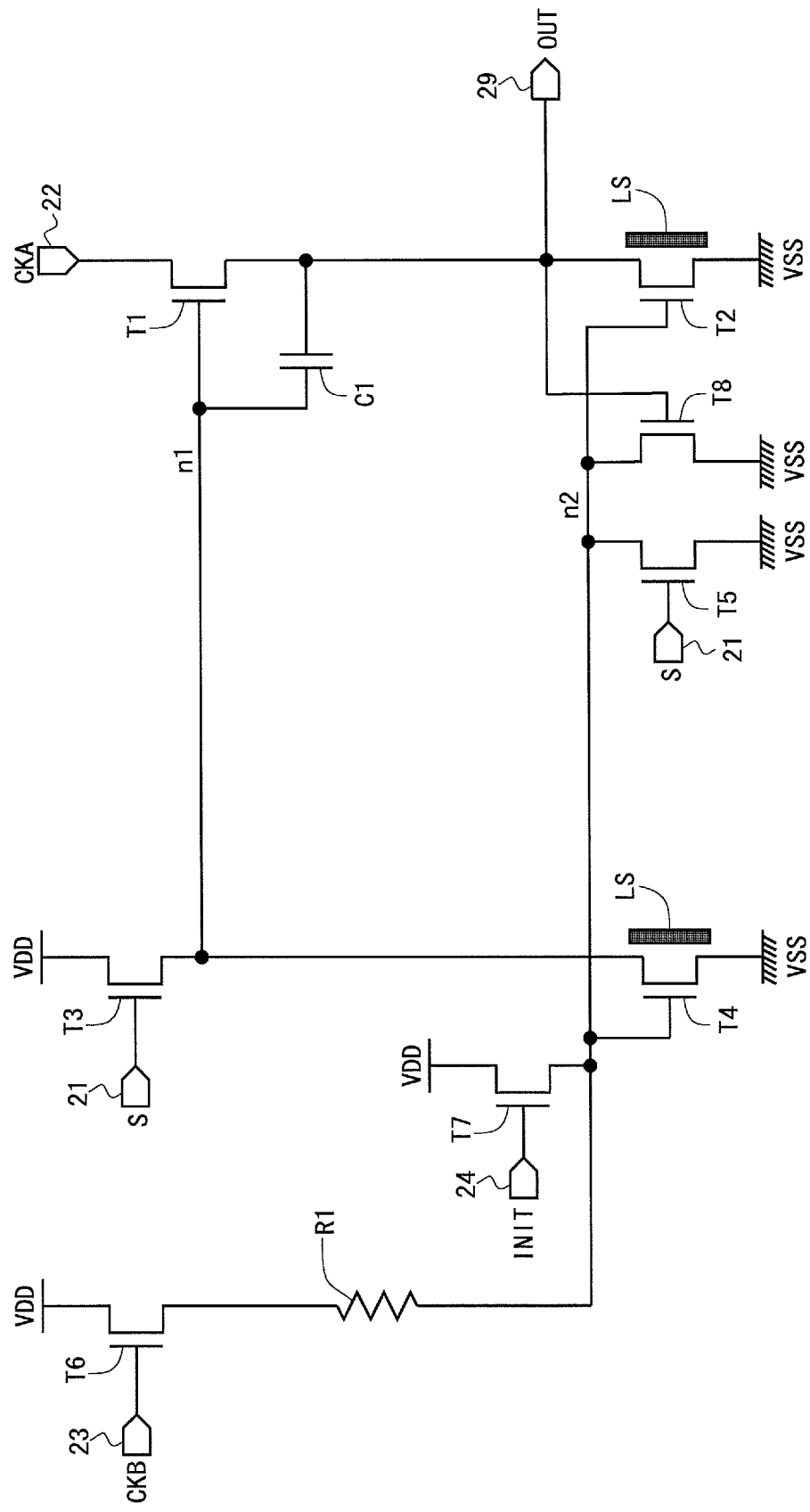
FIG. 7 is a circuit diagram showing a configuration of a unit circuit (configuration of a single stage of a shift register circuit) in an active matrix-type liquid crystal display device according to a second embodiment of the present invention.

FIG. 7 is a circuit diagram showing a configuration of the unit circuit SR (configuration of a single stage of the shift register circuit 210) according to this embodiment. The unit circuit SR according to this embodiment is not provided with the thin-film transistor T9 that is provided for the unit circuit SR of the first embodiment (see FIG. 1). Therefore, in this embodiment, a region (wiring) where the gate terminal of the thin-film transistor T1, the source terminal of thin-film transistor T3, the drain terminal of the thin-film transistor T4, and the one end of the capacitor C1 are connected to each other is referred to as a "first node". The first node is indicated by a reference symbol n1. Other than that the thin-film transistor T9 is not provided, the configuration of the unit circuit SR according to this embodiment is the same as the configuration of the first embodiment. Therefore, the relationship of connection between components within the unit circuit SR shall not be described.

In this embodiment, the light shielding film LS is provided only for the thin-film transistors T2 and T4 out of the eight thin-film transistors T1 to T8 within the unit circuit SR. The thin-film transistors T1, T3, and T5 to T8 are not provided with the light shielding film LS.

An operation of the shift register circuit 210 is also the same as that in the first embodiment, and shall not be described (see FIG. 5). However, in this embodiment, as the thin-film transistor T9 is not provided for the unit circuit SR, in the first-stage unit circuit SR1, for example, the source potential of the thin-film transistor T3 and the drain potential of the thin-film transistor T4 become extremely high (substantially "VDD×2−Vth") in the period t1. Regarding this phenomenon, it is possible to prevent destruction of the thin-film transistors T3 and T4 by employing a sufficiently pressure-resisting thin-film transistor as the thin-film transistors T3 and T4.

2.2 Operation that is Concerned when a Light Shielding Film is Not Provided for Thin-Film Transistors T2 and T4

Figure 8:
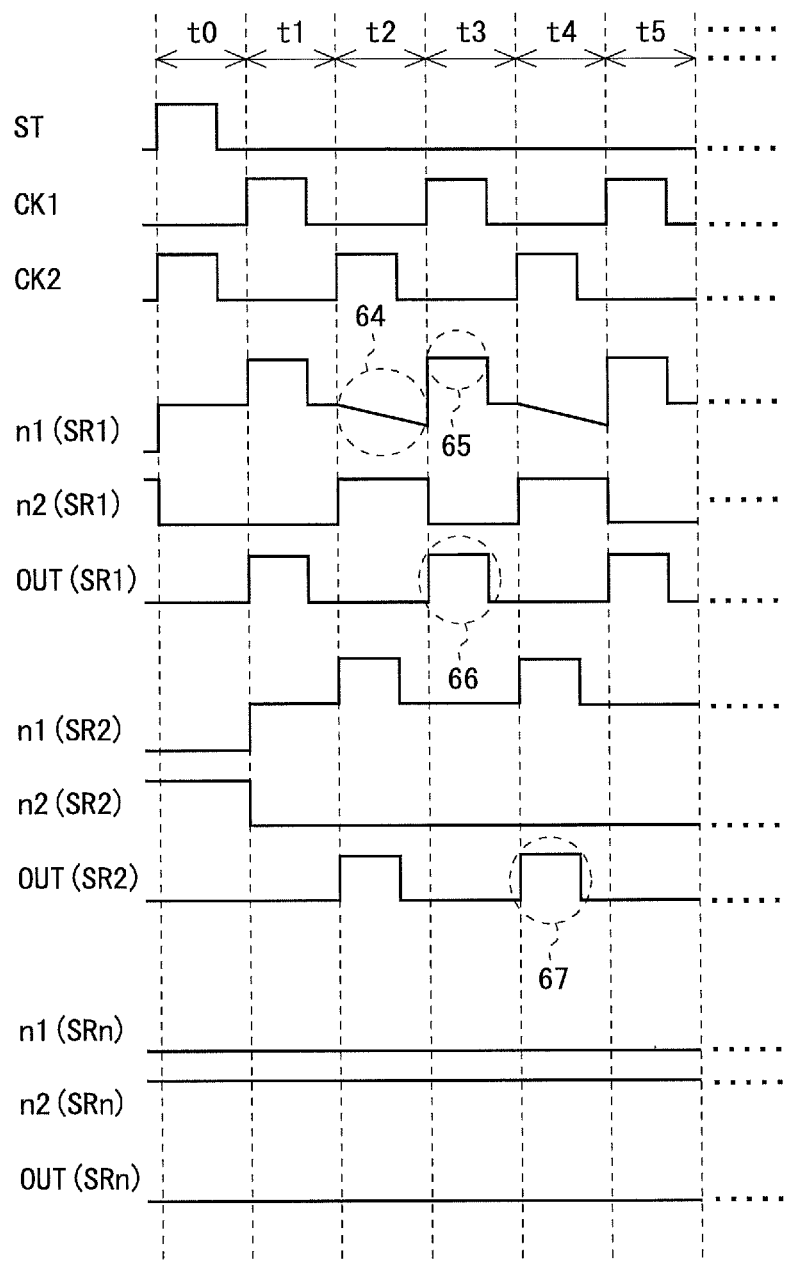
FIG. 8 is a signal waveform diagram for illustration of an operation that is concerned when a light shielding film is not provided for a thin-film transistor T4 within the unit circuit illustrated in FIG. 7.

An operation that is concerned when the light shielding film LS is not provided for the thin-film transistor T4 will be described with reference to FIG. 7 and FIG. 8. As can be seen from FIG. 5, in each of the unit circuits SR, the potential at the second node n2 is at the low-level only during a period in which the first node n1 is pre-charged and a period in which the high-level output signal OUT is outputted. For example, in the first-stage unit circuit SR1, the potential at the second node n2 is at the low-level only during the period t0 and the period t1, and the potential at the second node n2 is maintained at the high-level during periods other than these. Here, as shown in FIG. 7, the gate terminal of the thin-film transistor T4 is connected to the second node n2. Therefore, a positive bias is supplied to the gate of the thin-film transistor T4 for an extended length of time. Accordingly, in the thin-film transistor T4, a threshold shift occurs due to an influence of external light. As a result, there is a case in which a value of the threshold voltage for the thin-film transistor T4 becomes higher than an original value. When the value of the threshold voltage of the thin-film transistor T4 increases, the thin-film transistor T4 cannot be easily turned to the on-state. In such a case, in the first-stage unit circuit SR1, for example, in the period t2, although the potential at the first node n1 should change from the high-level to the low-level, the potential at the first node n1 does not decrease sufficiently (see a portion indicated by a reference symbol 64 in FIG. 8) as the thin-film transistor T4 does not become the on-state. Then, in the period t3, based on the first gate clock signal CK1 changing from the low-level to the high-level, the potential at the first node n1 again increases due to bootstrap (see a portion indicated by a reference symbol 65 in FIG. 8). As a result, the high-level output signal OUT is again outputted from the first-stage unit circuit SR1 (see a portion indicated by a reference symbol 66 in FIG. 8). Further, as the second-stage unit circuit SR2 is operated based on the output signal OUT outputted from the first-stage unit circuit SR1, the high-level output signal OUT is outputted from the second-stage unit circuit SR2 in the period t4 (see a portion indicated by a reference symbol 67 in FIG. 8). In this manner, malfunction is caused.

Figure 9:
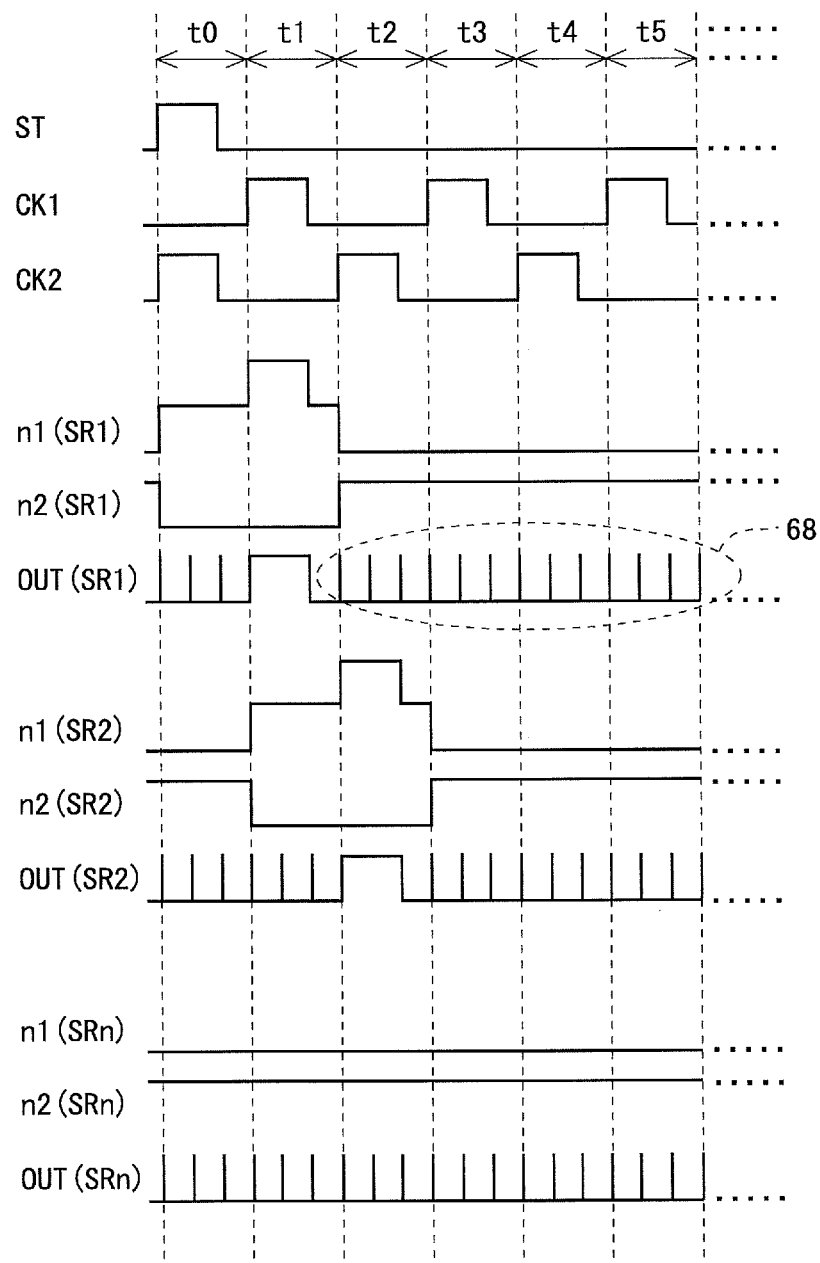
FIG. 9 is a signal waveform diagram for illustration of an operation that is concerned when a light shielding film is not provided for a thin-film transistor T2 within the unit circuit illustrated in FIG. 7.

Next, an operation that is concerned when a light shielding film is not provided for the thin-film transistor T2 will be described with reference to FIG. 7 and FIG. 9. As shown in FIG. 7, the gate terminal of the thin-film transistor T2 is connected to the second node n2. Therefore, similarly to the thin-film transistor T4, there is a case in which a value of the threshold voltage for the thin-film transistor T2 becomes higher than an original value. When the value of the threshold voltage of the thin-film transistor T2 increases, the thin-film transistor T2 cannot be easily turned to the on-state. In such a case, in each of the unit circuits SR, there is a case in which the thin-film transistor T2 are not maintained in the on-state during a period in which the potential at the second node n2 is at the high-level. As a result, the potential of the output signal OUT is not led to the VSS potential during the period in which the potential at the second node n2 is at the high-level. With this, due to an influence of noises caused by a change in the video signal (amplitude change), a noise is generated also in the waveform of the output signal OUT (see a portion indicated by a reference symbol 68 in FIG. 9). Further, there is a case in which the thin-film transistor T8 is turned to the on-state by a pulse produced in the gate bus line GL due to an influence of noises, and the potential at the second node n2 is turned to the low-level during a period in which the potential at the second node n2 should be maintained at the high-level. In this manner, malfunction is caused.

In view of this point, in this embodiment, the light shielding film LS is provided for the thin-film transistors T2 and T4 that are n-channel type transistors whose gate terminals are applied with a positive bias for an extended length of time. Accordingly, a threshold shift due to an influence of external light does not occur regarding the thin-film transistors T2 and T4. Therefore, the malfunction described above does not occur, and the gate bus lines GL1 to GLn within the display unit 400 are driven normally.

2.3 Effects

According to this embodiment, in the liquid crystal display device in which each stage (each unit circuit SR) of the shift register circuit 210 within the gate driver 200 is configured as shown in FIG. 7, the light shielding film LS is provided for the thin-film transistors T2 and T4 in each of the unit circuits SR. Accordingly, even though a bias is supplied to the gates of the thin-film transistors T2 and T4 for an extended length of time, a threshold shift due to an influence of external light does not occur regarding the thin-film transistors T2 and T4. Therefore, it is possible to prevent occurrence of malfunction caused by a threshold shift of the thin-film transistors T2 and T4. Further, similarly to the first embodiment, malfunction caused by off-leak in the thin-film transistors other than the thin-film transistors T2 and T4 and malfunction that can occur in the case in which a light shielding film is provided for an entire shift register circuit do not occur. From the above, according to this embodiment, it is also possible to achieve the shift register circuit 210 capable of preventing occurrence of malfunction caused by a threshold shift of a thin-film transistor due to an influence of external light.

3. Third Embodiment 3.1 Configuration and the Like

A third embodiment of the present invention will be described. An overall configuration and a schematic configuration of the shift register circuit 210 are the same as the first embodiment, and shall not be described (see FIG. 2 to FIG. 4).

Figure 10:
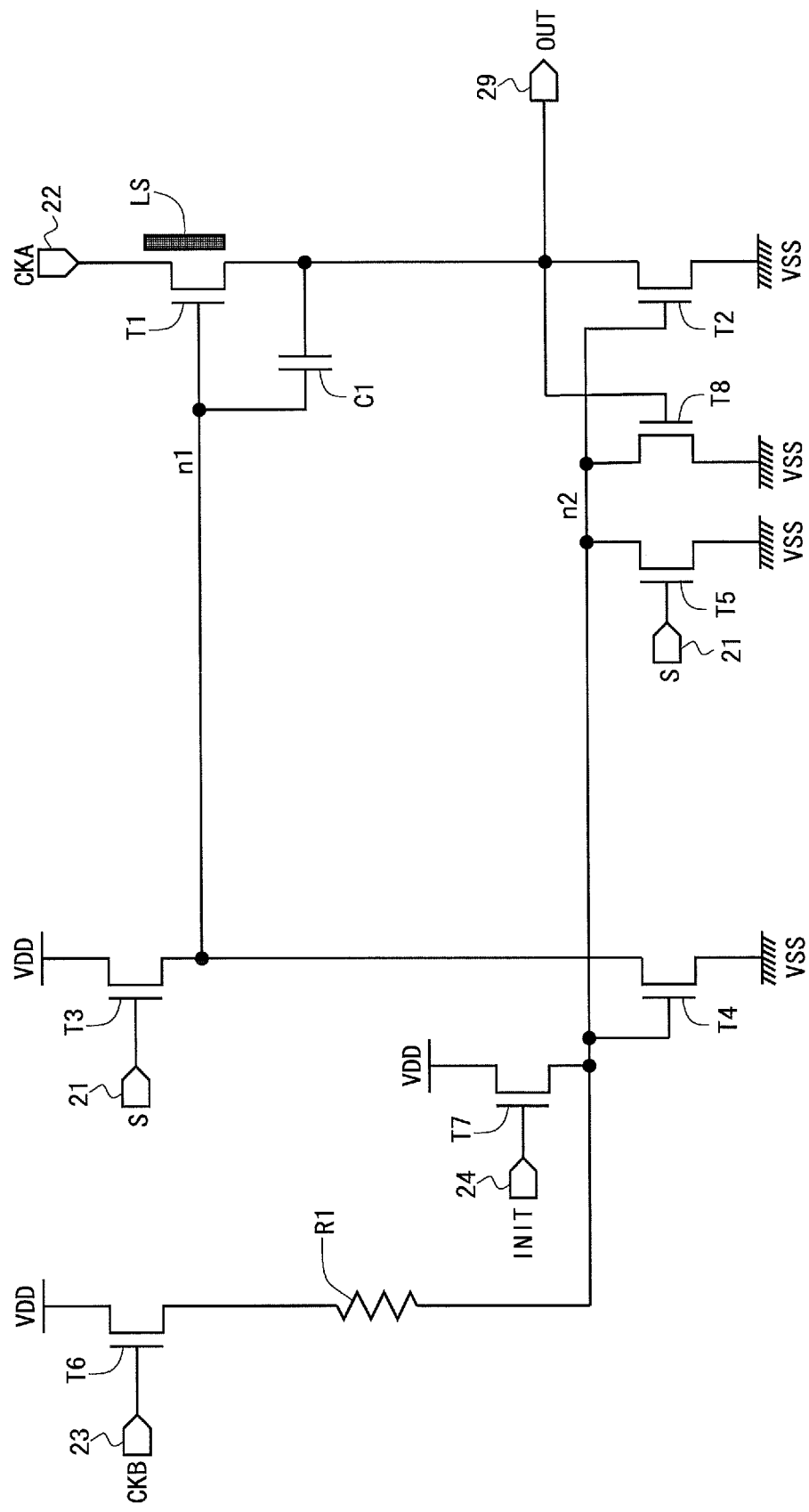
FIG. 10 is a circuit diagram showing a configuration of a unit circuit (configuration of a single stage of a shift register circuit) in an active matrix-type liquid crystal display device according to a third embodiment of the present invention.

FIG. 10 is a circuit diagram showing a configuration of the unit circuit SR (configuration of a single stage of the shift register circuit 210) according to this embodiment. A circuit configuration of the unit circuit SR according to this embodiment is the same as the circuit configuration of the unit circuit SR according to the second embodiment. However, as can be seen from FIG. 7 and FIG. 10, while the light shielding film LS is only provided for the thin-film transistors T2 and T4 in the second embodiment, the light shielding film LS is only provided for the thin-film transistor T1 in this embodiment. It should be noted that an operation of the shift register circuit 210 is also the same as in the second embodiment.

3.2 Operation that is Concerned when a Light Shielding Film is Not Provided for Thin-Film Transistor T1

Figure 11:
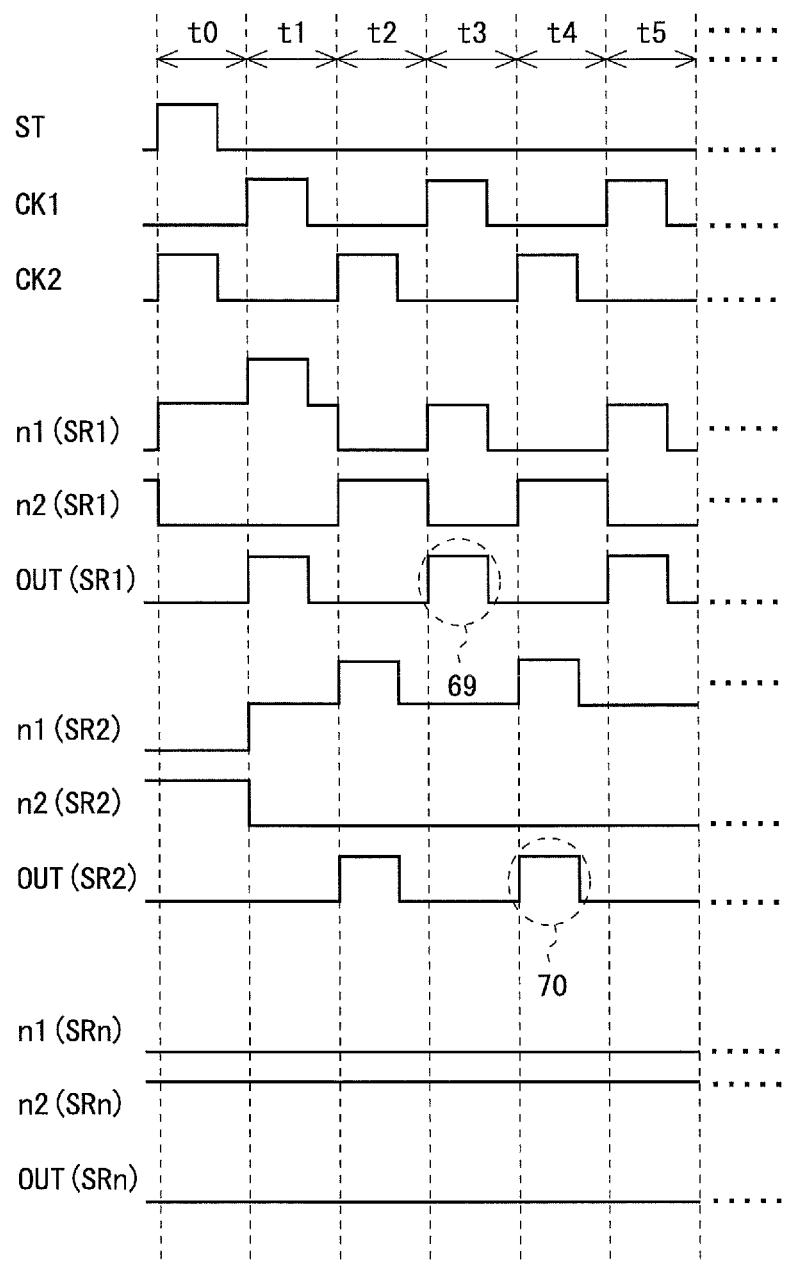
FIG. 11 is a signal waveform diagram for illustration of an operation that is concerned when a light shielding film is not provided for a thin-film transistor T1 within the unit circuit illustrated in FIG. 10.

An operation that is concerned when the light shielding film LS is not provided for the thin-film transistor T1 will be described with reference to FIG. 10 and FIG. 11. As can be seen from FIG. 5, in each of the unit circuits SR, the potential at the first node n1 is at the high-level only during a period in which the first node n1 is pre-charged and a period in which the high-level output signal OUT is outputted. For example, in the first-stage unit circuit SR1, the potential at the first node n1 is at the high-level only during the period t0 and the period t1, and the potential at the first node n1 is maintained at the low-level during periods other than these. Here, as shown in FIG. 10, the gate terminal of the thin-film transistor T1 is connected to the first node n1. Therefore, a negative bias is supplied to the gate of the thin-film transistor T1 for an extended length of time. Accordingly, in the thin-film transistor T1, a threshold shift occurs due to an influence of external light. As a result, there is a case in which a value of the threshold voltage for the thin-film transistor T1 becomes lower than an original value. When the value of the threshold voltage of the thin-film transistor T1 decreases, the thin-film transistor T1 can be easily turned to the on-state. In such a case, for example, in the first-stage unit circuit SR1, the thin-film transistor T1 is maintained in the on-state after the period t2, and in the period t3, the output signal OUT is turned to the high-level based on the first gate clock signal CK1 (the first clock CKA) changing from the low-level to the high-level. Accordingly, the thin-film transistor T8 becomes the on-state, and the potential at the second node n2 is turned to the low-level. With this, the thin-film transistor T4 becomes the off-state. Then, the first node n1 becomes the floating state, and the first node n1 is boot-strapped. As a result, the potential of the output signal OUT (the potential of the output terminal 29) increases up to a high-level potential of the first gate clock signal CK1 without causing a so-called threshold voltage drop (see a portion indicated by a reference symbol 69 in FIG. 11). Further, as the second-stage unit circuit SR2 is operated based on the output signal OUT outputted from the first-stage unit circuit SR1, the high-level output signal OUT is outputted from the second-stage unit circuit SR2 in the period t4 (see a portion indicated by a reference symbol 70 in FIG. 11). In this manner, malfunction is caused.

In view of this point, in this embodiment, the light shielding film LS is provided for the thin-film transistor T1 that is an n-channel type transistor whose gate terminal is applied with a negative bias for an extended length of time. Accordingly, a threshold shift due to an influence of external light does not occur regarding the thin-film transistor T1. Therefore, the malfunction described above does not occur, and the gate bus lines GL1 to GLn within the display unit 400 are driven normally.

3.3 Effects

According to this embodiment, in the liquid crystal display device in which each stage (each unit circuit SR) of the shift register circuit 210 within the gate driver 200 is configured as shown in FIG. 10, the light shielding film LS is provided for the thin-film transistor T1 in each of the unit circuits SR. Accordingly, even though a bias is supplied to the gate of the thin-film transistor T1 for an extended length of time, a threshold shift due to an influence of external light does not occur regarding the thin-film transistor T1. Therefore, it is possible to prevent occurrence of malfunction caused by a threshold shift of the thin-film transistor T1. Further, similarly to the first embodiment, malfunction caused by off-leak in the thin-film transistors other than the thin-film transistor T1 and malfunction that can occur in the case in which a light shielding film is provided for an entire shift register circuit do not occur. From the above, according to this embodiment, it is also possible to achieve the shift register circuit 210 capable of preventing occurrence of malfunction caused by a threshold shift of a thin-film transistor due to an influence of external light.

4. Fourth Embodiment

Figure 12:
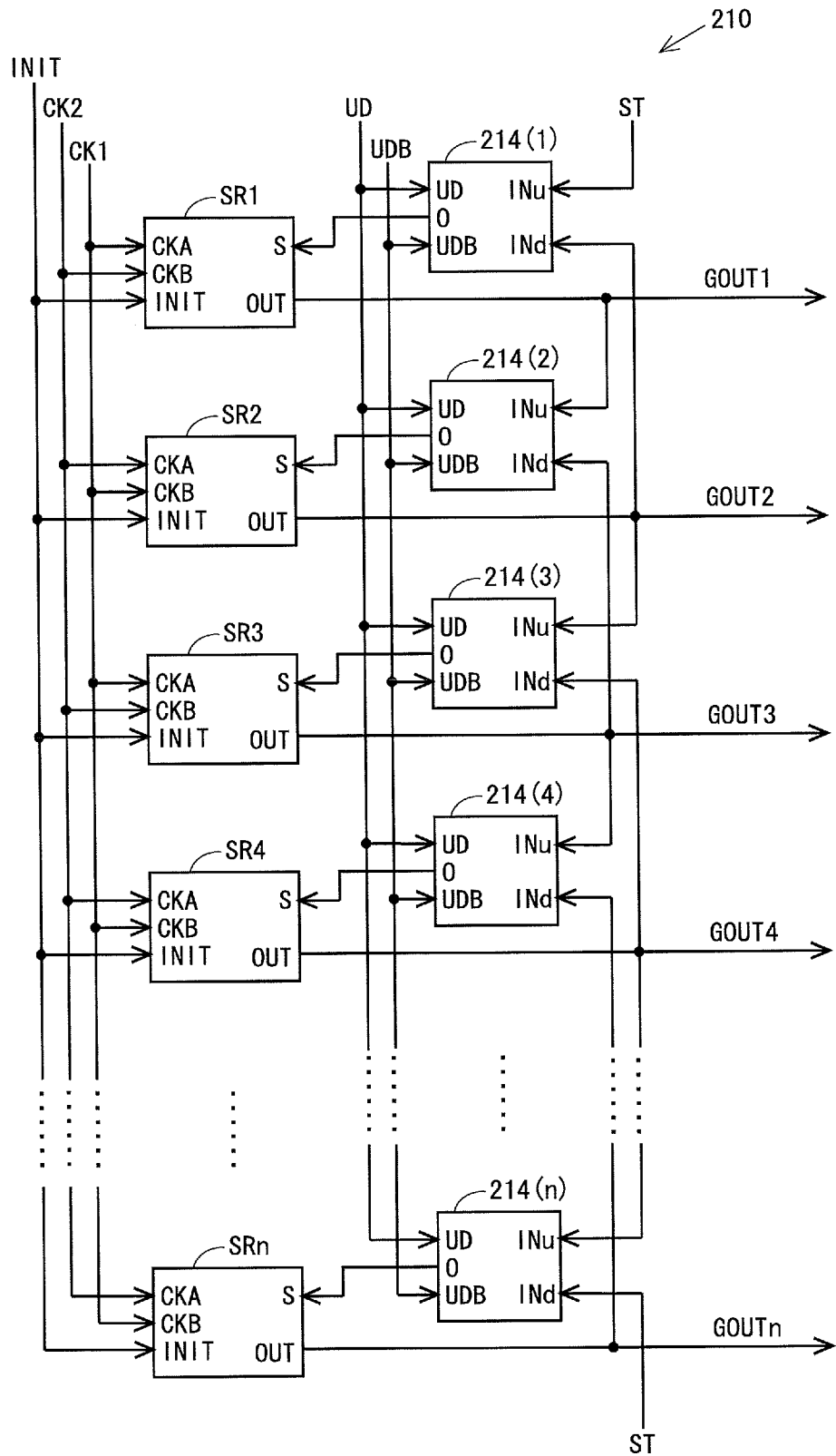
FIG. 12 is a block diagram showing a schematic configuration of a shift register circuit according to a fourth embodiment of the present invention.

4.1 Overall Configuration and Schematic Configuration of Shift Register Circuit A fourth embodiment of the present invention will be described. An overall configuration is the same as that in the first embodiment, and shall not be described (see FIG. 2). FIG. 12 is a block diagram showing a schematic configuration of the shift register circuit 210 that constitutes the gate driver 200 according to this embodiment. The shift register circuit 210 according to this embodiment is provided with components for switching a shift direction between a forward direction (direction toward the n-th stage from the first stage) and a reverse direction (direction toward the first stage from the n-th stage). Specifically, the shift register circuit 210 according to this embodiment is provided with, in addition to the n unit circuits SR1 to SRn as described in the first embodiment, n shift-direction control circuits 214(1) to 214(n) respectively corresponding to the n unit circuits SR1 to SRn on a one-to-one basis. As shown in FIG. 12, each of the shift-direction control circuits 214 includes an input terminal for receiving a forward signal UD, an input terminal for receiving a reverse signal UDB, an input terminal for receiving a previous stage signal INu, an input terminal for receiving a next stage signal INd, and an output terminal for outputting an output signal O.

To the shift register circuit 210, a gate start pulse signal ST, two-phase gate clock signals (a first gate clock signal CK1 and a second gate clock signal CK2), the forward signal UD, the reverse signal UDB, and the initialization signal INIT are supplied as the gate control signal GCTL.

Signals supplied to input terminals of each of the shift-direction control circuits 214 of the shift register circuit 210 are as follows (see FIG. 12). To any stage, the output signal OUT outputted from a previous-stage unit circuit SR is supplied as the previous stage signal INu, and the output signal OUT outputted from a next-stage unit circuit SR is supplied as the next stage signal INd. However, to the first-stage shift-direction control circuit 214(1), the gate start pulse signal ST is supplied as the previous stage signal INu, and to the n-th-stage shift-direction control circuit 214(n), the gate start pulse signal ST is supplied as the next stage signal INd. The forward signal UD and the reverse signal UDB are commonly supplied to all of the stages. The output signal O is outputted from the output terminal of each of the shift-direction control circuits 214 of the shift register circuit 210. The output signal O outputted from the shift-direction control circuit 214 of any stage is supplied as the set signal S to the corresponding unit circuit SR.

Signals supplied to input terminals of each stage (each unit circuit SR) of the shift register circuit 210 areas follows (see FIG. 12). As for the odd-numbered stages, the first gate clock signal CK1 is supplied as the first clock CKA. As for the even-numbered stages, the second gate clock signal CK2 is supplied as the first clock CKA. It should be noted that the phase of the first gate clock signal CK1 and the phase of the second gate clock signal CK2 are displaced by 180 degrees. Further, to any stage, the output signal O outputted from a corresponding one of the shift-direction control circuits 214 is supplied as the set signal S. The initialization signal INIT is commonly supplied to all stages.

From the output terminal of each stage (each unit circuit SR) of the shift register circuit 210, the output signal OUT is outputted. The output signal OUT outputted from any stage (k-th stage, here) is supplied as a scanning signal GOUTk to a gate bus line GLk of a k-th line, as well as supplied as the previous stage signal INu to a (k+1)th-stage shift-direction control circuit 214(k+1), and as the next stage signal INd to a (k−1)th-stage shift-direction control circuit 214(k−1).

With the above described configuration, a pulse of the gate start pulse signal ST as the set signal S is supplied, in a state in which one of the forward signal UD and the reverse signal UDB is at the high-level, to the first-stage unit circuit SR1 and the n-th stage unit circuit SRn of the shift register circuit 210. At this time, if the forward signal UD is at the high-level, the output signal OUT outputted from each of the unit circuits SR is sequentially turned to the high-level in an order "from the first stage to the n-th stage". Further, if the reverse signal UDB is at the high-level, the output signal OUT outputted from each of the unit circuits SR is sequentially turned to the high-level in an order "from the n-th stage to the first stage". In this manner, the scanning signals GOUT that are sequentially turned to the high-level (active) for a predetermined period are supplied to the gate bus lines GL within the display unit 400.

It should be noted that, as for the configuration of the unit circuit SR according to this embodiment, the same configuration as that of the first embodiment or the second embodiment is employed. Therefore, the configuration of the unit circuit SR shall not be described.

4.2 Configuration of Shift-Direction Control Circuit

Figure 13:
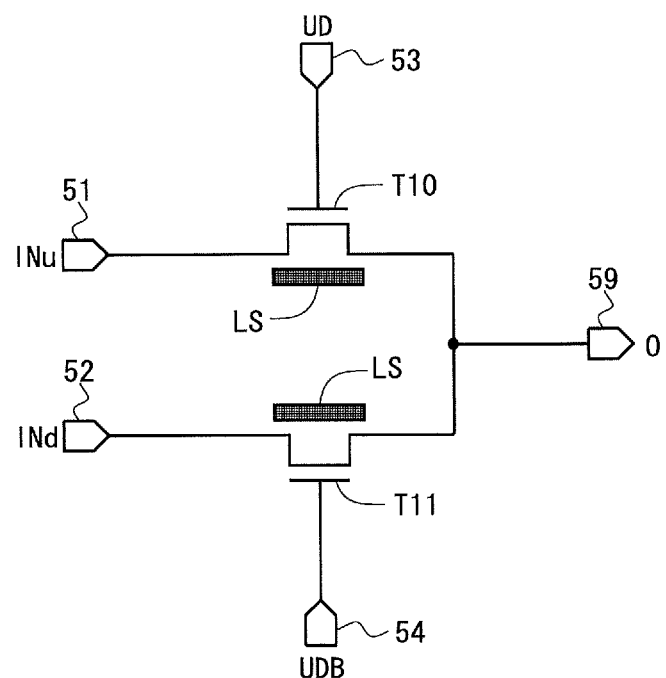
FIG. 13 is a circuit diagram showing a configuration of a shift-direction control circuit according to the fourth embodiment.
Figure 14:
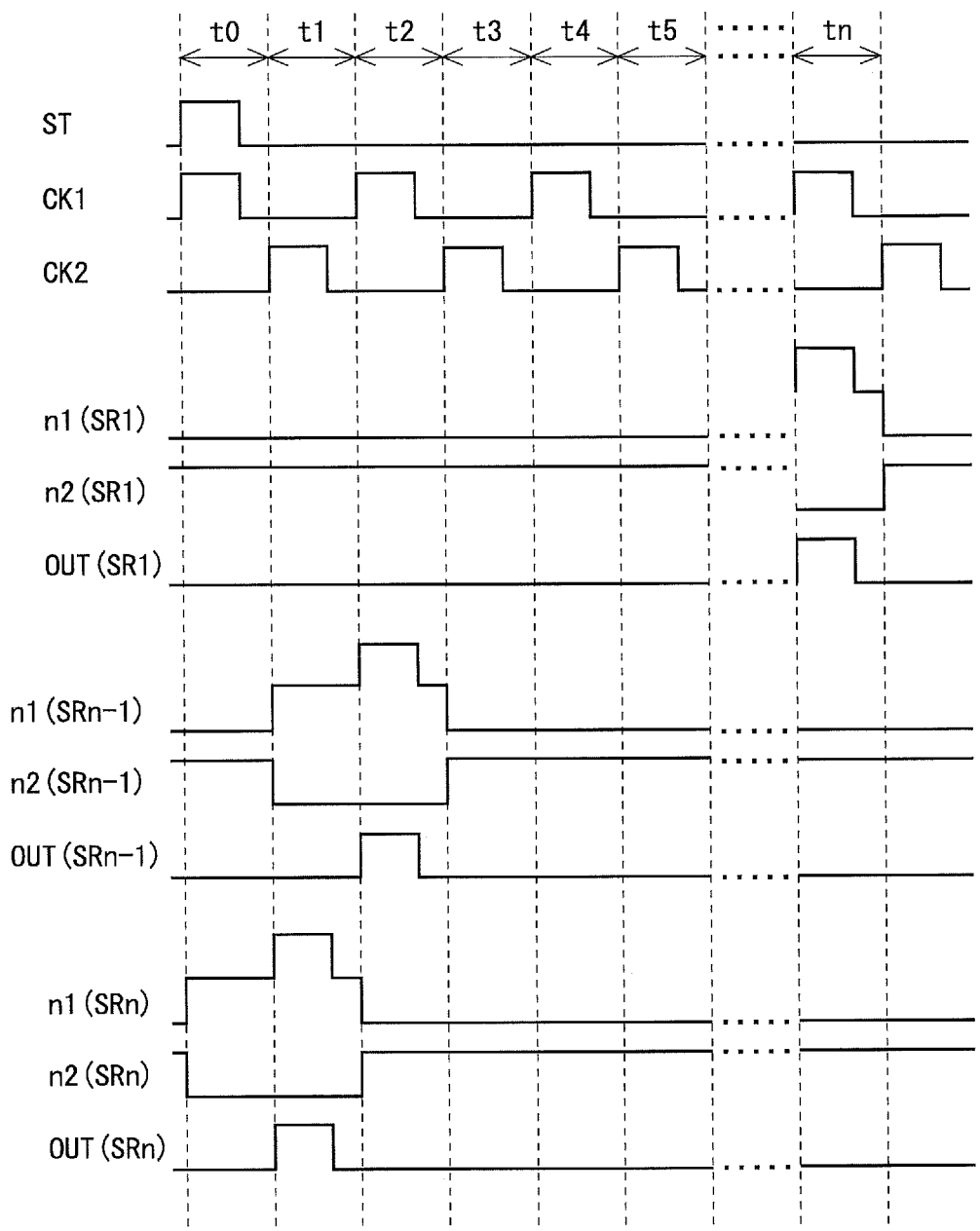
FIG. 14 is a signal waveform diagram for illustration of an operation of the shift register circuit according to the fourth embodiment.
Figure 15:
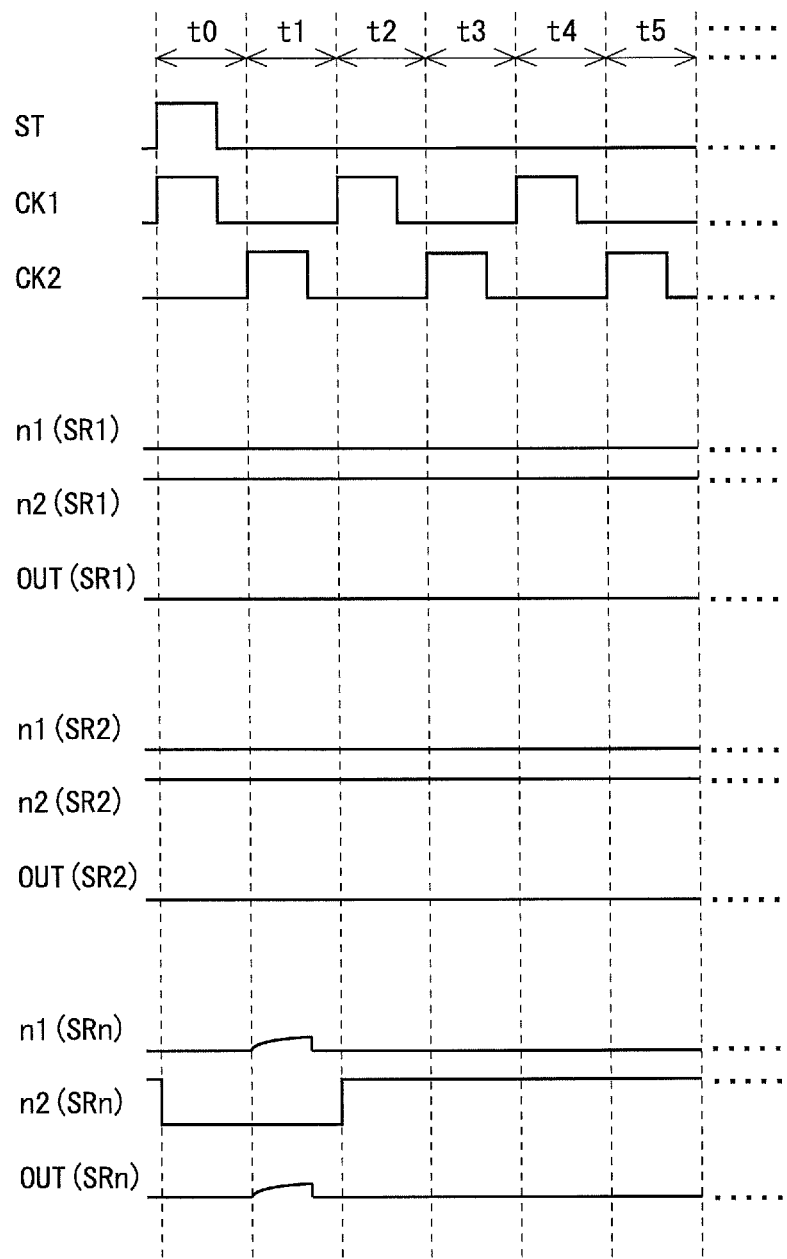
FIG. 15 is a signal waveform diagram for illustration of an operation that is concerned when a light shielding film is not provided for thin-film transistors T10 and T11 within the shift-direction control circuit illustrated in FIG. 13.

FIG. 13 is a circuit diagram showing a configuration of a shift-direction control circuit 214 according to this embodiment. The shift-direction control circuit 214 includes a thin-film transistor T10 and a thin-film transistor T11. Further, the shift-direction control circuit 214 includes four input terminals 51 to 54 and one output terminal 59. Here, the input terminal for receiving the previous stage signal INu is indicated by a reference symbol 51, the input terminal for receiving the next stage signal INd is indicated by a reference symbol 52, the input terminal for receiving the forward signal UD is indicated by a reference symbol 53, and the input terminal for receiving the reverse signal UDB is indicated by a reference symbol 54.

Regarding the thin-film transistor T10, a gate terminal is connected to the input terminal 53, a drain terminal is connected to the input terminal 51, and a source terminal is connected to the output terminal 59. Regarding the thin-film transistor T11, a gate terminal is connected to the input terminal 54, a drain terminal is connected to the input terminal 52, and a source terminal is connected to the output terminal 59. The light shielding film LS is provided for the thin-film transistors T10 and T11.

With the above described configuration, if the forward signal UD is at the high-level and the reverse signal UDB is at the low-level, the thin-film transistor T10 is in the on-state and the thin-film transistor T11 is in the off-state. With this, the previous stage signal INu is outputted as the output signal O from the output terminal 59. On the other hand, if the forward signal UD is at the low-level and the reverse signal UDB is at the high-level, the thin-film transistor T10 is in the off-state and the thin-film transistor T11 is in the on-state. With this, the next stage signal INd is outputted as the output signal O from the output terminal 59.

4.3 Operation of Shift Register Circuit

When the forward signal UD is set at the high-level and the reverse signal UDB is set at the low-level, the previous stage signal INu is outputted as the output signal O from the output terminal 59 of the shift-direction control circuit 214, as described above. Here, to the shift-direction control circuit 214 of each stage, the output signal OUT outputted from the previous-stage unit circuit SR is supplied as the previous stage signal INu. Further, the output signal O outputted from the shift-direction control circuit 214 of each stage is supplied as the set signal S to the corresponding unit circuit SR. As can be seen from the above, each of the unit circuits SR operates based on the output signal OUT outputted from the previous-stage unit circuit SR. Therefore, similarly to the first embodiment, in the shift register circuit 210, the output signal OUT outputted from each of the unit circuits SR is sequentially turned to the high-level in the order "from the first stage to the n-th stage" (see FIG. 5).

When the forward signal UD is set at the low-level and the reverse signal UDB is set at the high-level, the next stage signal INd is outputted as the output signal O from the output terminal 59 of the shift-direction control circuit 214, as described above. Here, to the shift-direction control circuit 214 of each stage, the output signal OUT outputted from the next-stage unit circuit SR is supplied as the next stage signal INd. Further, the output signal O outputted from the shift-direction control circuit 214 of each stage is supplied as the set signal S to the corresponding unit circuit SR. As can be seen from the above, each of the unit circuits SR operates based on the output signal OUT outputted from the next-stage unit circuit SR. Therefore, in the shift register circuit 210, the output signal OUT outputted from each of the unit circuits SR is sequentially turned to the high-level in the order "from the n-th stage to the first stage" (see FIG. 14).

4.4 Operation that is Concerned when a Light Shielding Film is Not Provided for Thin-Film Transistors T10 and T11

An operation that is concerned when the light shielding film LS is not provided for the thin-film transistors T10 and T11 will be described with reference to FIG. 5, FIG. 6, FIG. 13, and FIG. 15. As can be seen from FIG. 13, when the forward signal UD is set at the high-level, a high-level voltage is supplied to the gate terminal of the thin-film transistor T10. Specifically, a positive bias is supplied to the gate of the thin-film transistor T10 for an extended length of time. Accordingly, in the thin-film transistor T10, a threshold shift occurs due to an influence of external light. As a result, there is a case in which a value of the threshold voltage for the thin-film transistor T10 becomes higher than an original value. When the value of the threshold voltage of the thin-film transistor T10 increases, the thin-film transistor T10 cannot be easily turned to the on-state. In such a case, for example, in the first-stage shift-direction control circuit 214(1), even if the gate start pulse signal ST (the previous stage signal INu) rises in the period t0, the output signal O is maintained at the low-level by maintaining the thin-film transistor T10 in the off-state. Accordingly, in the period t0, in the first-stage unit circuit SR1, although the first node n1 should be pre-charged (c.f., FIG. 5), the potential at the first node n1 is maintained at the low-level (see the portion indicated by the reference symbol 60 in FIG. 6). Then, an increase of the potential at the first node n1 by bootstrap does not occur normally in the period t1 (see the portion indicated by the reference symbol 61 in FIG. 6), and a pulse of the output signal OUT is not normally outputted from the first-stage unit circuit SR (see the portion indicated by the reference symbol 62 in FIG. 6). Further, as the second-stage unit circuit SR2 is operated based on the output signal OUT outputted from the first-stage unit circuit SR1, a level of the pulse of the output signal OUT outputted from the second-stage unit circuit SR2 further decreases (see the portion indicated by the reference symbol 63 in FIG. 6). A waveform of the output signal OUT outputted from each of the unit circuits SR becomes abnormal in this manner, and thus malfunction is caused. When the reverse signal UDB is set at the high-level, the value of the threshold voltage of the thin-film transistor T11 increases, and the thin-film transistor T11 cannot be easily turned to the on-state. As a result, malfunction is caused similarly to the case in which the forward signal UD is set at the high-level (see FIG. 15).

In view of this point, in this embodiment, the light shielding film LS is provided for the thin-film transistors T10 and T11 that are n-channel type transistors whose gate terminals can be applied with a positive bias for an extended length of time. Accordingly, a threshold shift due to an influence of external light does not occur regarding the thin-film transistors T10 and T11. Therefore, the malfunction described above does not occur, and the gate bus lines GL1 to GLn within the display unit 400 are driven normally.

4.5 Effects

According to this embodiment, in the liquid crystal display device provided with the shift register circuit 210 capable of switching the shift direction, the light shielding film LS is provided for the thin-film transistors T10 and T11 in the shift-direction control circuit 214. Accordingly, even if a bias is supplied to the gate of the thin-film transistor T10 or the thin-film transistor T11, a threshold shift due to an influence of external light does not occur regarding the thin-film transistors T10 and T11. Therefore, it is possible to prevent occurrence of malfunction caused by a threshold shift of the thin-film transistors T10 and T11. From the above, also according to this embodiment, it is possible to achieve the shift register circuit 210 capable of preventing occurrence of malfunction caused by a threshold shift of a thin-film transistor due to an influence of external light, and capable of switching the shift direction.

4.6 Modified Example

While the fourth embodiment employs the configuration shown in FIG. 13 as the configuration of the shift-direction control circuit 214, the present invention is not limited to such an example. Thus, an example in which a configuration different from the configuration shown in FIG. 13 is employed will be described.

Figure 16:
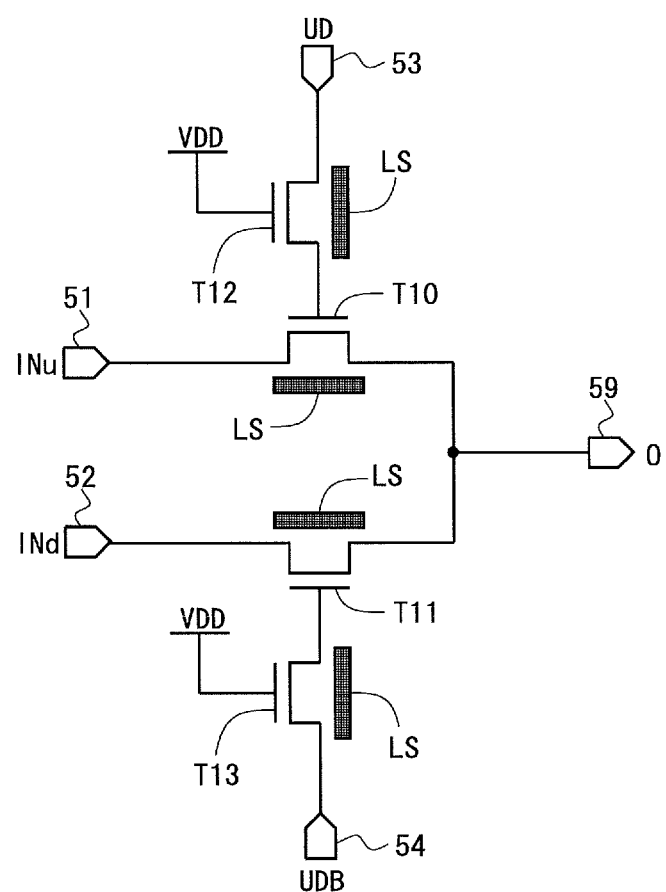
FIG. 16 is a circuit diagram showing a configuration of a shift-direction control circuit according to a modified example of the fourth embodiment.

FIG. 16 is a circuit diagram showing a configuration of the shift-direction control circuit 214 according to this modified example. The shift-direction control circuit 214 includes four thin-film transistors T10 to T13. Further, the shift-direction control circuit 214 also includes four input terminals 51 to 54 and one output terminal 59.

Regarding the thin-film transistor T10, a gate terminal is connected to a source terminal of the thin-film transistor T12, a drain terminal is connected to the input terminal 51, and a source terminal is connected to the output terminal 59. Regarding the thin-film transistor T11, a gate terminal is connected to a source terminal of the thin-film transistor T13, a drain terminal is connected to the input terminal 52, and a source terminal is connected to the output terminal 59. Regarding the thin-film transistor T12, a gate terminal is connected to the input terminal for the high-level supply voltage VDD, a drain terminal is connected to the input terminal 53, and the source terminal is connected to the gate terminal of the thin-film transistor T10. Regarding the thin-film transistor T13, a gate terminal is connected to the input terminal for the high-level supply voltage VDD, a drain terminal is connected to the input terminal 54, and the source terminal is connected to the gate terminal of the thin-film transistor T11. The light shielding film LS is provided for the thin-film transistors T10 to T13.

With the above described configuration, if the forward signal UD is at the high-level and the reverse signal UDB is at the low-level, similarly to the fourth embodiment, the previous stage signal INu is outputted as the output signal O from the output terminal 59. Therefore, in the shift register circuit 210, the output signal OUT outputted from each of the unit circuits SR is sequentially turned to the high-level in the order "from the first stage to the n-th stage" (see FIG. 5). On the other hand, if the forward signal UD is at the low-level and the reverse signal UDB is at the high-level, similarly to the fourth embodiment, the next stage signal INd is outputted as the output signal O from the output terminal 59. Therefore, in the shift register circuit 210, the output signal OUT outputted from each of the unit circuits SR is sequentially turned to the high-level in the order "from the n-th stage to the first stage" (see FIG. 14).

As described above, when the light shielding film LS is not provided for the thin-film transistor T10 and the thin-film transistor T11, a waveform of the output signal OUT outputted from each of the unit circuits SR becomes abnormal, and thus malfunction is caused. When the light shielding film LS is not provided for the thin-film transistor T12, the value of the threshold voltage of the thin-film transistor T12 increases, and the thin-film transistor T12 cannot be easily turned to the on-state. As a result, the thin-film transistor T12 is maintained in the off-state, and even if the forward signal UD is set at the high-level, the thin-film transistor T10 is also maintained in the off-state. With this, malfunction is caused. When the light shielding film LS is not provided for the thin-film transistor T13, malfunction is also caused in the same manner.

In view of this point, in this modified example, the light shielding film LS is provided for the thin-film transistors T10-T13. Accordingly, a threshold shift due to an influence of external light does not occur regarding the thin-film transistors T10 to T13. Therefore, the malfunction described above does not occur, and the gate bus lines GL1 to GLn within the display unit 400 are driven normally.

5. Fifth Embodiment

Figure 17:
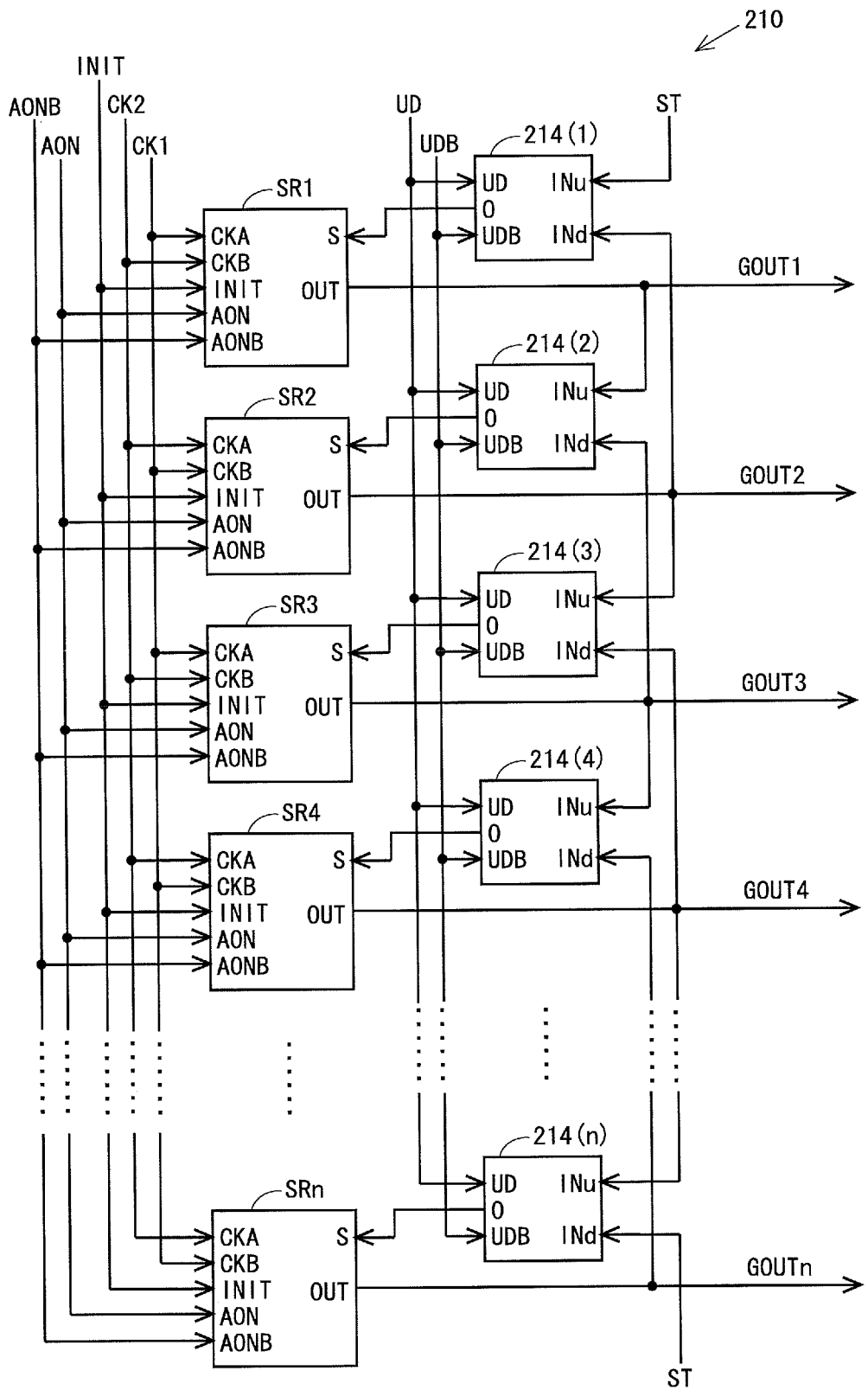
FIG. 17 is a block diagram showing a schematic configuration of a shift register circuit according to a fifth embodiment of the present invention.

5.1 Overall Configuration and Schematic Configuration of Shift Register Circuit A fifth embodiment of the present invention will be described. An overall configuration is the same as that in the first embodiment, and shall not be described (see FIG. 2). FIG. 17 is a block diagram showing a schematic configuration of the shift register circuit 210 that constitutes the gate driver 200 according to this embodiment. Similarly to the fourth embodiment, the shift register circuit 210 according to this embodiment is provided with components for switching a shift direction between a forward direction (direction toward the n-th stage from the first stage) and a reverse direction (direction toward the first stage from the n-th stage). Specifically, the shift register circuit 210 according to this embodiment is provided with the n unit circuits SR1 to SRn and the n shift-direction control circuits 214(1) to 214(n).

Meanwhile, in the liquid crystal display device, there is a case in which the display is not immediately cleared and an image like a residual image remains even after the power is turned off by a user. This is because when the device is turned off, a discharge path of an electric charge held in the pixel capacitance 46 (see FIG. 2) is blocked, and residual electric charges are accumulated within the pixel formation portion 4. Further, when the device is turned on in a state in which residual electric charges are accumulated within the pixel formation portion 4, deterioration of display quality such as an occurrence of a flicker caused by unevenness of impurity based on the residual electric charges may occur. Thus, in order to discharge residual electric charges in all of the pixel formation portions 4 when the power is on or off, for example, the gate driver 200 according to this embodiment is provided with a function for turning all of the gate bus lines GL1 to GLn to the selected state (active state) at once. In the following, this function is referred to as an "all-on function", for convenience.

In addition to the input terminals and the output terminal as in the fourth embodiment (see FIG. 12), each of the unit circuits SR includes an input terminal for receiving a first all-on control signal AON and an input terminal for receiving a second all-on control signal AONB as input terminals for all-on function. The first all-on control signal AON and the second all-on control signal AONB are supplied commonly to all stages.

The shift-direction control circuits 214(1) to 214(n) have the same configuration as those in the fourth embodiment.

Therefore, the light shielding film LS is provided for the thin-film transistors T10 and T11 within the shift-direction control circuit 214. It should be noted that as the configuration of the shift-direction control circuits 214(1) to 214(n), the same configuration as those of the modified example according to the fourth embodiment may be employed.

5.2 Configuration of Unit Circuit

Figure 18:
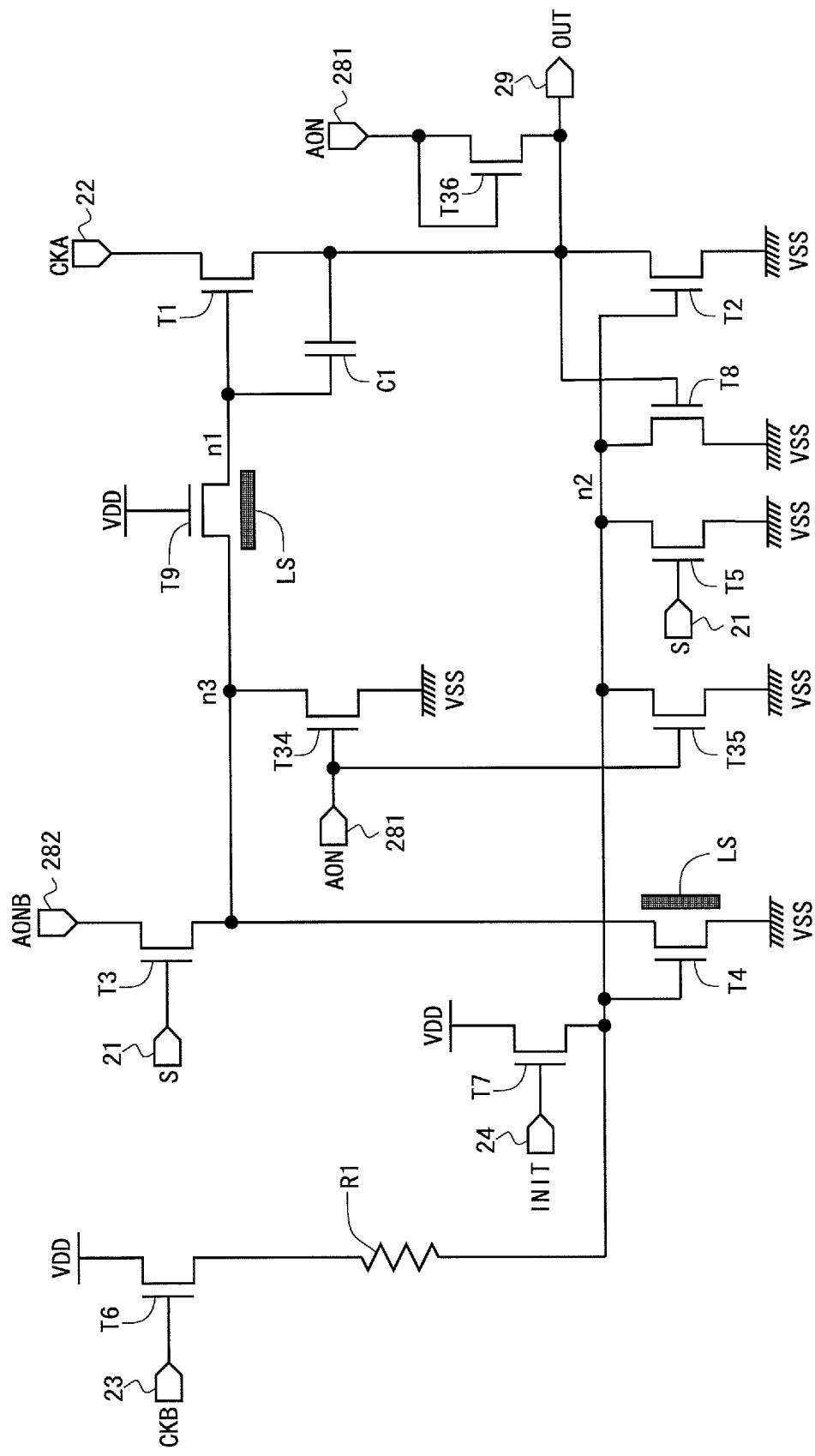
FIG. 18 is a circuit diagram showing a configuration of a unit circuit (configuration of a single stage of the shift register circuit) according to the fifth embodiment.

FIG. 18 is a circuit diagram showing a configuration of the unit circuit SR (configuration of a single stage of the shift register circuit 210) according to this embodiment. The unit circuit SR of this embodiment includes components for realizing the all-on function, in addition to the components provided in the first embodiment (see FIG. 1). Specifically, in addition to the components provided in the first embodiment, three thin-film transistors T34 to T36 and two input terminals 281 and 282 are provided. It should be noted that, the input terminal for receiving the first all-on control signal AON is indicated by a reference symbol 281, and the input terminal for receiving the second all-on control signal AONB is indicated by a reference symbol 282. Further, while the first all-on control signal AON is supplied to both of gate terminals of the thin-film transistors T34 and T35 and a gate terminal of the thin-film transistor T36, the input terminals 281 for the first all-on control signal AON are shown separately in FIG. 18, for convenience.

In this embodiment, the light shielding film LS is provided only for the thin-film transistor T4 and the thin-film transistor T9, out of the thin-film transistors T1 to T9 and T34 to T36 within the unit circuit SR.

As shown in FIG. 18, the source terminal of thin-film transistor T3, the drain terminal of the thin-film transistor T4, the drain terminal of the thin-film transistor T9, and a drain terminal of the thin-film transistor T34 are connected to each other. A region (wiring) where these are connected to each other is referred to as a "third node", for convenience. The third node is indicated by a reference symbol n3.

Regarding the thin-film transistor T34, a gate terminal is connected to the input terminal 281, the drain terminal is connected to the third node n3, and a source terminal is connected to the input terminal for the low-level supply voltage VSS. Regarding the thin-film transistor T35, a gate terminal is connected to the input terminal 281, a drain terminal is connected to the second node n2, and a source terminal is connected to the input terminal for the low-level supply voltage VSS. Regarding the thin-film transistor T36, a gate terminal and a drain terminal are connected to the input terminal 281 (that is, diode-connected), and a source terminal is connected to the output terminal 29. Further, unlike the first embodiment, the drain terminal of the thin-film transistor T3 is connected to the input terminal 282 in this embodiment.

It should be noted that in this embodiment, the thin-film transistor T3, the input terminal 21, and the input terminal 282 realize a first node turn-on portion, and the thin-film transistors T34 to T36 and the input terminal 281 realize an all-on control portion.

5.3 Operation of Shift Register Circuit

When the first all-on control signal AON is at the low-level and the second all-on control signal AONB is at high-level, the thin-film transistors T34 to T36 are in the off-state, and a high-level supply voltage is supplied to the drain terminal of the thin-film transistor T3. With this, the shift register circuit 210 operates in the same manner as in the fourth embodiment. Specifically, if the forward signal UD is set at the high-level, the output signal OUT outputted from each of the unit circuits SR is sequentially turned to the high-level in the order "from the first stage to the n-th stage" (see FIG. 5). If the reverse signal UDB is set at the high-level, the output signal OUT outputted from each of the unit circuits SR is sequentially turned to the high-level in the order "from the n-th stage to the first stage" (see FIG. 14).

When the first all-on control signal AON is at the high-level and the second all-on control signal AONB is at the low-level, the thin-film transistors T34 to T36 are in the on-state and a low-level supply voltage is supplied to the drain terminal of the thin-film transistor T3 in all of the unit circuits SR1 to SRn. By the thin-film transistor T34 being turned to the on-state, the potential at the first node n1 is led to the VSS potential. By the thin-film transistor T35 being turned to the on-state, the potential at the second node n2 is led to the VSS potential. With this, the thin-film transistor T1 and the thin-film transistor T2 become the off-state. By the thin-film transistor T36 being turned to the on-state in such a state, the output signals OUT outputted from all of the unit circuits SR1 to SRn are turned to the high-level. Specifically, the gate bus lines GL1 to GLn are turned to the selected state all at once.

5.4 Operation that is Concerned when a Light Shielding Film is Provided for the Thin-Film Transistor T2

Figure 19:
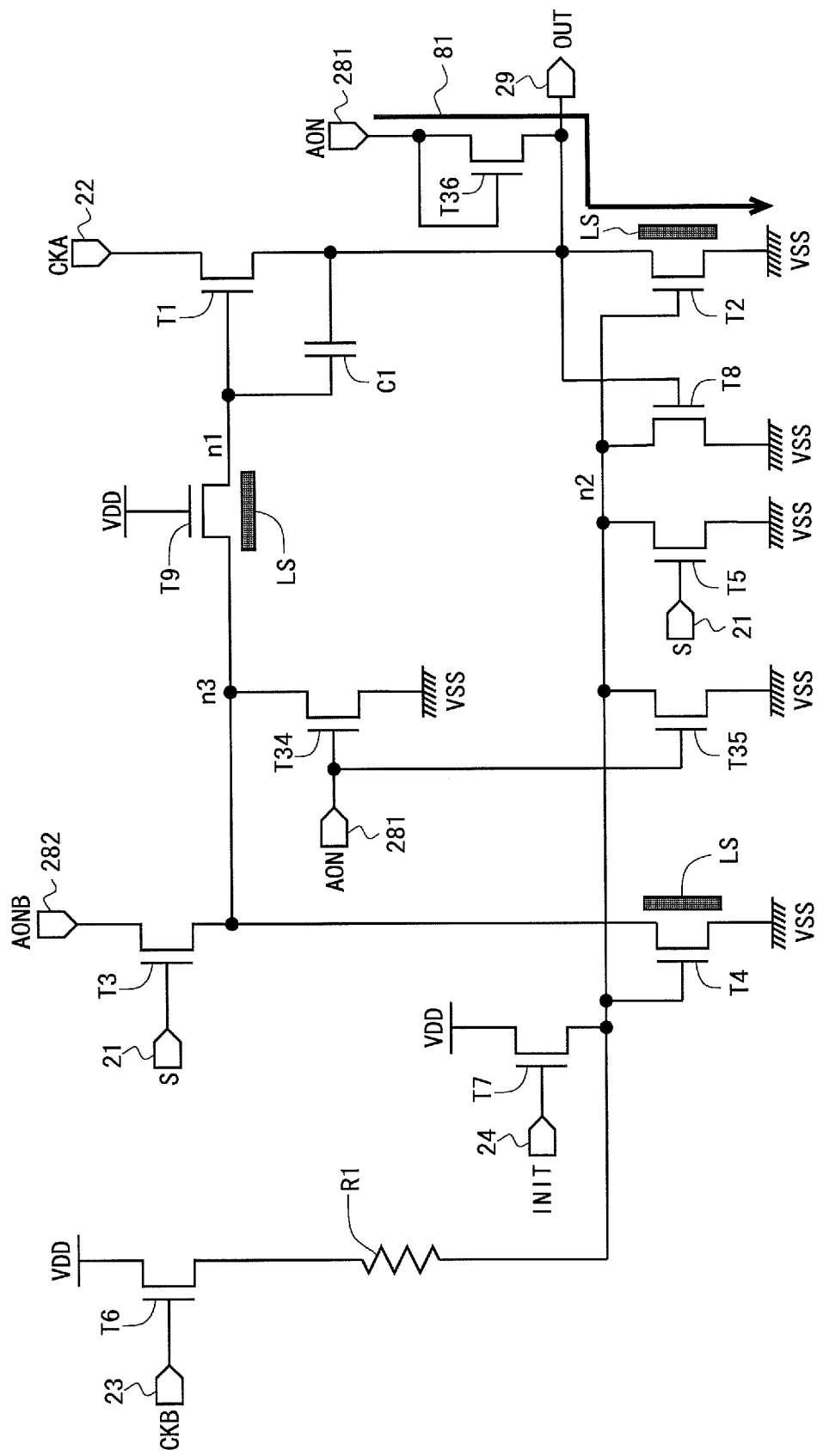
FIG. 19 is a diagram for illustration of an operation that is concerned when a light shielding film is provided for a thin-film transistor T2 within the unit circuit illustrated in FIG. 18.

As can be seen from FIG. 18, the thin-film transistor T2 is not provided with the light shielding film LS. Here, an operation that is concerned when the light shielding film LS is provided for the thin-film transistor T2 will be described with reference to FIG. 19. As described in Japanese Laid-Open Patent Publication No. 2004-4553, providing a light shielding film for a thin-film transistor may often increase off-leak in the thin-film transistor. If the light shielding film LS is provided for the thin-film transistor T2, there is a case in which off-leak in the thin-film transistor T2 increases. Based on such an assumption, when the first all-on control signal AON is set at the high-level, and the second all-on control signal AONB, the first gate clock signal CK1, the second gate clock signal CK2, and the gate start pulse signal ST are set at the low-level, the output signal OUT are at the high-level in all of the unit circuits SR. Here, if off-leak in the thin-film transistor T2 is increased, as an arrow indicated by a reference symbol 81 in FIG. 19, a high through current is produced between the input terminal 281 and the input terminal for the low-level supply voltage VSS via the thin-film transistor T36 and the thin-film transistor T2. Further, depending on the capacity of the power source, a part or all of the gate bus lines GL are often not turned to the selected state by a decrease of the supply voltage. From the above, when the all-on function is provided, there is a case in which providing the light shielding film LS for the thin-film transistor T2 can cause an adverse effect to the operation of the circuits.

In view of this point, in this embodiment, as the thin-film transistor T2 is not provided with the light shielding film LS, off-leak does not increase in the thin-film transistor T2. Therefore, the all-on function can be realized without any adverse effect to the operation of the circuits.

5.5 Effects

According to this embodiment, as the thin-film transistor T9 is provided with the light shielding film LS, it is possible to obtain the same effect as in the first embodiment. Further, as the thin-film transistor T4 is provided with the light shielding film LS, it is possible to obtain the same effect as in the second embodiment. Moreover, as the thin-film transistors T10 and T11 (see FIG. 13) are provided with the light shielding film LS, it is possible to obtain the same effect as in the fourth embodiment.

Furthermore, according to this embodiment, as the shift register circuit 210 is provided with the all-on function, it is possible to suppress deterioration of the display quality (such as occurrence of flickers) caused by residual electric charges within the pixel formation portion 4. Here, as the thin-film transistor T2 is not provided with the light shielding film LS in the circuit configuration shown in FIG. 18, off-leak does not increase in the thin-film transistor T2. Therefore, it is possible to realize the all-on function without causing malfunction.

From the above, according to this embodiment, it is possible to achieve the shift register circuit 210 capable of preventing occurrence of malfunction caused by a threshold shift of a thin-film transistor due to an influence of external light, as well as capable of switching the shift direction.

6. Sixth Embodiment

6.1 Overall Configuration and Schematic Configuration of Shift Register Circuit A sixth embodiment of the present invention will be described. An overall configuration is the same as that in the first embodiment, and shall not be described (see FIG. 2). Further, similarly to the first embodiment, the gate driver 200 is configured by the shift register circuit 210 including a plurality of stages (n stages) (see FIG. 3).

Figure 20:
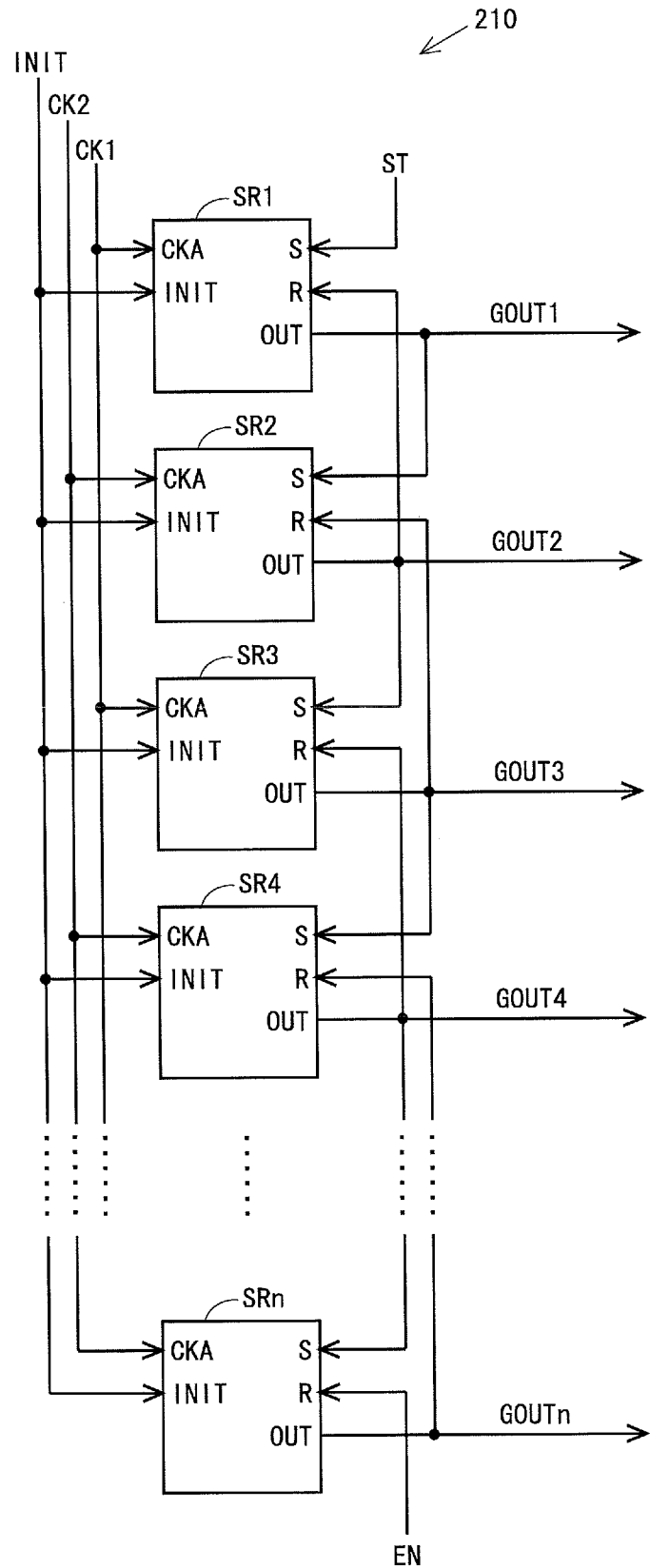
FIG. 20 is a block diagram showing a schematic configuration of a shift register circuit according to a sixth embodiment of the present invention.

FIG. 20 is a block diagram showing a schematic configuration of the shift register circuit 210 that constitutes the gate driver 200 according to this embodiment. As shown in FIG. 20, each of the unit circuits SR includes an input terminal for receiving the first clock CKA, an input terminal for receiving the initialization signal INIT, an input terminal for receiving the set signal S, an input terminal for receiving a reset signal R, and an output terminal for outputting the output signal OUT. To the shift register circuit 210, a gate start pulse signal ST, a gate end pulse signal EN, two-phase gate clock signals (a first gate clock signal CK1 and a second gate clock signal CK2), and an initialization signal INIT are supplied as the gate control signal GCTL.

Signals supplied to input terminals of each stage (each unit circuit SR) of the shift register circuit 210 areas follows (see FIG. 20). As for odd-numbered stages, the first gate clock signal CK1 is supplied as the first clock CKA. As for even-numbered stages, the second gate clock signal CK2 is supplied as the first clock CKA. It should be noted that a phase of the first gate clock signal CK1 and a phase of the second gate clock signal CK2 are displaced by 180 degrees. Further, to any stage, the output signal OUT outputted from a previous stage is supplied as the set signal S, and the output signal OUT outputted from a next stage is supplied as the reset signal R. However, to the first-stage unit circuit SR1, the gate start pulse signal ST is supplied as the set signal S, and to the n-th stage unit circuit SRn, the gate end pulse signal EN is supplied as the reset signal R. The initialization signal INIT is commonly supplied to all stages.

From an output terminal of each stage (each unit circuit SR) of the shift register circuit 210, the output signal OUT is outputted. The output signal OUT outputted from any stage (k-th stage, here) is supplied as the scanning signal GOUTk to the gate bus line GLk of the k-th line, as well as supplied as the set signal S to the (k+1)th-stage unit circuit SRk+1, and supplied as the reset signal R to the (k−1)th-stage unit circuit SRk−1.

With the above described configuration, when a pulse of the gate start pulse signal ST as the set signal S is supplied to the first-stage unit circuit SR1 of the shift register circuit 210, similarly to the first embodiment, the output signal OUT outputted from each of the unit circuits SR is sequentially turned to the high-level. With this, scanning signals GOUT1 to GOUTn that are sequentially turned to the high-level (active) for a predetermined period are supplied to the gate bus lines GL1 to GLn within the display unit 400.

6.2 Configuration of Unit Circuit

Figure 21:
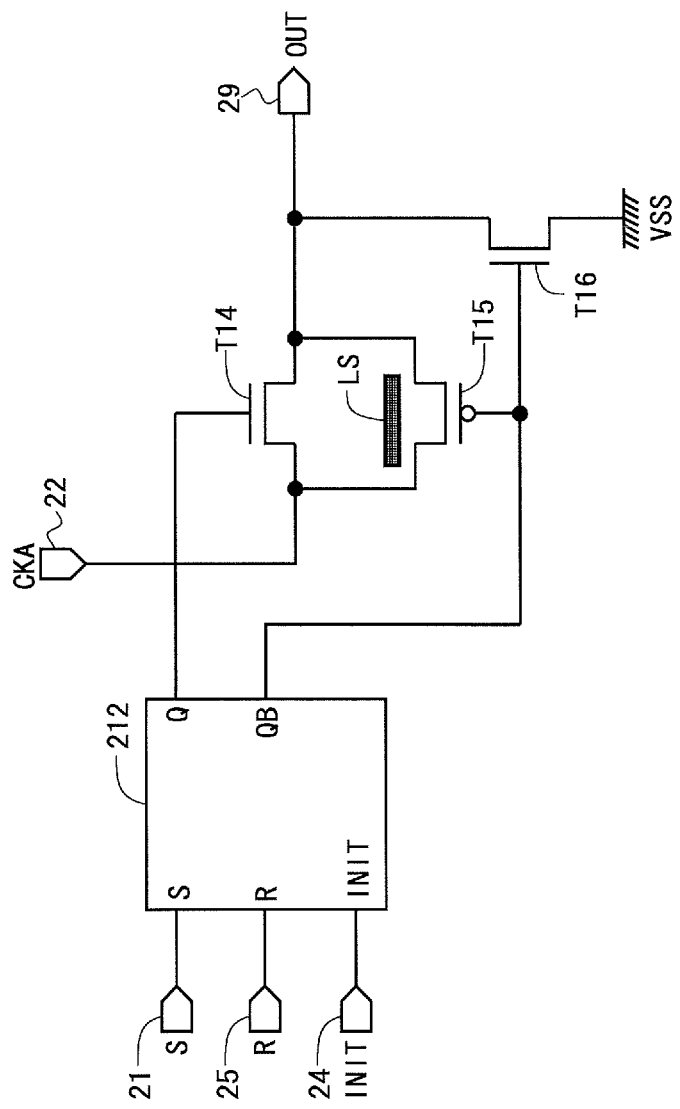
FIG. 21 is a circuit diagram showing a configuration of a unit circuit (configuration of a single stage of the shift register circuit) according to the sixth embodiment.

FIG. 21 is a circuit diagram showing a configuration of the unit circuit SR (configuration of a single stage of the shift register circuit 210) according to this embodiment. As shown in FIG. 21, the unit circuit SR includes three thin-film transistors T14 to T16 and a single RS flip-flop circuit 212. The unit circuit SR further includes four input terminals 21, 22, 24, and 25 and a single output terminal (output node) 29, in addition to the input terminal for the low-level supply voltage VSS. Here, the input terminal for receiving the set signal S is indicated by a reference symbol 21, the input terminal for receiving the first clock CKA is indicated by a reference symbol 22, the input terminal for receiving the initialization signal INIT is indicated by a reference symbol 24, and the input terminal for receiving the reset signal R is indicated by a reference symbol 25. It should be noted that the thin-film transistors T14 and T16 are of an n-channel type, and the thin-film transistor T15 is of a p-channel type.

The RS flip-flop circuit 212 includes an input terminal for receiving the set signal S, an input terminal for receiving the reset signal R, an input terminal for receiving the initialization signal INIT, an output terminal for outputting an output signal Q, and an output terminal for outputting an output signal QB. In this embodiment, the output signal Q realizes a first output signal, and the output signal QB realizes a second output signal. Since a known configuration may be employed as an internal configuration of the RS flip-flop circuit 212, a description shall be omitted. It should be noted that the RS flip-flop circuit 212 also includes a thin-film transistor.

Figure 22:
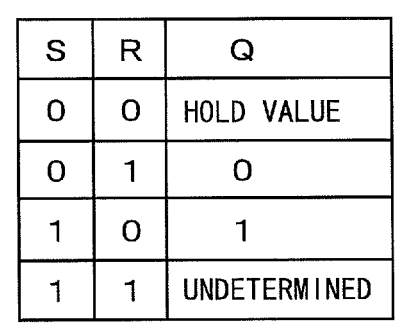

FIG. 22 is a diagram showing a truth table of the RS flip-flop circuit 212. As shown in FIG. 22, regarding the RS flip-flop circuit 212, a value (logical value) of the output signal Q changes depending on a value (logical value) of the set signal S and a value (logical value) of the reset signal R. It should be noted that here, a logical value "0" corresponds to the low-level, and a logical value "1" corresponds to the high-level. When the value of the set signal S is 0 and the value of the reset signal R is 0, the value of the output signal Q is held unchanged. When the value of the set signal S is 0 and the value of the reset signal R is 1, the value of the output signal Q is 0. When the value of the set signal S is 1 and the value of the reset signal R is 0, the value of the output signal Q is 1. When the value of the set signal S is 1 and the value of the reset signal R is 1, the value of the output signal Q is undetermined. It should be noted that, the value of the output signal QB is an inverted value of the value of the output signal Q. Specifically, when the value of the output signal Q is 1, the value of the output signal QB is 0, and when the value of the output signal Q is 0, the value of the output signal QB is 1.

It should be noted that the initialization signal INIT is used for initialization of the RS flip-flop circuit 212. However, the initialization of the RS flip-flop circuit 212 is not directly related to the present invention, and shall not be described.

In this embodiment, the light shielding film LS is provided only for the thin-film transistor T15 out of the three thin-film transistors T14 to T16 and the thin-film transistor within the RS flip-flop circuit 212. The light shielding film LS is not provided for thin-film transistors other than the thin-film transistor T15.

Next, a relationship of connection between components within the unit circuit SR will be described. Regarding the thin-film transistor T14, a gate terminal is connected to an output terminal for the output signal Q of the RS flip-flop circuit 212, a drain terminal is connected to the input terminal 22, and a source terminal is connected to the output terminal 29. Regarding the thin-film transistor T15, a gate terminal is connected to an output terminal for the output signal QB of the RS flip-flop circuit 212, a drain terminal is connected to the input terminal 22, and a source terminal is connected to the output terminal 29. Regarding the thin-film transistor T16, a gate terminal is connected to the output terminal for the output signal QB of the RS flip-flop circuit 212, a drain terminal is connected to the output terminal 29, and a source terminal is connected to the input terminal for the low-level supply voltage VSS.

It should be noted that in this embodiment, the thin-film transistor T14 realizes a first output control transistor, the thin-film transistor T15 realizes a second output control transistor, and the thin-film transistor T16 realizes an output node turn-off transistor.

6.3 Operation of Shift Register Circuit

Figure 23:
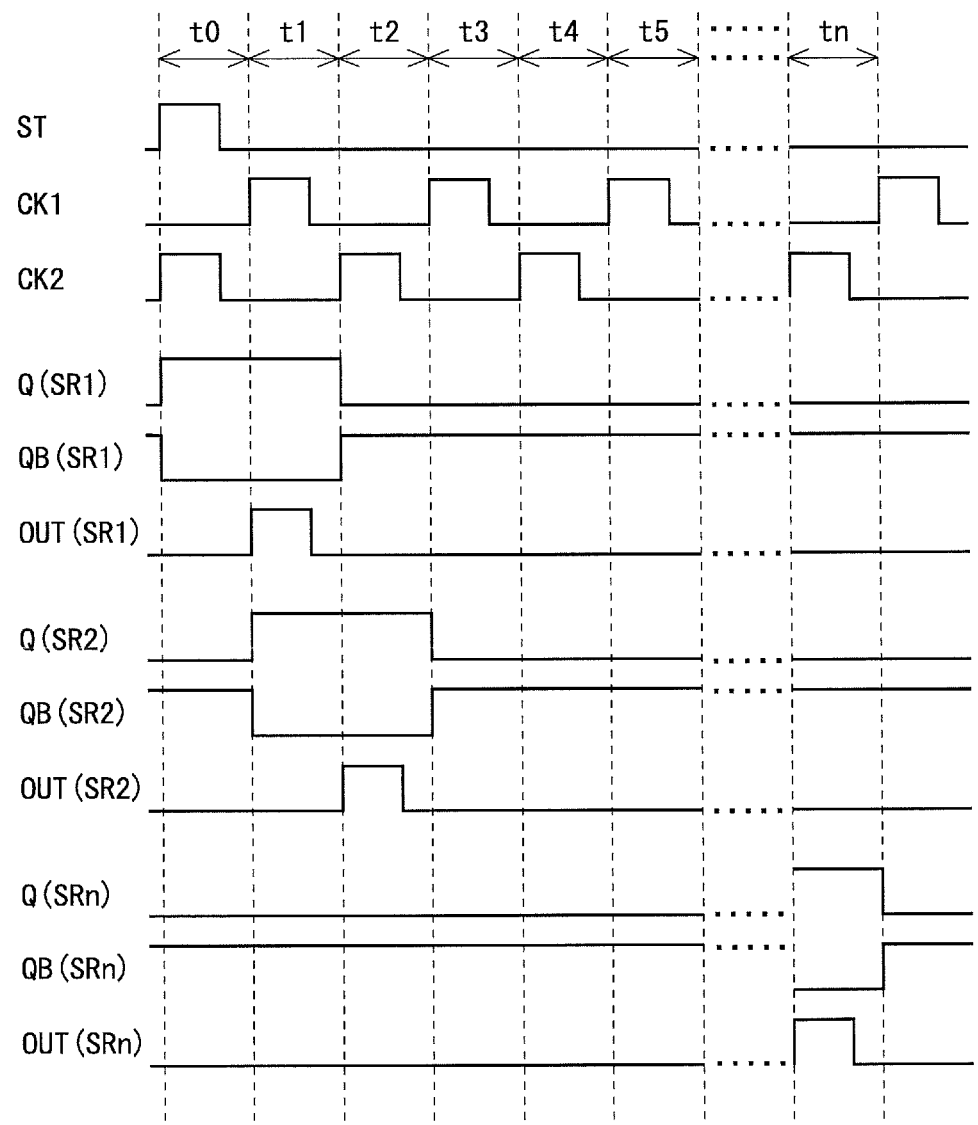
FIG. 23 is a signal waveform diagram for illustration of an operation of the shift register circuit according to the sixth embodiment.

Next, an operation of the shift register circuit 210 according to this embodiment will be described with reference to FIG. 20, FIG. 21, and FIG. 23. FIG. 23 is a signal waveform diagram for illustration of the operation of the shift register circuit 210 according to this embodiment. It should be noted that, regarding FIG. 23, "QB(SR2)" means "the output signal QB of the second-stage unit circuit SR2", for example.

In a period before the period t0, in all of the unit circuits SR, the output signal Q outputted from the RS flip-flop circuit 212 is at the low-level, the output signal QB outputted from the RS flip-flop circuit 212 is at the high-level, and the output signal OUT is at the low-level.

First, an attention is paid to the first-stage unit circuit SR1. In the period t0, a pulse of the gate start pulse signal ST is outputted. As the gate start pulse signal ST is supplied as the set signal S to the first-stage unit circuit SR1. Further, to the first-stage unit circuit SR1, the output signal OUT outputted from the second-stage unit circuit SR2 is supplied as the reset signal R. As the value of the set signal S is 1 and the value of the reset signal R is 0, the output signal Q is at the high-level and the output signal QB is at the low-level in the period t0. With this, the thin-film transistors T14 and T15 are in the on-state, and the thin-film transistor T16 is in the off-state. At this time, the first gate clock signal CK1 supplied as the first clock CKA to the first-stage unit circuit SR1 is at the low-level. Therefore, in the period t0, the output signal OUT is maintained at the low-level.

In the period t1, as the value of the set signal S (the gate start pulse signal ST) is 0 and the value of the reset signal R (the output signal OUT outputted from the second-stage unit circuit SR2) is 0, the output signal Q is maintained at the high-level, and the output signal QB is maintained at the low-level. Therefore, the thin-film transistors T14 and T15 are maintained in the on-state, and the thin-film transistor T16 is maintained in the off-state. Further, in the period t1, the first gate clock signal CK1 changes from the low-level to the high-level. With this, the output signal OUT is turned to the high-level. In this manner, the gate bus line GL1 connected to the output terminal 29 of the first-stage unit circuit SR1 becomes the selected state. It should be noted that, in the period t1, as the thin-film transistor T16 is maintained in the off-state, the potential of the output signal OUT does not decrease.

In the period t2, in the second-stage unit circuit SR2, the output signal OUT is turned to the high-level, in the same manner as in the first-stage unit circuit SR1 in the period t1. The output signal OUT outputted from the second-stage unit circuit SR2 is supplied as the reset signal R to the first-stage unit circuit SR1. Therefore, in the period t2, in the first-stage unit circuit SR1, the value of the set signal S is 0 and the value of the reset signal R is 1. Therefore, the output signal Q is turned to the low-level, and the output signal QB is turned to the high-level. With this, the thin-film transistors T14 and T15 become the off-state, and the thin-film transistor T16 becomes the on-state. By the thin-film transistor T16 being turned to the on-state in this manner, the potential of the output signal OUT is led to the VSS potential.

In the period t3 and thereafter, in the first-stage unit circuit SR1, as the value of the set signal S is maintained at 0 and the value of the reset signal R is maintained at 0, the output signal Q is maintained at the low-level and the output signal QB is maintained at the high-level. Accordingly, the thin-film transistors T14 and T15 are maintained in the off-state, and the thin-film transistor T16 is maintained in the on-state. Therefore, the potential of the output signal OUT is also maintained at the low-level in a period in which the first gate clock signal CK1 is turned to the high-level.

Next, an attention is paid to the second-stage unit circuit SR2. To the second-stage unit circuit SR2, the output signal OUT outputted from the first-stage unit circuit SR1 is supplied as the set signal S. Therefore, in the second-stage unit circuit SR2, in the period t1, the value of the set signal S is 1 and the value of the reset signal R is 0. With this, in the same manner as in the first-stage unit circuit SR1 in the period t0, the thin-film transistors T14 and T15 become the on-state and the thin-film transistor T16 becomes the off-state. At this time, the second gate clock signal CK2 supplied as the first clock CKA to the second-stage unit circuit SR2 is at the low-level. Therefore, in the period t1, the output signal OUT is maintained at the low-level. Then, in the period t2, the output signal OUT is turned to the high-level, in the same manner as in the first-stage unit circuit SR1 in the period t1. In this manner, the gate bus line GL2 connected to the output terminal 29 of the second-stage unit circuit SR2 becomes the selected state. Further, in the period t3, in the same manner as the first-stage unit circuit SR1 in the period t2, by the thin-film transistor T16 being turned to the on-state, the potential of the output signal OUT is led to the VSS potential. Moreover, in the period t4 and thereafter, in the same manner as the first-stage unit circuit SR1 in the period t3 and thereafter, the potential of the output signal OUT is maintained at the low-level also in a period in which the second gate clock signal CK2 is at the high-level. The same operation is performed for the unit circuits SR3 to SRn of the third stage to the n-th stage.

As described above, the output signals OUT1 to OUTn that are sequentially turned to the high-level by a predetermined period are outputted from the n unit circuits SR1 to SRn that constitute the shift register circuit 210, and the output signals OUT1 to OUTn are supplied as the scanning signals GOUT1 to GOUTn to the gate bus lines GL1 to GLn within the display unit 400.

6.4 Operation that is Concerned when a Light Shielding Film is Not Provided for Thin-Film Transistor T15

Figure 24:
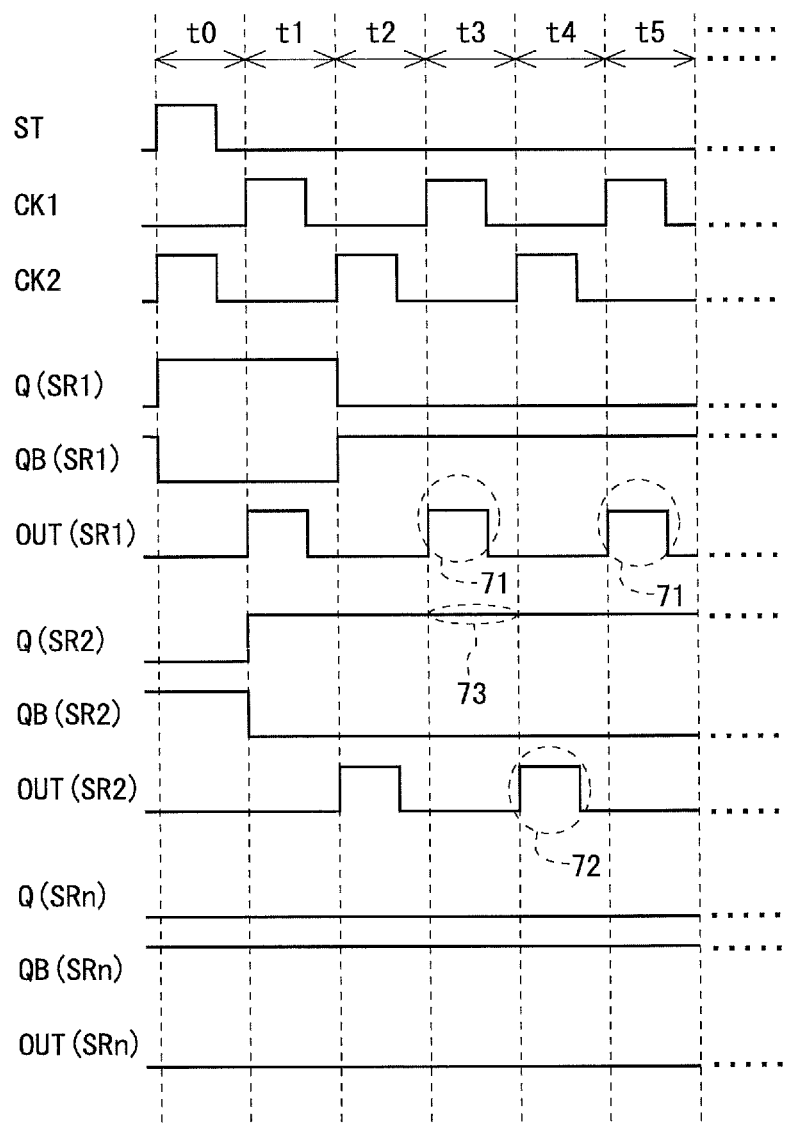
FIG. 24 is a signal waveform diagram for illustration of an operation that is concerned when a light shielding film is not provided for a thin-film transistor T15 within the unit circuit illustrated in FIG. 23.

Next, an operation that is concerned when the light shielding film LS is not provided for the thin-film transistor T15 will be described with reference to FIG. 21, FIG. 23, and FIG. 24. As can be seen from FIG. 23, in each of the unit circuits SR, the output signal QB is at the low-level only during a period in which a pulse of the set signal S is supplied and a period in which a high-level output signal OUT is outputted. For example, in the first-stage unit circuit SR1, the output signal QB is at the low-level only during the period t0 and the period t1, and the output signal QB is maintained at the high-level during other periods. Here, as shown in FIG. 21, the output signal QB is supplied to the gate terminal of the thin-film transistor T15. Therefore, a negative bias is supplied to the gate of the thin-film transistor T15 for an extended length of time. Accordingly, in the thin-film transistor T15, a threshold shift occurs due to an influence of external light. As a result, there is a case in which a value of the threshold voltage for the thin-film transistor T15 becomes lower than the original value. When the value of the threshold voltage of the thin-film transistor T15 decreases, the thin-film transistor T15 can be easily turned to the on-state. In such a case, for example, in the first-stage unit circuit SR1, in the period t2 and thereafter, the thin-film transistor T15 is maintained in the on-state, even though the output signal QB is at the high-level. Further, in the period t2 and thereafter, as the output signal QB is at the high-level, the thin-film transistor T16 is also maintained in the on-state. From the above, when the first gate clock signal CK1 (the first clock CKA) changes from the low-level to the high-level in the period t3, a through current is produced between the input terminal 22 and the input terminal for the low-level supply voltage VSS via the thin-film transistor T15 and the thin-film transistor T16. Moreover, if a discharge capacity of the thin-film transistor T16 is not sufficient, a pulse of the output signal OUT is produced (see a portion indicated by a reference symbol 71 in FIG. 24). Also in the unit circuits SR2 to SRn of the second stage and thereafter, similarly to the first-stage unit circuit SR1, a through current may be produced, and a pulse of the output signal OUT may be produced during a period in which the output signal OUT should be maintained at the low-level (see a portion indicated by a reference symbol 72 in FIG. 24). Further, to each of the unit circuits SR, the output signal OUT from a previous stage is supplied as the set signal S, and the output signal OUT from a next stage is supplied as the reset signal R. Accordingly, when an above-described abnormal pulse of the output signal OUT is outputted from the unit circuit SR of one stage, there is a case in which both of the value of the set signal S and the value of the reset signal R can become 1 depending on the unit circuit SR. In such a case, the values of the output signal Q and the output signal QB outputted from the RS flip-flop circuit 212 within the unit circuit SR is undetermined. With this, for example, in the second-stage unit circuit SR2, even though the output signal Q should change from the high-level to the low-level in the period t3, the output signal Q is maintained at the high-level (see a portion indicated by a reference symbol 73 in FIG. 24). In this manner, malfunction is caused.

In view of this point, in this embodiment, the light shielding film LS is provided for the thin-film transistor T15 that is a p-channel type transistor whose gate terminal is applied with a negative bias for an extended length of time. Accordingly, a threshold shift due to an influence of external light does not occur regarding the thin-film transistor T15. Therefore, the malfunction described above does not occur, and the gate bus lines GL1 to GLn within the display unit 400 are driven normally. Further, a through current is not produced between the input terminal 22 and the input terminal for the low-level supply voltage VSS.

6.5 Effect

According to this embodiment, in the liquid crystal display device in which each stage (each unit circuit SR) of the shift register circuit 210 within the gate driver 200 is configured as shown in FIG. 21, the light shielding film LS is provided for the thin-film transistor T15 in each of the unit circuits SR. Accordingly, even though a bias is supplied to the gate of the thin-film transistor T15 for an extended length of time, a threshold shift due to an influence of external light does not occur regarding the thin-film transistor T15. Therefore, it is possible to prevent occurrence of malfunction caused by a threshold shift of the thin-film transistor T15 and occurrence of a through current. From the above, according to this embodiment, it is possible to achieve the shift register circuit 210 capable of preventing occurrence of malfunction caused by a threshold shift of a thin-film transistor due to an influence of external light as well as occurrence of a through current.

7. Seventh Embodiment

Figure 25:
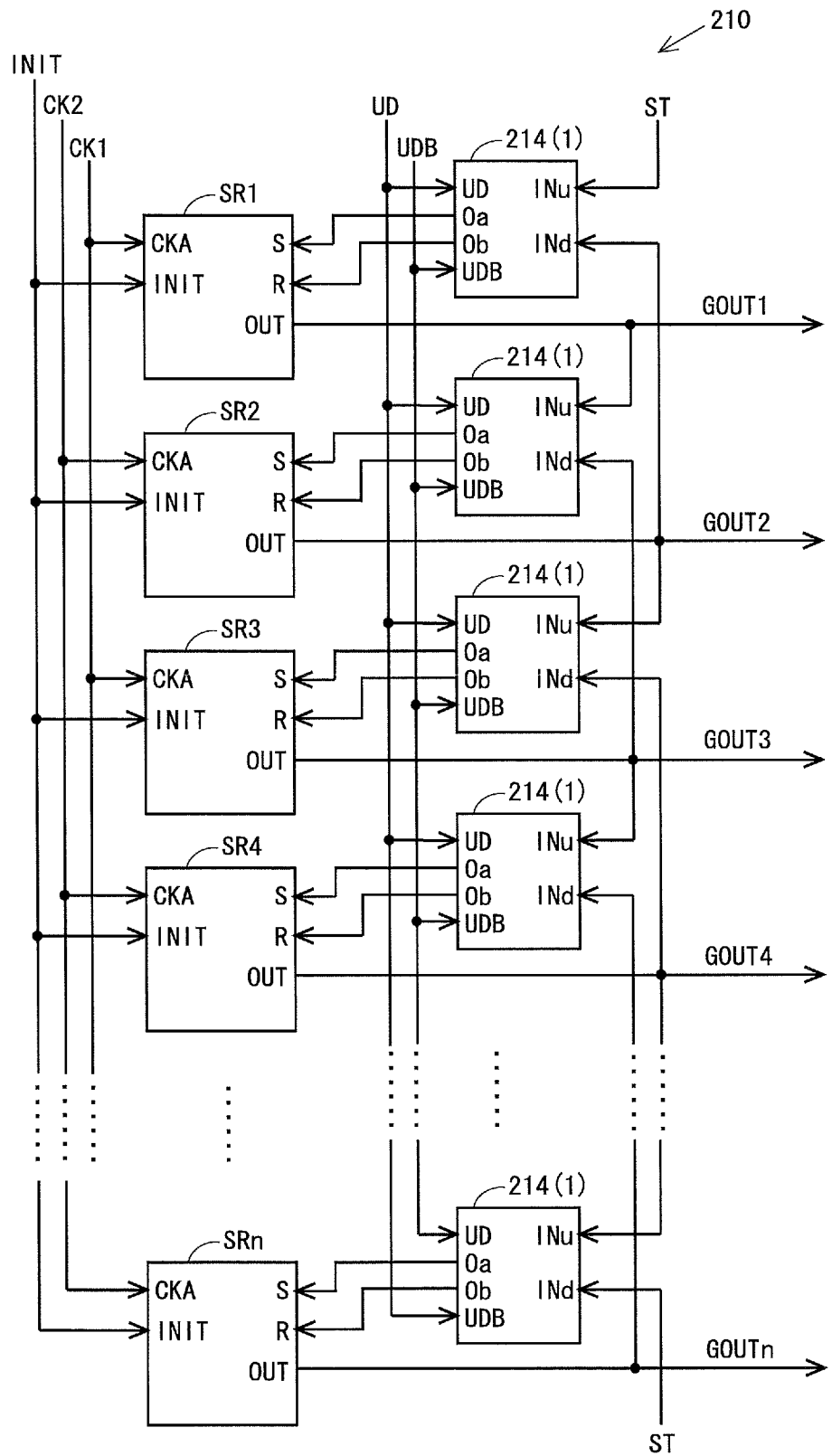
FIG. 25 is a block diagram showing a schematic configuration of a shift register circuit according to a seventh embodiment of the present invention.

7.1 Overall Configuration and Schematic Configuration of Shift Register Circuit A seventh embodiment of the present invention will be described. An overall configuration is the same as that in the first embodiment, and shall not be described (see FIG. 2). FIG. 25 is a block diagram showing a schematic configuration of the shift register circuit 210 that constitutes the gate driver 200 according to this embodiment. The shift register circuit 210 according to this embodiment is provided with components for switching a shift direction between a forward direction (direction toward the n-th stage from the first stage) and a reverse direction (direction toward the first stage from the n-th stage). Specifically, the shift register circuit 210 according to this embodiment is provided with, in addition to the n unit circuits SR1 to SRn as described in the sixth embodiment, n shift-direction control circuits 214 (1) to 214(n) respectively corresponding to the n unit circuits SR1 to SRn on a one-to-one basis. As shown in FIG. 25, each of the shift-direction control circuits 214 includes an input terminal for receiving a forward signal UD, an input terminal for receiving a reverse signal UDB, an input terminal for receiving a previous stage signal INu, an input terminal for receiving a next stage signal INd, an output terminal for outputting an output signal Oa, and an output terminal for outputting an output signal Ob.

To the shift register circuit 210, a gate start pulse signal ST, two-phase gate clock signals (a first gate clock signal CK1 and a second gate clock signal CK2), the forward signal UD, the reverse signal UDB, and the initialization signal INIT are supplied as the gate control signal GCTL.

Signals supplied to input terminals of each of the shift-direction control circuits 214 of the shift register circuit 210 are as follows (see FIG. 25). To any stage, the output signal OUT outputted from a previous-stage unit circuit SR is supplied as the previous stage signal INu, and the output signal OUT outputted from a next-stage unit circuit SR is supplied as the next stage signal INd. However, to the first-stage shift-direction control circuit 214(1), the gate start pulse signal ST is supplied as the previous stage signal INu, and to the n-th-stage shift-direction control circuit 214(n), the gate start pulse signal ST is supplied as the next stage signal INd. The forward signal UD and the reverse signal UDB are commonly supplied to all of the stages. The output signals Oa and Ob are outputted from each of the shift-direction control circuits 214 of the shift register circuit 210. The output signal Oa outputted from the shift-direction control circuit 214 of any stage is supplied as the set signal S to the corresponding unit circuit SR. The output signal Ob outputted from the shift-direction control circuit 214 of any stage is supplied as the reset signal R to the corresponding unit circuit SR.

Signals supplied to input terminals of each stage (each unit circuit SR) of the shift register circuit 210 areas follows (see FIG. 25). As for the odd-numbered stages, the first gate clock signal CK1 is supplied as the first clock CKA. As for the even-numbered stages, the second gate clock signal CK2 is supplied as the first clock CKA. It should be noted that the phase of the first gate clock signal CK1 and the phase of the second gate clock signal CK2 are displaced by 180 degrees. Further, to any stage, the output signal Oa outputted from a corresponding one of the shift-direction control circuits 214 is supplied as the set signal S, and the output signal Ob outputted from a corresponding one of the shift-direction control circuits 214 is supplied as the reset signal R. The initialization signal INIT is commonly supplied to all stages.

From the output terminal of each stage (each unit circuit SR) of the shift register circuit 210, the output signal OUT is outputted. The output signal OUT outputted from any stage (k-th stage, here) is supplied as a scanning signal GOUTk to a gate bus line GLk of a k-th line, as well as supplied as the previous stage signal INu to a (k+1)th-stage shift-direction control circuit 214(k+1), and as the next stage signal INd to a (k−1)th-stage shift-direction control circuit 214(k−1).

With the above described configuration, a pulse of the gate start pulse signal ST as the set signal S is supplied, in a state in which one of the forward signal UD and the reverse signal UDB is at the high-level, to the first-stage unit circuit SR1 and the n-th stage unit circuit SRn of the shift register circuit 210. At this time, if the forward signal UD is at the high-level, the output signal OUT outputted from each of the unit circuits SR is sequentially turned to the high-level in an order "from the first stage to the n-th stage". Further, if the reverse signal UDB is at the high-level, the output signal OUT outputted from each of the unit circuits SR is sequentially turned to the high-level in an order "from the n-th stage to the first stage". In this manner, the scanning signals GOUT that are sequentially turned to the high-level (active) for a predetermined period are supplied to the gate bus lines GL within the display unit 400.

It should be noted that, as for the configuration of the unit circuit SR according to this embodiment, the same configuration as that of the sixth embodiment is employed (see FIG. 21). Therefore, the configuration of the unit circuit SR shall not be described.

7.2 Configuration of Shift-Direction Control Circuit

Figure 26:
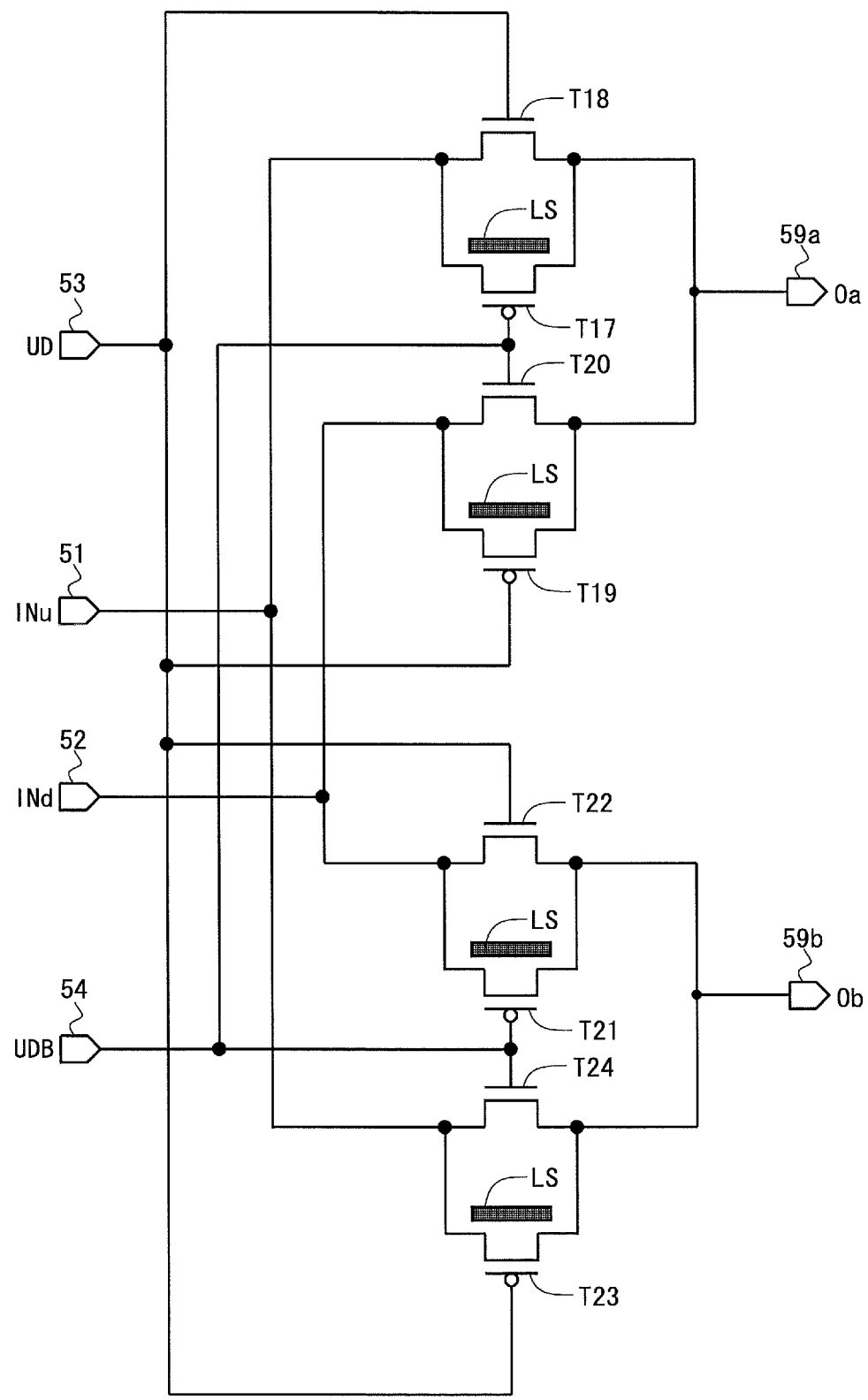
FIG. 26 is a circuit diagram showing a configuration of a shift-direction control circuit according to the seventh embodiment.
Figure 27:
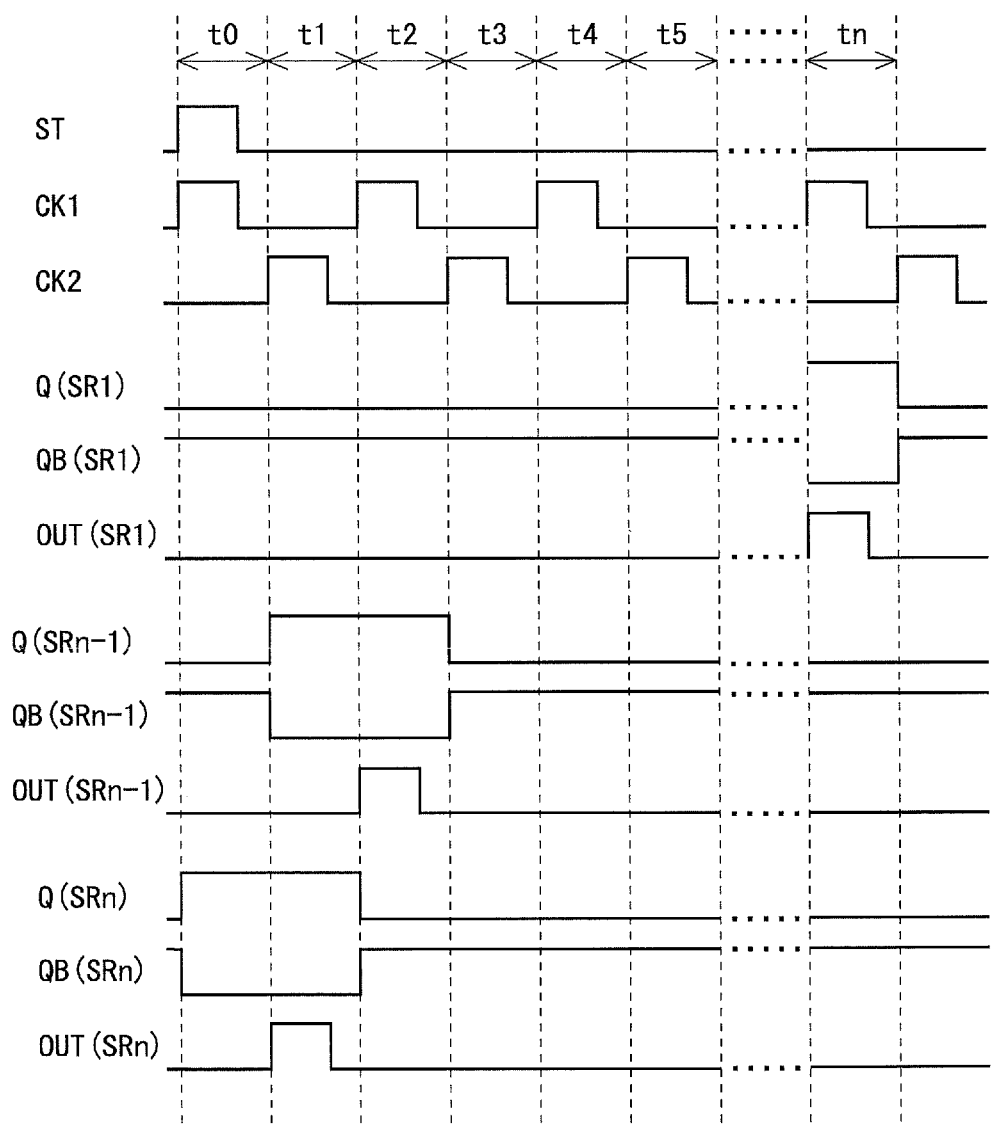
FIG. 27 is a signal waveform diagram for illustration of an operation of the shift register circuit according to the seventh embodiment.

FIG. 26 is a circuit diagram showing a configuration of a shift-direction control circuit 214 according to this embodiment. The shift-direction control circuit 214 includes eight thin-film transistors T17 to T24. Further, the shift-direction control circuit 214 includes four input terminals 51 to 54 and two output terminals 59a and 59b. Here, an output terminal for outputting the output signal Oa is indicated by a reference symbol 59a, and an output terminal for outputting the output signal Ob is indicated by a reference symbol 59b.

The thin-film transistors T18, T20, T22, and T24 are of an n-channel type, and the thin-film transistors T17, T19, T21, and T23 are of a p-channel type. The light shielding film LS is provided for the thin-film transistors T17, T19, T21, and T23.

Regarding the thin-film transistor T17, a gate terminal is connected to the input terminal 54, a drain terminal is connected to the input terminal 51, and a source terminal is connected to the output terminal 59a. Regarding the thin-film transistor T18, a gate terminal is connected to the input terminal 53, a drain terminal is connected to the input terminal 51, and a source terminal is connected to the output terminal 59a. Regarding the thin-film transistor T19, a gate terminal is connected to the input terminal 53, a drain terminal is connected to the input terminal 52, and a source terminal is connected to the output terminal 59a. Regarding the thin-film transistor T20, a gate terminal is connected to the input terminal 54, a drain terminal is connected to the input terminal 52, and a source terminal is connected to the output terminal 59a.

Regarding the thin-film transistor T21, agate terminal is connected to the input terminal 54, a drain terminal is connected to the input terminal 52, and a source terminal is connected to the output terminal 59b. Regarding the thin-film transistor T22, a gate terminal is connected to the input terminal 53, a drain terminal is connected to the input terminal 52, and a source terminal is connected to the output terminal 59b. Regarding the thin-film transistor T23, a gate terminal is connected to the input terminal 53, a drain terminal is connected to the input terminal 51, and a source terminal is connected to the output terminal 59b. Regarding the thin-film transistor T24, a gate terminal is connected to the input terminal 54, a drain terminal is connected to the input terminal 51, and a source terminal is connected to the output terminal 59b.

With the above described configuration, if the forward signal UD is at the high-level and the reverse signal UDB is at the low-level, the thin-film transistors T17, T18, T21, and T22 are in the on-state, and the thin-film transistors T19, T20, T23, and T24 are in the off-state. With this, the previous stage signal INu is outputted as the output signal Oa from the output terminal 59a, and the next stage signal INd is outputted as the output signal Ob from the output terminal 59b.

On the other hand, if the forward signal UD is at the low-level and the reverse signal UDB is at the high-level, the thin-film transistors T19, T20, T23, and T24 are in the on-state, and the thin-film transistors T17, T18, T21, and T22 are in the off-state. With this, the next stage signal INd is outputted as the output signal Oa from the output terminal 59a, and the previous stage signal INu is outputted as the output signal Ob from the output terminal 59b.

7.3 Operation of Shift Register Circuit

When the forward signal UD is set at the high-level and the reverse signal UDB is set at the low-level, as described above, the previous stage signal INu is outputted as the output signal Oa from the output terminal 59a of the shift-direction control circuit 214, and the next stage signal INd is outputted as the output signal Ob from the output terminal 59b of the shift-direction control circuit 214. Here, the output signal Oa outputted from the shift-direction control circuit 214 of each stage is supplied as the set signal S to the corresponding unit circuit SR, and the output signal Ob outputted from the shift-direction control circuit 214 of each stage is supplied as the reset signal R to the corresponding unit circuit SR. As can be seen from the above, to each of the unit circuits SR, the output signal OUT outputted from the previous-stage unit circuit SR is supplied as the set signal 5, and the output signal OUT outputted from the next-stage unit circuit SR is supplied as the reset signal R. Therefore, similarly to the sixth embodiment, in the shift register circuit 210, the output signal OUT outputted from each of the unit circuits SR is sequentially turned to the high-level in the order "from the first stage to the n-th stage" (see FIG. 23).

When the forward signal UD is set at the low-level and the reverse signal UDB is set at the high-level, as described above, the next stage signal INd is outputted as the output signal Oa from the output terminal 59a of the shift-direction control circuit 214, and the previous stage signal INu is outputted as the output signal Ob from the output terminal 59b of the shift-direction control circuit 214. Here, the output signal Oa outputted from the shift-direction control circuit 214 of each stage is supplied as the set signal S to the corresponding unit circuit SR, and the output signal Ob outputted from the shift-direction control circuit 214 of each stage is supplied as the reset signal R to the corresponding unit circuit SR. As can be seen from the above, to each of the unit circuits SR, the output signal OUT outputted from the next-stage unit circuit SR is supplied as the set signal S, and the output signal OUT outputted from the previous-stage unit circuit SR is supplied as the reset signal R. Therefore, in the shift register circuit 210, the output signal OUT outputted from each of the unit circuits SR is sequentially turned to the high-level in the order "from the n-th stage to the first stage" (see FIG. 27).

7.4 Operation that is Concerned when a Light Shielding Film is Not Provided for Thin-Film Transistors T17, T19, T21, and T23

Figure 28:
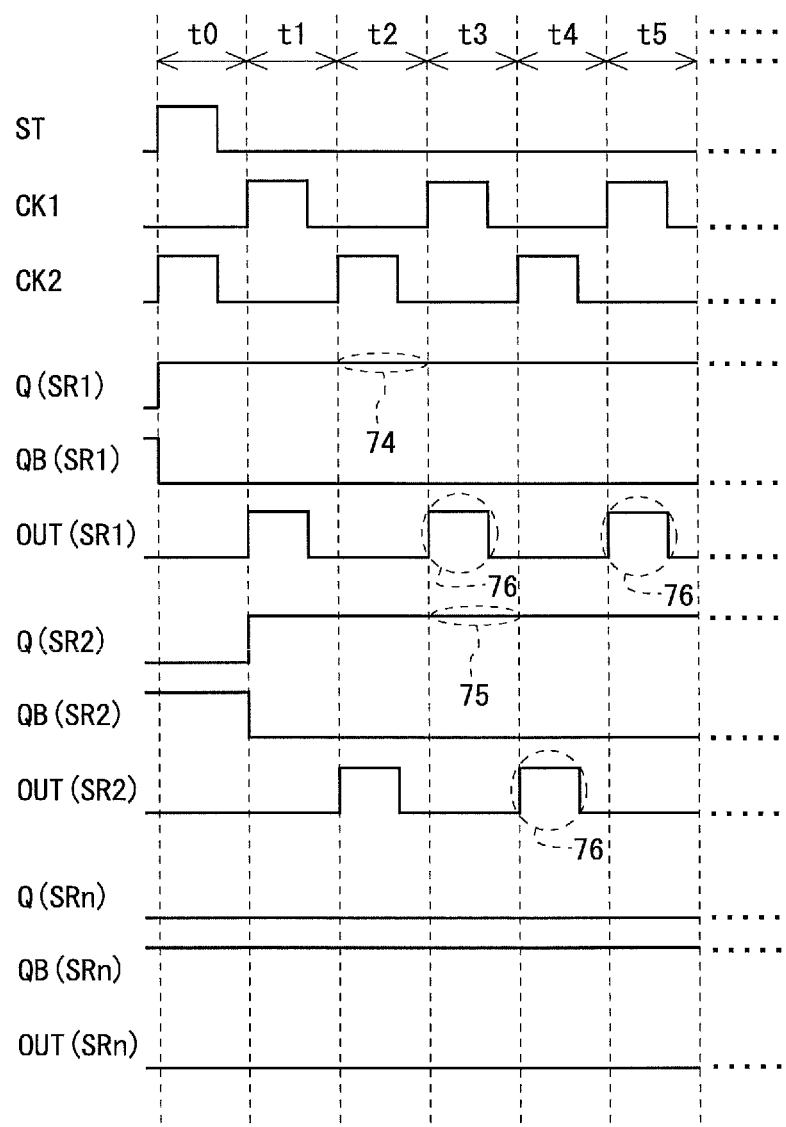
FIG. 28 is a signal waveform diagram for illustration of an operation that is concerned when a light shielding film is not provided for thin-film transistors T17, T19, T21, and T23 within the shift-direction control circuit illustrated in FIG. 26.

An operation that is concerned when the light shielding film LS is not provided for the thin-film transistors T17, T19, T21, and T23 will be described with reference to FIG. 26 and FIG. 28. As can be seen from FIG. 26, when the forward signal UD is set at the high-level, a high-level voltage is supplied to the gate terminal of the thin-film transistors T19 and T23. Specifically, a negative bias is supplied to the gate of the thin-film transistors T19 and T23 for an extended length of time. Accordingly, in the thin-film transistors T19 and T23, a threshold shift occurs due to an influence of external light. As a result, there is a case in which values of the threshold voltages for the thin-film transistors T19 and T23 become lower than an original value. When the values of the threshold voltages of the thin-film transistors T19 and T23 decrease, the thin-film transistors T19 and T23 can be easily turned to the on-state. In such a case, in each of the shift-direction control circuits 214, the thin-film transistors T19 and T23 become the on-state even though the forward signal UD is at the high-level. Accordingly, for example, in the first-stage shift-direction control circuit 214(1), when the gate start pulse signal ST (the previous stage signal INu) changes from the low-level to the high-level in the period t0 (see FIG. 23), a through current is produced between the input terminal 51 and the input terminal 52 (the output terminal 59 of the second-stage unit circuit SR2) via the thin-film transistors T17 and T18 and the thin-film transistor T19. Further, in the period t2, as the output signal OUT outputted from the second-stage unit circuit SR2 is turned to the high-level (see FIG. 23), the next stage signal INd supplied to the input terminal 52 of the first-stage shift-direction control circuit 214(1) is turned to the high-level. At this time, a through current is produced between the input terminal 52 (the output terminal 59 of the second-stage unit circuit SR2) and the input terminal 51 via the thin-film transistors T21 and T22 and the thin-film transistor T23. When such a through current is produced, depending on a capacity of a thin-film transistor that constitutes the shift-direction control circuit 214, potentials of the set signal S and the reset signal R supplied to the unit circuit SR become an intermediate potential (a potential intermediate between a potential associated with the logical value "1" and a potential associated with the logical value "0" in the RS flip-flop circuit 212). This makes the values of the output signal Q and the output signal QB outputted from the RS flip-flop circuit 212 within the unit circuit SR undetermined. With this, for example, in the first-stage unit circuit SR1, although the output signal Q should change from the high-level to the low-level in the period t2, the output signal Q is maintained at the high-level (see a portion indicated by a reference symbol 74 in FIG. 28). Similarly, for example, in the second-stage unit circuit SR2, although the output signal Q should change from the high-level to the low-level in the period t3, the output signal Q is maintained at the high-level (see a portion indicated by a reference symbol 75 in FIG. 28). Further, a pulse of the output signal OUT can be unnecessarily produced (see a portion indicated by a reference symbol 76 in FIG. 28). In this manner, malfunction is caused.

When the reverse signal UDB is set at the high-level, the values of the threshold voltages for the thin-film transistors T17 and T21 decrease, and the thin-film transistors T17 and T21 can be easily turned to the on-state. As a result, similarly to the case in which the forward signal UD is set at the high-level, malfunction is caused.

In view of this point, in this embodiment, the light shielding film LS is provided for the thin-film transistors T17, T19, T21, and T23 that are p-channel type transistors whose gate terminals can be applied with a negative bias for an extended length of time. Accordingly, a threshold shift due to an influence of external light does not occur regarding the thin-film transistors T17, T19, T21, and T23. Therefore, the malfunction described above does not occur, and the gate bus lines GL1 to GLn within the display unit 400 are driven normally.

7.5 Effect

According to this embodiment, in the liquid crystal display device provided with the shift register circuit 210 capable of switching the shift direction, the light shielding film LS is provided for the thin-film transistors T17, T19, T21, and T23 of the shift-direction control circuit 214. Accordingly, even if a bias is supplied to the gates of the thin-film transistors T17, T19, T21, and T23, a threshold shift due to an influence of external light does not occur regarding the thin-film transistors T17, T19, T21, and T23. Therefore, it is possible to prevent occurrence of malfunction caused by a threshold shift of the thin-film transistors T17, T19, T21, and T23, as well as occurrence of a through current. From the above, according to this embodiment, it is possible to achieve the shift register circuit 210 capable of preventing occurrence of malfunction caused by a threshold shift of a thin-film transistor due to an influence of external light, as well as occurrence of a through current, and capable of switching the shift direction.

8. Eighth Embodiment

8.1 Configuration and the Like

An eighth embodiment of the present invention will be described. An overall configuration and a schematic configuration of the shift register circuit 210 are the same as those in the sixth embodiment, and shall not be described (see FIG. 2, FIG. 3, and FIG. 20).

Figure 29:
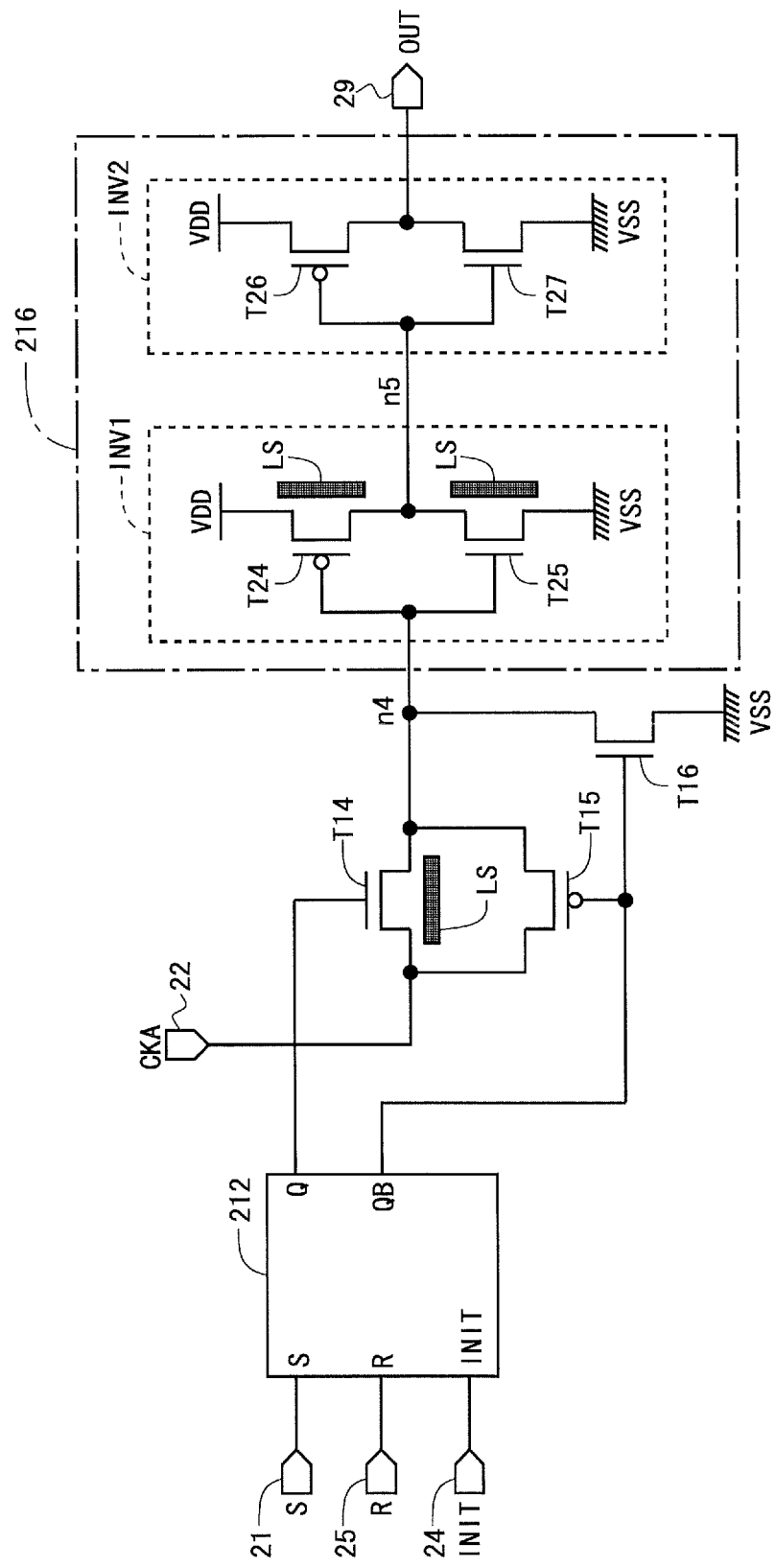
FIG. 29 is a circuit diagram showing a configuration of a unit circuit (configuration of a single stage of a shift register circuit) in an active matrix-type liquid crystal display device according to an eighth embodiment of the present invention.

FIG. 29 is a circuit diagram showing a configuration of the unit circuit SR (configuration of a single stage of the shift register circuit 210) according to this embodiment. The unit circuit SR of this embodiment includes an output buffer 216 including two inverters (a first inverter INV1 and a second inverter INV2), in addition to the components provided in the sixth embodiment (see FIG. 21). The first inverter INV1 is configured by the thin-film transistor T24 and the thin-film transistor T25. The second inverter INV2 is configured by the thin-film transistor T26 and the thin-film transistor T27. The thin-film transistors T25 and T27 are of an n-channel type, and the thin-film transistors T24 and T26 are of a p-channel type.

In this embodiment, the light shielding film LS is provided for the thin-film transistors T14, T24, and T25 out of the thin-film transistors T14 to T16 and T24 to T27 included in the unit circuit SR. The light shielding film LS is not provided for the thin-film transistors T15, T16, T26, and T27.

Next, a relationship of connection between components within the unit circuit SR will be described. A source terminal of the thin-film transistor T14, a source terminal of the thin-film transistor T15, a drain terminal of the thin-film transistor T16, a gate terminal of the thin-film transistor T24, and a gate terminal of the thin-film transistor T25 are connected to each other. It should be noted that a region (wiring) where these are connected to each other is referred to as a "fourth node", for convenience. The fourth node is indicated by a reference symbol n4. A source terminal of the thin-film transistor T24, a drain terminal of the thin-film transistor T25, a gate terminal of the thin-film transistor T26, and a gate terminal of the thin-film transistor T27 are connected to each other. It should be noted that a region (wiring) where these are connected to each other is referred to as a "fifth node", for convenience. The fifth node is indicated by a reference symbol n5.

Regarding the thin-film transistor T14, a gate terminal is connected to an output terminal for the output signal Q of the RS flip-flop circuit 212, a drain terminal is connected to the input terminal 22, and the source terminal is connected to the fourth node n4. Regarding the thin-film transistor T15, a gate terminal is connected to an output terminal for the output signal QB of the RS flip-flop circuit 212, a drain terminal is connected to the input terminal 22, and the source terminal is connected to the fourth node n4. Regarding the thin-film transistor T16, a gate terminal is connected to the output terminal for the output signal QB of the RS flip-flop circuit 212, the drain terminal is connected to the fourth node n4, and a source terminal is connected to the input terminal for the low-level supply voltage VSS.

Regarding the thin-film transistor T24, the gate terminal is connected to the fourth node n4, a drain terminal is connected to the input terminal for the high-level supply voltage VDD, and the source terminal is connected to the fifth node n5. Regarding the thin-film transistor T25, the gate terminal is connected to the fourth node n4, the drain terminal is connected to the fifth node n5, and a source terminal is connected to the input terminal for the low-level supply voltage VSS. Regarding the thin-film transistor T26, the gate terminal is connected to the fifth node n5, a drain terminal is connected to the input terminal for the high-level supply voltage VDD, and a source terminal is connected to the output terminal 29. Regarding the thin-film transistor T27, the gate terminal is connected to the fifth node n5, a drain terminal is connected to the output terminal 29, and a source terminal is connected to the input terminal for the low-level supply voltage VSS.

8.2 Operation of Shift Register Circuit

An operation of the output buffer 216 configured by the thin-film transistors T24-T27 will be described. When a potential at the fourth node n4 is the low-level, the thin-film transistor T24 is in the on-state, and the thin-film transistor T25 is in the off-state. With this, a potential at the fifth node n5 is at the high-level. At this time, the thin-film transistor T26 is in the off-state, and the thin-film transistor T27 is in the on-state. Therefore, the output signal OUT is at the low-level. When the potential at the fourth node n4 is the high-level, the thin-film transistor T24 is in the off-state, and the thin-film transistor T25 is in the on-state. With this, a potential at the fifth node n5 is at the low-level. At this time, the thin-film transistor T26 is in the on-state, and the thin-film transistor T27 is in the off-state. Therefore, the output signal OUT is at the high-level.

As described above, when the potential of the fourth node n4 is at the low-level, the output signal OUT outputted from the unit circuit SR is at the low-level, and when the potential of the fourth node n4 is at the high-level, the output signal OUT outputted from the unit circuit SR is at the high-level. Here, as can be seen from FIG. 21 and FIG. 29, a position of the fourth node n4 in this embodiment corresponds to a position of the output terminal 29 in the sixth embodiment. From the above, the shift register circuit 210 according to this embodiment operates in the same manner as the shift register circuit 210 according to the sixth embodiment (see FIG. 23).

8.3 Operation that is Concerned when a Light Shielding Film is Not Provided for Thin-Film Transistors T14, T24, and T25

Next, an operation that is concerned when the light shielding film LS is not provided for the thin-film transistors T14, T24, and T25 will be described with reference to FIG. 23 and FIG. 29. As can be seen from FIG. 23, in each of the unit circuits SR, the output signal Q is at the high-level only during a period in which a pulse of the set signal S is supplied and a period in which a high-level output signal OUT is outputted. For example, in the first-stage unit circuit SR1, the output signal Q is at the high-level only during the period t0 and the period t1, and the output signal Q is maintained at the low-level during other periods. Here, as shown in FIG. 29, the output signal Q is supplied to the gate terminal of the thin-film transistor T14. Therefore, a negative bias is supplied to the gate of the thin-film transistor T14 for an extended length of time. Accordingly, in the thin-film transistor T14, a threshold shift occurs due to an influence of external light. As a result, there is a case in which a value of the threshold voltage for the thin-film transistor T14 becomes lower than the original value. When the value of the threshold voltage of the thin-film transistor T14 decreases, the thin-film transistor T14 can be easily turned to the on-state. Further, the gate potentials of the thin-film transistors T24 and T25 are at the high-level only during a period in which the high-level output signal OUT is outputted, and maintained at the low-level during other periods. Accordingly, a positive bias is supplied to the gate of the thin-film transistor T24 for an extended length of time. A negative bias is supplied to the gate of the thin-film transistor T25 for an extended length of time. With this, in the thin-film transistors T24 and T25, a threshold shift occurs due to an influence of external light. As a result, there is a case in which a value of the threshold voltage for the thin-film transistor T24 becomes higher than the original value. Further, there is a case in which a value of the threshold voltage for the thin-film transistor T25 becomes lower than the original value. When the value of the threshold voltage of the thin-film transistor T24 increases, the thin-film transistor T24 cannot be easily turned to the on-state. When the value of the threshold voltage of the thin-film transistor T25 decreases, the thin-film transistor T25 can be easily turned to the on-state. When the thin-film transistor T24 cannot be easily turned to the on-state and the thin-film transistor T25 can be easily turned to the on-state in this manner, an inversion level of the first inverter INV1 configured by the thin-film transistor T24 and the thin-film transistor T25 (a reference potential level for inversion of the logical values between the input and the output) becomes low.

When a threshold shift is caused in the thin-film transistors T14, T24, and T25 as described above, for example, in the first-stage unit circuit SR1, in the period t2 and thereafter, although the output signal Q is at the low-level, the thin-film transistor T14 is maintained in the on-state. Further, in the period t2 and thereafter, as the output signal QB is at the high-level, the thin-film transistor T16 is also maintained in the on-state. From the above, when the first gate clock signal CK1 (the first clock CKA) changes from the low-level to the high-level in the period t3, a through current is produced between the input terminal 22 and the input terminal for the low-level supply voltage VSS via the thin-film transistor T14 and the thin-film transistor T16. Moreover, depending on a discharge capacity of the thin-film transistor T16 and the inversion level of the first inverter INV1, a pulse of the output signal OUT is produced. To be more detail, if a discharge capacity of the thin-film transistor T16 is not sufficient, and the inversion level of the first inverter INV1 is low, there is a high possibility that a pulse of the output signal OUT is unnecessarily produced after the period t3 (see the portion indicated by the reference symbol 71 in FIG. 24). In the unit circuit SR2 to SRn of the second stage and thereafter, similarly to the first-stage unit circuit SR, a through current may also be produced, and a pulse of the output signal OUT may be produced during a period in which the output signal OUT should be maintained at the low-level (see a portion indicated by a reference symbol 72 in FIG. 24). Further, to each of the unit circuits SR, the output signal OUT from a previous stage is supplied as the set signal S, and the output signal OUT from a next stage is supplied as the reset signal R (see FIG. 20). Accordingly, when an above-described abnormal pulse of the output signal OUT is outputted from the unit circuit SR of one stage, there is a case in which both of the value of the set signal S and the value of the reset signal R can become 1 depending on the unit circuit SR. In such a case, the values of the output signal Q and the output signal QB outputted from the RS flip-flop circuit 212 within the unit circuit SR are undetermined. With this, for example, in the second-stage unit circuit SR2, even though the output signal Q should change from the high-level to the low-level in the period t3, the output signal Q is maintained at the high-level (see a portion indicated by a reference symbol 73 in FIG. 24). In this manner, malfunction is caused.

In view of this point, in this embodiment, the light shielding film LS is provided for the thin-film transistor T24 that is a p-channel type (second conductivity type) transistor whose gate terminal is applied with a positive bias for an extended length of time, and the thin-film transistors T14 and T25 that are n-channel type (first conductivity type) transistors whose gate terminals are applied with a negative bias for an extended length of time. Accordingly, a threshold shift due to an influence of external light does not occur regarding the thin-film transistors T14, T24, and T25. Therefore, the malfunction described above does not occur, and the gate bus lines GL1 to GLn within the display unit 400 are driven normally. Further, a through current is not produced between the input terminal 22 and the input terminal for the low-level supply voltage VSS.

8.4 Effect

According to this embodiment, in the liquid crystal display device in which each stage (each unit circuit SR) of the shift register circuit 210 within the gate driver 200 is configured as shown in FIG. 29, the light shielding film LS is provided for the thin-film transistors T14, T24, and T25 in each of the unit circuits SR. Accordingly, even though a bias is supplied to the gates of the thin-film transistors T14, T24, and T25 for an extended length of time, a threshold shift due to an influence of external light does not occur regarding the thin-film transistors T14, T24, and T25. Therefore, it is possible to prevent occurrence of malfunction caused by a threshold shift of the thin-film transistors T14, T24, and T25 and occurrence of a through current. From the above, according to this embodiment, it is possible to achieve the shift register circuit 210 capable of preventing occurrence of malfunction caused by a threshold shift of a thin-film transistor due to an influence of external light as well as occurrence of a through current.

9. Ninth Embodiment

In the first embodiment to the eighth embodiment, the case in which applying a positive bias to the gate of the thin-film transistor for an extended length of time shifts a voltage-current characteristic of the thin-film transistor to the positive direction and applying a negative bias to the gate of the thin-film transistor for an extended length of time shifts the voltage-current characteristic of the thin-film transistor to the negative direction is described as an example. However, the present invention is not limited to such an example. Thus, in a ninth embodiment and a tenth embodiment, a case in which applying a positive bias to the gate of the thin-film transistor for an extended length of time shifts a voltage-current characteristic of the thin-film transistor to the negative direction and applying a negative bias to the gate of the thin-film transistor for an extended length of time shifts the voltage-current characteristic of the thin-film transistor to the positive direction is described as an example.

9.1 Configuration and the Like

A ninth embodiment of the present invention will be described. An overall configuration and a schematic configuration of the shift register circuit 210 are the same as those in the first embodiment, and shall not be described (see FIG. 2 to FIG. 4).

Figure 30:
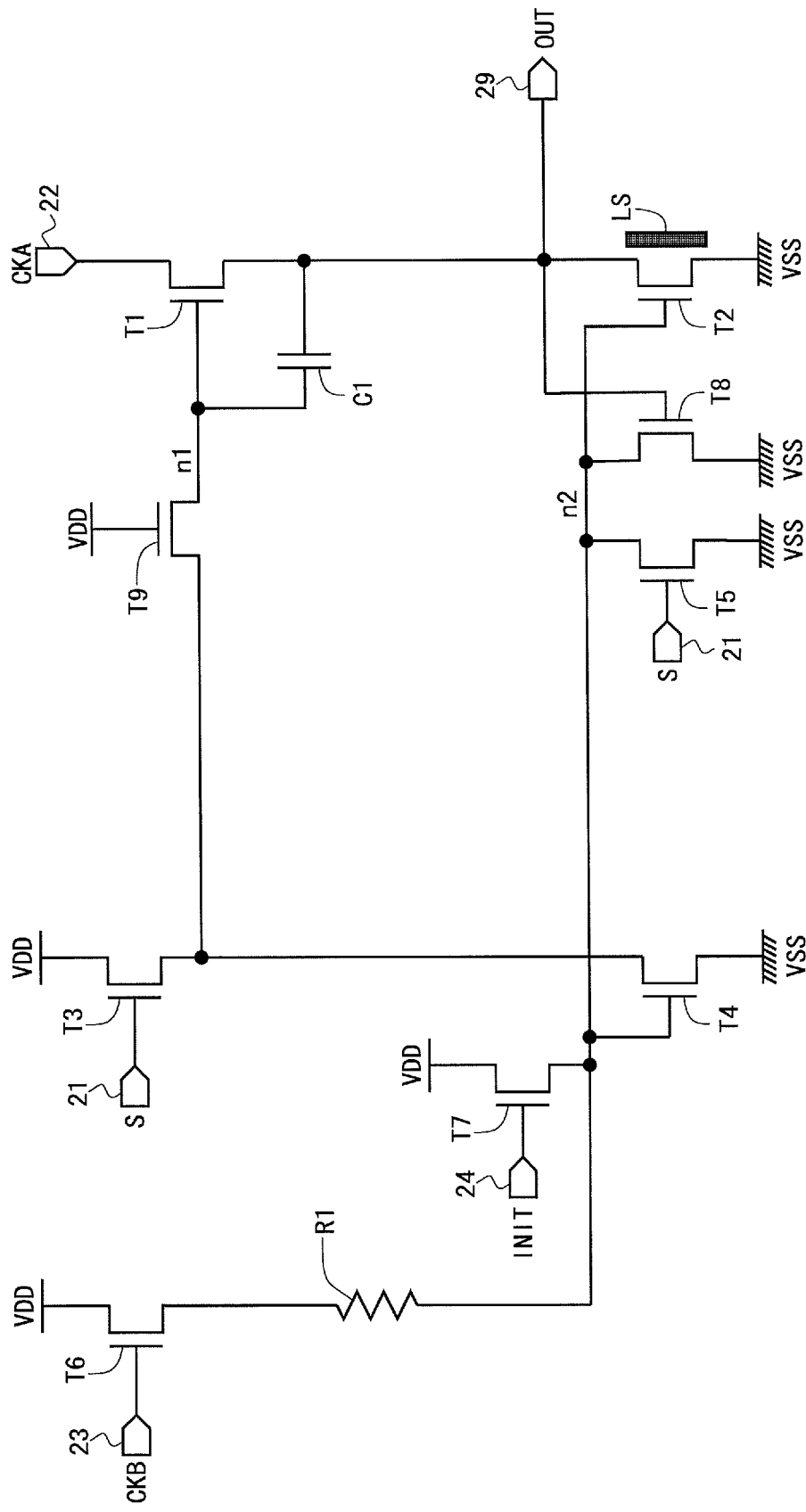
FIG. 30 is a circuit diagram showing a configuration of a unit circuit (configuration of a single stage of a shift register circuit) in an active matrix-type liquid crystal display device according to a ninth embodiment of the present invention.

FIG. 30 is a circuit diagram showing a configuration of the unit circuit SR (configuration of a single stage of the shift register circuit 210) according to this embodiment. A circuit configuration of the unit circuit SR according to this embodiment is the same as the circuit configuration of the unit circuit SR according to the first embodiment. However, as can be seen from FIG. 1 and FIG. 30, while the light shielding film LS is provided only for the thin-film transistor T9 in the first embodiment, the light shielding film LS is provided only for the thin-film transistor T2 in this embodiment. It should be noted that an operation of the shift register circuit 210 is also the same as in the first embodiment (see FIG. 5).

9.2 Operation that is Concerned when a Light Shielding Film is Not Provided for Thin-Film Transistor T2

Next, an operation that is concerned when the light shielding film LS is not provided for the thin-film transistor T2 will be described with reference to FIG. 5 and FIG. 30. As can be seen from FIG. 5 and FIG. 30, a positive bias is supplied to the gate terminal of the thin-film transistor T2 for an extended length of time. Accordingly, in the thin-film transistor T2, a threshold shift occurs due to an influence of external light. As a result, there is a case in which a value of the threshold voltage for the thin-film transistor T2 becomes lower than the original value. When the value of the threshold voltage of the thin-film transistor T2 decreases, the thin-film transistor T2 can be easily turned to the on-state. In such a case, for example, in the first-stage unit circuit SR1, the thin-film transistor T2 is maintained also in the on-state in the period t1, and a through current is produced between the input terminal 22 and the input terminal for the low-level supply voltage VSS via the thin-film transistor T2 when the high-level output signal OUT is outputted. Further, depending on a capacity of the thin-film transistor T1, a pulse of the output signal OUT is not normally outputted. In this manner, malfunction is caused.

In view of this point, in this embodiment, the light shielding film LS is provided for the thin-film transistor T2 that is an n-channel type transistor whose gate terminal is applied with a positive bias for an extended length of time. Accordingly, a threshold shift due to an influence of external light does not occur regarding the thin-film transistor T2. Therefore, the malfunction described above does not occur, and the gate bus lines GL1 to GLn within the display unit 400 are driven normally. Further, a through current is not produced between the input terminal 22 and the input terminal for the low-level supply voltage VSS.

9.3 Effect

According to this embodiment, in the liquid crystal display device in which each stage (each unit circuit SR) of the shift register circuit 210 within the gate driver 200 is configured as shown in FIG. 30, the light shielding film LS is provided for the thin-film transistor T2 in each of the unit circuits SR. Accordingly, even though a bias is supplied to the gate of the thin-film transistor T2 for an extended length of time, a threshold shift due to an influence of external light does not occur regarding the thin-film transistor T2. Therefore, it is possible to prevent occurrence of malfunction caused by a threshold shift of the thin-film transistor T2 and occurrence of a through current. From the above, according to this embodiment, it is possible to achieve the shift register circuit 210 capable of preventing occurrence of malfunction caused by a threshold shift of a thin-film transistor due to an influence of external light as well as occurrence of a through current.

10. Tenth Embodiment

10.1 Configuration and the Like

A tenth embodiment of the present invention will be described. An overall configuration and a schematic configuration of the shift register circuit 210 are the same as those in the first embodiment, and shall not be described (see FIG. 2 to FIG. 4).

Figure 31:
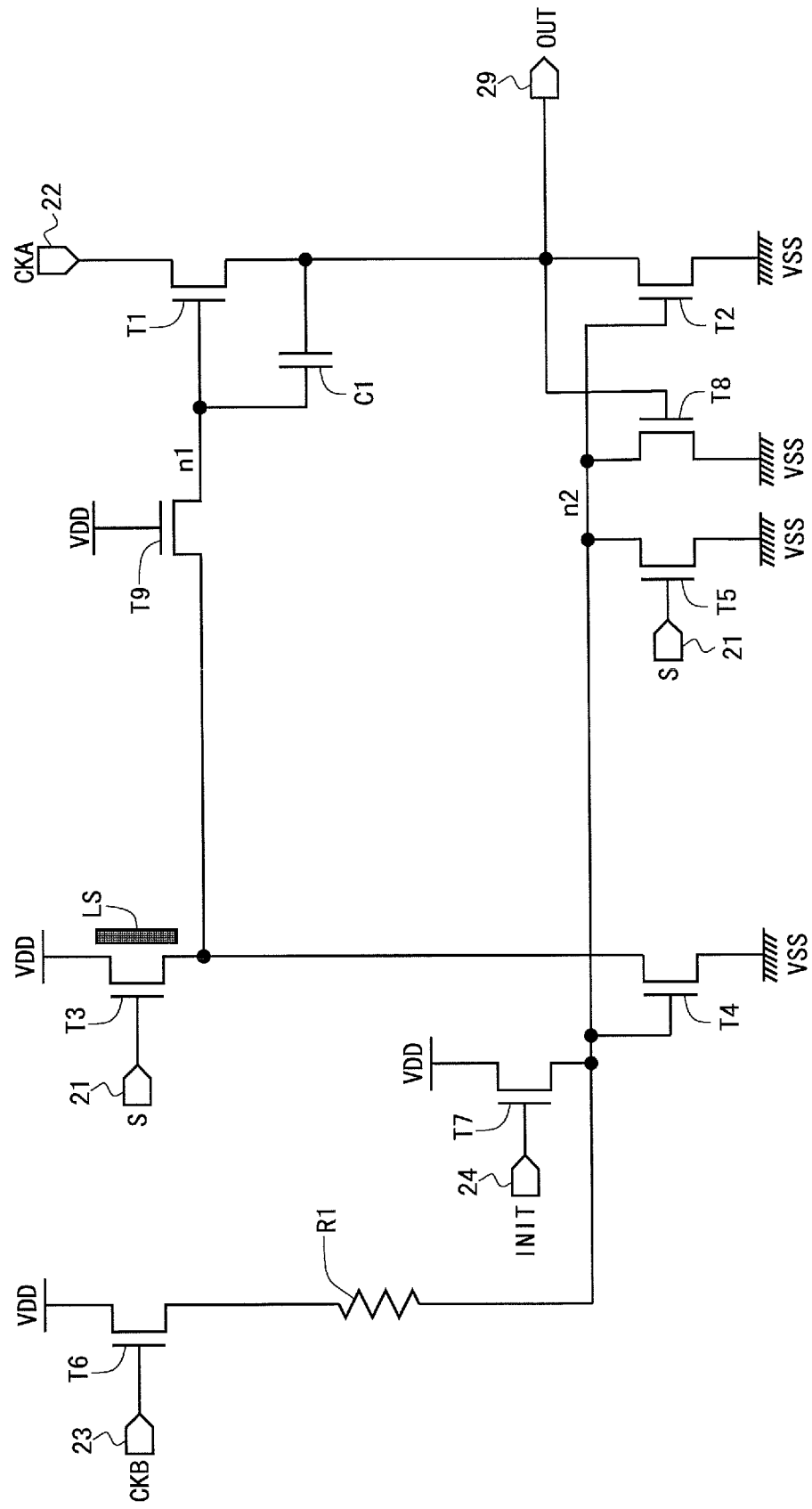
FIG. 31 is a circuit diagram showing a configuration of a unit circuit (configuration of a single stage of a shift register circuit) in an active matrix-type liquid crystal display device according to a tenth embodiment of the present invention.

FIG. 31 is a circuit diagram showing a configuration of the unit circuit SR (configuration of a single stage of the shift register circuit 210) according to this embodiment. A circuit configuration of the unit circuit SR according to this embodiment is the same as the circuit configuration of the unit circuit SR according to the first embodiment. However, as can be seen from FIG. 1 and FIG. 31, while the light shielding film LS is provided only for the thin-film transistor T9 in the first embodiment, the light shielding film LS is provided only for the thin-film transistor T3 in this embodiment. It should be noted that an operation of the shift register circuit 210 is also the same as in the first embodiment (see FIG. 5).

10.2 Operation that is Concerned when a Light Shielding Film is Not Provided for Thin-Film Transistor T3

Next, an operation that is concerned when the light shielding film LS is not provided for the thin-film transistor T3 will be described with reference to FIG. 6 and FIG. 31. As shown in FIG. 31, the gate terminal of the thin-film transistor T3 is connected to the input terminal 21 for receiving the set signal S. Therefore, a negative bias is supplied to the gate terminal of the thin-film transistor T3 for an extended length of time. Accordingly, in the thin-film transistor T3, a threshold shift occurs due to an influence of external light. As a result, there is a case in which a value of the threshold voltage for the thin-film transistor T3 becomes higher than the original value. When the value of the threshold voltage of the thin-film transistor T3 increases, the thin-film transistor T3 cannot be easily turned to the on-state. In such a case, in the period t0, in the first-stage unit circuit SR1, although the first node n1 should be pre-charged, the potential at the first node n1 is maintained at the low-level (see a portion indicated by a reference symbol 60 in FIG. 6). Then, an increase of the potential at the first node n1 by bootstrap does not occur normally in the period t1 (see a portion indicated by a reference symbol 61 in FIG. 6), and a pulse of the output signal OUT is not normally outputted from the first-stage unit circuit SR (see a portion indicated by a reference symbol 62 in FIG. 6). Further, as the second-stage unit circuit SR2 is operated based on the output signal OUT outputted from the first-stage unit circuit SR1, a level of the pulse of the output signal OUT outputted from the second-stage unit circuit SR2 further decreases (see a portion indicated by a reference symbol 63 in FIG. 6). A waveform of the output signal OUT outputted from each of the unit circuits SR becomes abnormal in this manner, and thus malfunction is caused.

In view of this point, in this embodiment, the light shielding film LS is provided for the thin-film transistor T3 that is an n-channel type transistor whose gate terminal is applied with negative bias for an extended length of time. Accordingly, a threshold shift due to an influence of external light does not occur regarding the thin-film transistor T3. Therefore, the malfunction described above does not occur, and the gate bus lines GL1 to GLn within the display unit 400 are driven normally.

10.3 Effect

According to this embodiment, in the liquid crystal display device in which each stage (each unit circuit SR) of the shift register circuit 210 within the gate driver 200 is configured as shown in FIG. 31, the light shielding film LS is provided for the thin-film transistor T3 in each of the unit circuits SR. Accordingly, even though a bias is supplied to the gate of the thin-film transistor T3 for an extended length of time, a threshold shift due to an influence of external light does not occur regarding the thin-film transistor T3. Accordingly, it is possible to prevent occurrence of malfunction caused by a threshold shift of the thin-film transistor T3. From the above, according to this embodiment, it is possible to achieve the shift register circuit 210 capable of preventing occurrence of malfunction caused by a threshold shift of a thin-film transistor due to an influence of external light.

11. Regarding Potential Supplied to Light Shielding Film

Figure 32:
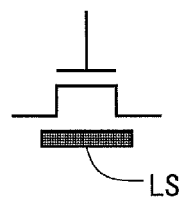
FIG. 32 is a schematic diagram showing an n-channel type thin-film transistor provided with a light shielding film in a floating state.
Figure 33:
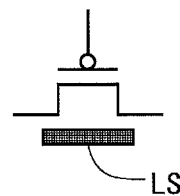
FIG. 33 is a schematic diagram showing a p-channel type thin-film transistor provided with a light shielding film in a floating state.
Figure 34:
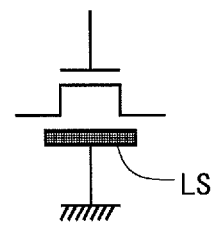
FIG. 34 is a schematic diagram showing an n-channel type thin-film transistor provided with a light shielding film to which a non-active potential is supplied.
Figure 35:
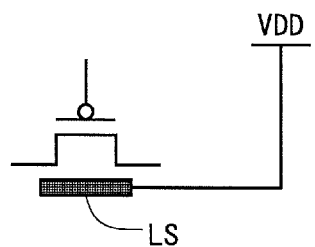
FIG. 35 is a schematic diagram showing a p-channel type thin-film transistor provided with a light shielding film to which a non-active potential is supplied.
Figure 36:
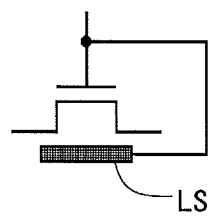
FIG. 36 is a schematic diagram showing an n-channel type thin-film transistor provided with a light shielding film to which a gate potential is supplied.
Figure 37:
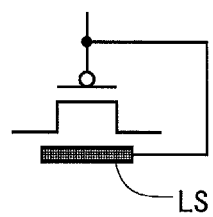
FIG. 37 is a schematic diagram showing a p-channel type thin-film transistor provided with a light shielding film to which a gate potential is supplied.
Figure 38:
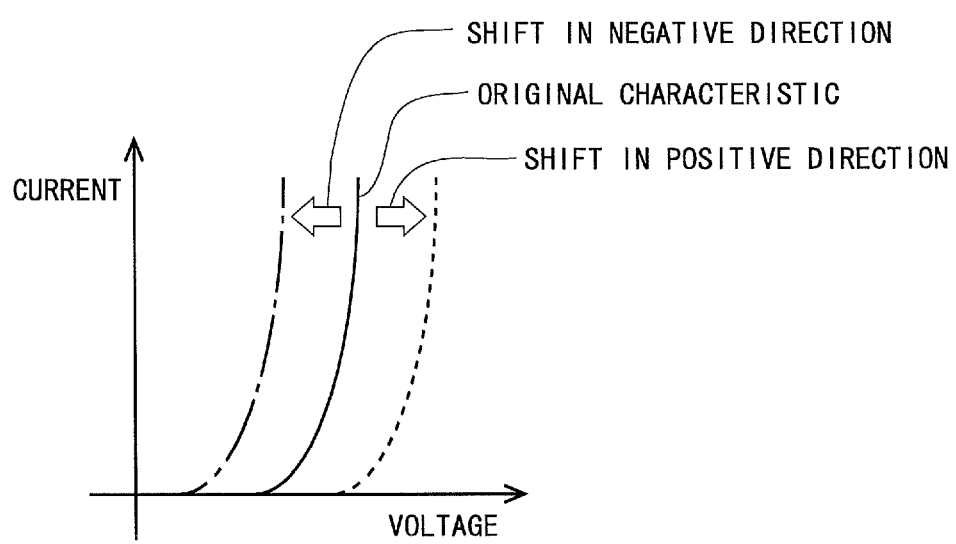
FIG. 38 is a diagram for illustration of a threshold shift of a thin-film transistor.

As described above, in the embodiments other than the eighth embodiment, the plurality of thin-film transistors within the unit circuit SR are categorized into a first group whose on-off state is controlled at relatively high on-duty and a second group whose on-off state is controlled at relatively low on-duty, and the light shielding film LS is provided only for the thin-film transistors included in one of the first group and the second group. Further, according to the eighth embodiment, the plurality of thin-film transistors within the unit circuit SR include a plurality of transistors including a n-channel type (first conductivity type) thin-film transistor and a p-channel type (second conductivity type) thin-film transistor, and the light shielding film is provided only for apart of the plurality of thin-film transistors (the n-channel type thin-film transistor whose on-off state is controlled at relatively low on-duty and the p-channel type thin-film transistor whose on-off state is controlled at relatively high on-duty). Regarding these embodiments, the light shielding film LS provided for the thin-film transistor may be in the floating state as shown in FIG. 32 or FIG. 33, may be configured such that a non-active potential (potential such that the thin-film transistor is in the off-state) is supplied as shown in FIG. 34 or FIG. 35, or may be configured such that a gate potential is supplied as shown in FIG. 36 or FIG. 37. It should be noted that the thin-film transistors shown in FIG. 32, FIG. 34, and FIG. 36 are of an n-channel type, and the thin-film transistors shown in FIG. 33, FIG. 35, and FIG. 37 are of a p-channel type.

In this regard, in a case in which the light shielding film LS is in the floating state, there is a concern that off-leak increases in the thin-film transistor provided with the light shielding film LS, as described in Japanese Laid-Open Patent Publication No. 2004-4553. However, by providing the light shielding film LS only for the thin-film transistor in which an increase of off-leak is tolerated, it is possible to prevent occurrence of malfunction caused by providing the light shielding film LS. Further, unlike a case in which a non-active potential or a gate potential is supplied to the light shielding film LS, it is not necessary to provide lines and VIA holes for fixing a potential of the light shielding film LS. Therefore, an increase in an area for circuits may be suppressed.

Further, in a case where a configuration in which a non-active potential or a gate potential is supplied to the light shielding film LS is employed, it is possible to prevent an increase of off-leak in the thin-film transistor provided with the light shielding film LS. Therefore, occurrence of malfunction caused by providing the light shielding film LS can be prevented.

Furthermore, the thin-film transistor provided with the light shielding film LS in the floating state and the thin-film transistor provided with the light shielding film LS to which a non-active potential or a gate potential is supplied may be combined as appropriate. With this, it is possible to prevent an increase of off-leak in the thin-film transistor, while suppressing an increase in an area for circuits.

12. Others

While the description in the above embodiments is given taking the shift register circuit provided for the liquid crystal display device as an example, the present invention is not limited to such an example. The present invention may be applied to a shift register circuit provided for a display device of a different type, such as an organic EL (Electro Luminescence) display device.

Further, the specific configuration of the unit circuit SR that constitutes the shift register circuit 210 is not limited to the configurations described in the embodiments. Moreover, while the two-phase clock signal is used as the gate clock signal in the above embodiments, the present invention is not limited to such an example. The present invention may be applied to a case in which a clock signal having the number of phases other than two phases is used as the gate clock signal.

DESCRIPTION OF REFERENCE CHARACTERS

100: DISPLAY CONTROL CIRCUIT
200: GATE DRIVER
210: SHIFT REGISTER CIRCUIT
212: RS FLIP-FLOP CIRCUIT
214, 214(1)-214(n): SHIFT-DIRECTION CONTROL CIRCUIT
216: OUTPUT BUFFER
300: SOURCE DRIVER
400: DISPLAY UNIT
SR, SR1 to SRn: UNIT CIRCUIT
GL, GL1 to GLn, . . . : GATE BUS LINE
T1 to T24, T34 to T36, . . . : THIN-FILM TRANSISTOR
LS: LIGHT SHIELDING FILM
AON, AONB: FIRST ALL-ON CONTROL SIGNAL, SECOND ALL-ON CONTROL SIGNAL
CK1, CK2: FIRST GATE CLOCK SIGNAL, SECOND GATE CLOCK SIGNAL
OUT: OUTPUT SIGNAL (FROM UNIT CIRCUIT)
ST: GATE START PULSE SIGNAL
S: SET SIGNAL
R: RESET SIGNAL

The invention claimed is:

1. A shift register circuit comprising a plurality of stages for driving a plurality of scanning signal lines arranged on a display unit of a display device, wherein a unit circuit constituting each stage of the plurality of stages includes a plurality of transistors categorized into a first group or a second group, an on-off state of a transistor included in the first group is controlled at relatively high on-duty, and an on-off state of a transistor included in the second group is controlled at relatively low on-duty, a light shielding film is provided only for the transistor included in one of the first group and the second group, the transistor provided with the light shielding film is included in the first group and is an n-channel type transistor having a control terminal to which a positive bias is always applied, the unit circuit includes:

an output node connected to one of the plurality of scanning signal lines;

an output control transistor having a control terminal, a first conduction terminal, and a second conduction terminal, and included in the second group, a clock signal being supplied to the first conduction terminal, and the second conduction terminal being connected to the output node;

a first node connected to the control terminal of the output control transistor;

a first node turn-on portion having the transistor included in the second group and being configured to change a level of the first node to an on-level based on an output signal outputted from an output node of a different stage;

a voltage dividing transistor having a control terminal, a first conduction terminal, and a second conduction terminal, and included in the first group, an on-level supply voltage being supplied to the control terminal, the first conduction terminal being connected to the first node turn-on portion, and the second conduction terminal being connected to the first node;

an output node turn-off transistor having a control terminal, a first conduction terminal, and a second conduction terminal, and included in the first group, the first conduction terminal being connected to the output node, and an off-level supply voltage being supplied to the second conduction terminal;

a second node connected to the control terminal of the output node turn-off transistor; and a first node turn-off transistor having a control terminal, a first conduction terminal, and a second conduction terminal, and included in the first group, the control terminal being connected to the second node, the first conduction terminal being connected to the first node via the voltage dividing transistor, and an off-level supply voltage being supplied to the second conduction terminal, and the light shielding film is provided only for the voltage dividing transistor.

2. A shift register circuit comprising a plurality of stages for driving a plurality of scanning signal lines arranged on a display unit of a display device, wherein a unit circuit constituting each stage of the plurality of stages includes a plurality of transistors categorized into a first group or a second group, an on-off state of a transistor included in the first group is controlled at relatively high on-duty, and an on-off state of a transistor included in the second group is controlled at relatively low on-duty, a light shielding film is provided only for the transistor included in one of the first group and the second group, the transistor provided with the light shielding film is included in the first group and is an n-channel type transistor having a control terminal to which a positive bias is applied for an extended length of time, the unit circuit includes:

an output node connected to one of the plurality of scanning signal lines;

an output control transistor having a control terminal, a first conduction terminal, and a second conduction terminal, and included in the second group, a clock signal being supplied to the first conduction terminal, the second conduction terminal being connected to the output node;

a first node connected to the control terminal of the output control transistor;

a first node turn-on portion having the transistor included in the second group and being configured to change a level of the first node to an on-level based on an output signal outputted from an output node of a different stage;

an output node turn-off transistor having a control terminal, a first conduction terminal, and a second conduction terminal, and included in the first group, the first conduction terminal being connected to the output node, and an off-level supply voltage being supplied to the second conduction terminal;

a second node connected to the control terminal of the output node turn-off transistor; and a first node turn-off transistor having a control terminal, a first conduction terminal, and a second conduction terminal, and included in the first group, the control terminal being connected to the second node, the first conduction terminal being connected to the first node, and an off-level supply voltage being supplied to the second conduction terminal, and the light shielding film is provided only for the output node turn-off transistor and the first node turn-off transistor.

3. A shift register circuit comprising a plurality of stages for driving a plurality of scanning signal lines arranged on a display unit of a display device, wherein a unit circuit constituting each stage of the plurality of stages includes a plurality of transistors categorized into a first group or a second group, an on-off state of a transistor included in the first group is controlled at relatively high on-duty, and an on-off state of a transistor included in the second group is controlled at relatively low on-duty, a light shielding film is provided only for the transistor included in one of the first group and the second group, the transistor provided with the light shielding film is included in the second group and is a p-channel type transistor having a control terminal to which a negative bias is applied for an extended length of time, the unit circuit includes:

an output node connected to one of the plurality of scanning signal lines;

an RS flip-flop circuit configured to output a first output signal and a second output signal based on an output signal outputted from an output node of a preceding stage and an output signal outputted from an output node of a subsequent stage;

a first output control transistor having a control terminal, a first conduction terminal, and a second conduction terminal, and included in the second group, the first output signal being supplied to the control terminal, a clock signal being supplied to the first conduction terminal, and the second conduction terminal being connected to the output node;

a second output control transistor having a control terminal, a first conduction terminal, and a second conduction terminal, and included in the second group, the second output signal being supplied to the control terminal, the clock signal being supplied to the first conduction terminal, and the second conduction terminal being connected to the output node; and an output node turn-off transistor having a control terminal, a first conduction terminal, and a second conduction terminal, and included in the first group, the second output signal being supplied to the control terminal, the first conduction terminal being connected to the output node, and an off-level supply voltage being supplied to the second conduction terminal, and the light shielding film is provided only for the second output control transistor.

4. A shift register circuit comprising a plurality of stages for driving a plurality of scanning signal lines arranged on a display unit of a display device, wherein a unit circuit constituting each stage of the plurality of stages includes a plurality of transistors categorized into a first group or a second group, an on-off state of a transistor included in the first group is controlled at relatively high on-duty, and an on-off state of a transistor included in the second group is controlled at relatively low on-duty, a light shielding film is provided only for the transistor included in one of the first group and the second group, the unit circuit includes:

an output node connected to one of the plurality of scanning signal lines;

an output control transistor having a control terminal, a first conduction terminal, and a second conduction terminal, and included in the second group, a clock signal being supplied to the first conduction terminal, and the second conduction terminal being connected to the output node;

a first node connected to the control terminal of the output control transistor;

a first node turn-on portion having the transistor included in the second group and being configured to change a level of the first node to an on-level based on an output signal outputted from an output node of a different stage;

a voltage dividing transistor having a control terminal, a first conduction terminal, and a second conduction terminal, and included in the first group, an on-level supply voltage being supplied to the control terminal, the first conduction terminal being connected to the first node turn-on portion, and the second conduction terminal being connected to the first node;

an output node turn-off transistor having a control terminal, a first conduction terminal, and a second conduction terminal, and included in the first group, the first conduction terminal being connected to the output node, and an off-level supply voltage being supplied to the second conduction terminal;

a second node connected to the control terminal of the output node turn-off transistor;

a first node turn-off transistor having a control terminal, a first conduction terminal, and a second conduction terminal, and included in the first group, the control terminal being connected to the second node, the first conduction terminal being connected to the first node via the voltage dividing transistor, and an off-level supply voltage being supplied to the second conduction terminal; and an all-on control portion configured to change a level of the output node to an on-level based on a control signal supplied commonly to the unit circuits of all stages, and the light shielding film is provided only for the first node turn-off transistor and the voltage dividing transistor.

* * * * *